United States Patent [19]
Tanaka et al.

[11] Patent Number: 5,859,602
[45] Date of Patent: Jan. 12, 1999

[54] STRUCTURES OF DATA COMPRESSION ENCODER, DECODER, AND RECORD CARRIER

[75] Inventors: Yoshiaki Tanaka, Fujisawa; Norihiko Fuchigami, Yamato; Shoji Ueno, Fujisawa, all of Japan

[73] Assignee: Victor Company of Japan, Ltd., Tokyo, Japan

[21] Appl. No.: 902,928

[22] Filed: Jul. 30, 1997

[51] Int. Cl.$^6$ .............................. H03M 7/00; H03M 7/36
[52] U.S. Cl. ............................ 341/60; 341/76; 364/724.1
[58] Field of Search .................................... 341/155, 110, 341/143, 76, 60, 63, 52, 53; 364/724.1, 724.01, 724.04

[56] References Cited

U.S. PATENT DOCUMENTS

| | | | |
|---|---|---|---|
| 3,707,680 | 12/1972 | Gabbard et al. | 325/38 B |
| 4,039,948 | 8/1977 | Boxall | 341/76 |
| 4,281,318 | 7/1981 | Candy et al. | 341/61 |
| 4,549,305 | 10/1985 | Fushikida | 375/27 |
| 4,839,652 | 6/1989 | O'Donnel et al. | 341/122 |
| 4,937,579 | 6/1990 | Maio et al. | 341/165 |
| 5,030,954 | 7/1991 | Ribner | 341/172 |
| 5,596,609 | 1/1997 | Genrich et al. | 375/350 |
| 5,757,440 | 5/1998 | Mangelsdorf | 348/697 |

OTHER PUBLICATIONS

"Trial for Wide–Band CD with Compatibility" by M. Komamura: AES 7th Regional Convention, Tokyo; Jun. 1995; (w/Whole English Translation).

*Primary Examiner*—Brian K. Young
*Assistant Examiner*—Peguy JeanPierre
*Attorney, Agent, or Firm*—Michael N. Meller

[57] ABSTRACT

An audio signal encoder is provided which is designed to A/D-convert an analog input signal at a first sampling frequency without being compressed and at a second sampling frequency that is two or four times higher than the first sampling frequency in data compression for minimizing data compression-caused errors in high-frequency components encoded. A decoder decoding digital signals produced by the encoder and a record carrier storing therein the digital signals are also provided.

45 Claims, 30 Drawing Sheets

1

STRUCTURES OF DATA COMPRESSION ENCODER, DECODER, AND RECORD CARRIER

BACKGROUND OF THE INVENTION

1. Technical Field of the Invention

The present invention relates generally to an encoder, a decoder, and a record carrier, and more particularly to an encoder compressing data to store it on a record carrier, a decoder expanding data that has undergone data compression and been recorded on a record carrier to reproduce it, and a record carrier storing therein data in data compression.

2. Background of Related Art

Optically readable discs such as "Compact Discs" have come into wider use as audio record carriers than conventional magnetic tapes. An EFM recording format using 8-bit fixed length data symbols and a data format including a subcode, audio data, and a CRC are established as logical formats for CDs. CD players having a variety of application functions are now being developed.

CDs are also used as CD-ROMs by discriminating control bits (four bits) in a subcode of a Q channel or detecting the absence of a TOC (Table of Contents) and have wide applicability to the field of electronic publication for mass storage and high-speed access. The CD-ROMs, however, have the drawback in that audio signals are compressed by ADPCM, which makes it impossible to reproduce the audio signals at original quality levels. A recording system designed to achieve the high fidelity is, thus, sought. In other words, development of optical discs capable of recording audio signals within a band of twice that of a conventional CD is expected.

SUMMARY OF THE INVENTION

It is therefore a principal object of the present invention to avoid the disadvantages of the prior art.

It is another object of the present invention to provide an encoding system designed to encoding a signal at a given sampling frequency and a sampling frequency that is twice higher than the given sampling frequency and compressing only high-frequency components of the signal encoded at the double sampling frequency so that compression-caused errors of the high-frequency components may be minimized.

It is a further object of the invention to provide a decoding system and a record carrier which decodes and stores the signal encoded by the above encoding system.

According to a first aspect of the present invention, there is provided an encoding apparatus comprising: (a) a first A/D converting circuit converting an analog input signal at a first sampling frequency into a first data stream of digital codes; (b) a second A/D converting circuit converting the analog input signal at a second sampling frequency that is twice the first sampling frequency into a second data stream of digital codes; (c) a decimating means for decimating the digital codes of the second data stream alternately to produce a third data stream of digital codes which are coincident in time sequence with the digital codes of the first data stream; (d) a difference code producing circuit determining a difference between each of the digital codes of the first data stream and one of the digital codes of the third data stream to produce a difference code; and (e) a packing means for packing the first data stream of digital codes and the difference codes determined by the difference code producing circuit in a given format.

In the preferred mode of the invention, a third A/D converting circuit, a fourth A/D converting circuit, a second decimating means, and a second difference code producing circuit are further provided. The third A/D converting circuit converts a second analog input signal that is different in channel from the analog input signal at the first sampling frequency into a fourth data stream of digital codes. The fourth A/D converting circuit converts the second analog input signal at the second sampling frequency into a fifth data stream of digital codes. The second decimating means decimates the digital codes of the fifth data stream alternately to produce a sixth data stream of digital codes which are coincident in time sequence with the digital codes of the fourth data stream. The second difference code producing circuit determines a difference between each of the digital codes of the fourth data stream and one of the digital codes of the sixth data stream to produce a second difference code, The packing means packs the first and fourth data streams of digital codes and the first and second difference codes in a given format to produce a data code, the packing means locating in the data code the first and second difference codes as a third channel separate from the first and fourth data streams of digital codes.

In another preferred mode of the invention, the decimating means may separate the second data stream of digital codes into the third data stream of digital codes and a fourth stream of digital codes. A second difference code producing circuit may further be provided which determines a difference between each of the digital codes of the first data stream or a data code as a function of each of the digital codes of the first data stream and one of the digital codes of the fourth data stream to produce a second difference code. The packing means packs the first data stream of digital codes and the difference codes determined by the difference code producing circuit and the second difference codes determined by the second difference code producing circuit in a given format.

A scaling means may further be provided for scaling the difference codes in each of given frames.

A predicted code producing means, a second difference code producing circuit, and a scaling means may further be provided. The predicted code producing means produces predicted codes based on the second data stream of digital codes. The second difference code producing circuit determines a difference between each of the digital codes of the fourth data stream and one of the predicted codes to produce a second difference code. The scaling means scales the difference codes determined by the difference code producing circuit and the second difference codes determined by the second difference code producing circuit in each of given frames. The packing means packs the first data stream of digital codes and the difference codes determined by the difference code producing circuit and the second difference codes determined by the second difference code producing circuit in a given format.

According to a second aspect of the present invention, there is provided an encoding apparatus which comprises: (a) a first A/D converting circuit converting an analog input signal at a first sampling frequency into a first data stream of digital codes; (b) a second A/D converting circuit converting the analog input signal at a second sampling frequency that is four times the first sampling frequency into a second data stream of digital codes; (c) a reference code determining means determining as reference codes each based on a function of consecutive two of the digital codes of the first data stream, either of the consecutive two of the digital codes of the first data stream, or a function of either of the consecutive two of the digital codes of the first data stream; (d) a first difference code producing circuit determining differences between the digital codes of the first data stream and some of the digital codes of second data stream that are coincident in time sequence with the first data stream of digital codes to produce first difference codes; (e) a second difference code producing circuit determining differences between the reference codes and some of the second data stream of digital codes each of which are coincident in time sequence with a middle point between consecutive two of the first data stream of digital codes to produce second difference codes; and (f) a packing means for packing the first data stream of digital codes and the first and second difference codes in a given format.

According to a third aspect of the present invention, there is provided an encoding apparatus which comprises: (a) a first A/D converting circuit converting an analog input signal at a first sampling frequency into a first data stream of digital codes; (b) a second A/D converting circuit converting the analog input signal at a second sampling frequency that is four times the first sampling frequency into a second data stream of digital codes; (c) a first difference code producing circuit determining differences between the digital codes of the first data stream and some of the digital codes of second data stream that are coincident in time sequence with the first data stream of digital codes to produce first difference codes; (d) an encoding means for encoding some of the second data stream of digital codes that are out of coincidence in time sequence with the first stream of digital codes in ADPCM to produce ADPCM codes; and (e) a packing means for packing the first data stream of digital codes, the difference codes, and the ADPCM codes in a given format.

According to a fourth aspect of the present invention, there is provided a decoding apparatus for decoding digital signals provided by an encoding apparatus including a first data stream of digital codes into which an analog signal is A/D-converted at a first sampling frequency and difference codes between the first data stream of digital codes and a third data stream of digital codes that are coincident in time sequence with the first data stream of digital codes and that are produced by A/D-converting the analog signal at a second sampling frequency that is twice the first sampling frequency to produce a second data stream of digital codes and decimating the digital codes of the second data stream alternately, comprising: (a) a decoding circuit adding the difference codes to the first data steam of digital codes to decode half of a fourth data stream of digital codes that are twice the first data stream of digital codes and decoding the fourth data stream of digital codes based on the decoded half of the fourth data stream of digital codes; (b) a first D/A converting circuit D/A-converting the first data stream of digital codes at a first sampling frequency into an analog signal; and (c) a second D/A converting circuit D/A-converting the fourth data stream of digital codes at a second sampling frequency that is four times the first sampling frequency into an analog signal.

According to a fifth aspect of the present invention, there is provided a decoding apparatus for decoding digital signals provided by an encoding apparatus including a first data stream of digital codes into which a two-channel analog signal is A/D-converted at a first sampling frequency and difference codes between the first data stream of digital codes and a third data stream of digital codes that are coincident in time sequence with the first data stream of digital codes and that are produced by A/D-converting the two-channel analog signal at a second sampling frequency that is twice the first sampling frequency to produce a second data stream of digital codes and decimating the digital codes of the second data stream alternately, comprising: (a) a decoding circuit adding the difference codes to the first data steam of digital codes to decode half of a fourth data stream of digital codes that are twice the first data stream of digital codes and decoding the fourth data stream of digital codes based on the decoded half of the fourth data stream of digital codes; (b) a first D/A converting circuit D/A-converting the first data stream of digital codes at a first sampling frequency into an analog signal; and (c) a second D/A converting circuit D/A-converting the fourth data stream of digital codes at a second sampling frequency that is four times the first sampling frequency into an analog signal.

According to a sixth aspect of the present invention, there is provided a decoding apparatus for decoding digital signals provided by an encoding apparatus, including a first data stream of digital codes, first difference codes, and second difference codes, the first data stream of digital code being produced by A/D-converting an analog signal at a first sampling frequency, the first difference codes being produced by differences between the first data stream of digital codes and a third data stream of digital codes that are coincident in time sequence with the first data stream of digital codes and that are produced by A/D-converting the analog signal at a second sampling frequency that is twice the first sampling frequency to produce a second data stream of digital codes and decimating the digital codes of the second data stream alternately, and the second difference codes being produced by differences between the first data stream of digital codes or data codes each being provided as a function of one of the digital codes of the first data stream and a fourth data stream of digital codes including the remainder of the second data stream other than the third data stream of digital codes, comprising: (a) a first decoding circuit adding the first data stream of digital codes to the first difference codes to decode the third data stream; (b) a second decoding circuit adding the second difference codes to the decoded third data stream or to the first data stream of digital codes or data codes each being as a function of one of the first data stream of digital codes to decode the fourth data stream of digital codes; (c) a first D/A converting circuit D/A-converting the first data stream of digital codes at a first sampling frequency into an analog signal; and (d) a second D/A converting circuit D/A-converting the third and fourth data streams of digital codes decoded by the first and second decoding circuits at a second sampling frequency that is twice the first sampling frequency into an analog signal.

According to a seventh aspect of the present invention, there is provided a decoding apparatus for decoding digital signals provided by an encoding apparatus including a first data stream of digital codes into which a two-channel analog signal is A/D-converted at a first sampling frequency and difference codes between the first data stream of digital codes and a third data stream of digital codes that are coincident in time sequence with the first data stream of digital codes and that are produced by A/D-converting the two-channel analog signal at a second sampling frequency that is twice the first sampling frequency to produce a second data stream of digital codes and decimating the digital codes of the second data stream alternately, the difference codes being scaled in each of given frames, comprising: (a) a difference code controlling means for controlling values of the difference codes using scaling information contained in the digital signals; (b) a decoding circuit adding the difference codes controlled by the difference code controlling means to the first data steam of digital codes to decode half of a fourth data stream of digital codes that are twice the first data stream of digital codes and decoding the fourth data stream of digital codes based on the decoded half of the fourth data stream of digital codes; (c) a first D/A converting circuit D/A-converting the first data stream of digital codes at a first sampling frequency into an analog signal; and (d) a second D/A converting circuit D/A-converting the fourth data stream of digital codes at a second sampling frequency that is four times the first sampling frequency into an analog signal.

According to an eighth aspect of the present invention, there is provided a decoding apparatus for decoding digital signals provided by an encoding apparatus, including a first data stream of digital codes, first difference codes, and second difference codes, the first data stream of digital code being produced by A/D-converting an analog signal at a first sampling frequency, the first difference codes being produced by differences between the first data stream of digital codes and a third data stream of digital codes that are coincident in time sequence with the first data stream of digital codes and that are produced by A/D-converting the analog signal at a second sampling frequency that is twice the first sampling frequency to produce a second data stream of digital codes and decimating the digital codes of the second data stream alternately, and the second difference codes being produced by differences between the first data stream of digital codes or data codes each being provided as a function of one of the digital codes of the first data stream and a fourth data stream of digital codes including the remainder of the second data stream other than the third data stream of digital codes, the first and second difference codes being scaled in each of given frames, comprising: (a) a difference code controlling means for controlling values of the first and second difference codes using scaling information contained in the digital signals; (b) a first decoding circuit adding the first difference codes controlled by the difference code controlling means to the first data stream of digital codes to decode the third data stream; (c) a second decoding circuit adding the second difference codes controlled by the difference code controlling means to the decoded third data stream or to the first data stream of digital codes or data codes each being as a function of one of the first data stream of digital codes to decode the fourth data stream of digital codes; (d) a first D/A converting circuit D/A-converting the first data stream of digital codes at a first sampling frequency into an analog signal; and (e) a second D/A converting circuit D/A-converting the third and fourth data streams of digital codes decoded by the first and second decoding circuits at a second sampling frequency that is twice the first sampling frequency into an analog signal.

According to a ninth aspect of the present invention, there is provided a decoding apparatus for decoding digital signals provided by an encoding apparatus, including a first data stream of digital codes, first difference codes, and second difference codes, the first data stream of digital code being produced by A/D-converting an analog signal at a first sampling frequency, the first difference codes being produced by differences between the first data stream of digital codes and a third data stream of digital codes that are coincident in time sequence with the first data stream of digital codes and that are produced by A/D-converting the analog signal at a second sampling frequency that is twice the first sampling frequency to produce a second data stream of digital codes and decimating the digital codes of the second data stream alternately, and the second difference codes being produced by differences between the first data stream of digital codes or data codes each being provided as a function of one of the digital codes of the first data stream and a fourth data stream of digital codes including the remainder of the second data stream other than the third data stream of digital codes, the first and second difference codes being scaled in each of given frames, comprising: (a) a difference code controlling means for controlling values of the first and second difference codes using scaling information contained in the digital signals; (b) a first decoding circuit adding the first difference codes controlled by the difference code controlling means to the first data stream of digital codes to decode the third data stream; (c) a predicted value producing means for producing predicted codes based on the second data stream of digital codes; (d) a second decoding circuit adding the second difference codes controlled by the difference code controlling means to the predicted values to decode the fourth data stream of digital codes; (e) a first D/A converting circuit D/A-converting the first data stream of digital codes at a first sampling frequency into an analog signal; and (f) a second D/A converting circuit D/A-converting the third and fourth data streams of digital codes decoded by the first and second decoding circuits at a second sampling frequency that is twice the first sampling frequency into an analog signal.

According to a tenth aspect of the present invention, there is provided a decoding apparatus for decoding digital signals provided by an encoding apparatus, including a first data stream of digital codes, first difference codes, and second difference codes, the first data stream of digital code being produced by A/D-converting an analog signal at a first sampling frequency, the first difference codes being produced by differences between the first data stream of digital codes and some of a second data stream of digital codes that are coincident in time sequence with the first data stream of digital codes, the second data stream being produced by A/D-converting the analog signal at a second sampling frequency that is four times the first sampling frequency, the second difference codes being produced by differences between reference codes each determined using one or consecutive two of the first data stream of digital codes and some of the second data stream of digital codes each of which is coincident in time sequence with an intermediate signal between consecutive two of the digital codes of the first data stream, comprising: (a) a first decoding circuit decoding first codes corresponding to a quarter of the second data stream of digital codes by adding the first difference codes to the first data stream of digital codes; (b) a second decoding circuit decoding second codes corresponding to another quarter of the second data stream of digital codes by determining the reference codes using one or consecutive two of the first data stream of digital codes and decoding some of the second data stream of digital code corresponding to the intermediate signals using the reference codes and the second difference codes; (c) a third decoding circuit decoding third and fourth codes corresponding to the remainder of the second data stream of digital codes using the first and second codes decoded by the first and second decoding circuits; (d) a selection means for selecting the first, second, third, and fourth codes in sequence to produce a data stream of digital codes; (e) a first D/A converting circuit D/A-converting the first data stream of digital codes at a first sampling frequency into an analog signal; and (f) a second D/A converting circuit D/A-converting the data stream of digital code produced by the selection means at a second sampling frequency that is four times the first sampling frequency into an analog signal.

According to an eleventh aspect of the present invention, there is provided a decoding apparatus for decoding digital signals provided by an encoding apparatus, including a first data stream of digital codes, difference codes, and ADPCM codes, the first data stream of digital code being produced by A/D-converting an analog signal at a first sampling frequency, the difference codes being produced by differences between the first data stream of digital codes and some of a second data stream of digital codes that are coincident in time sequence with the first data stream of digital codes, the second data stream being produced by A/D-converting the analog signal at a second sampling frequency that is four times the first sampling frequency, the ADPCM codes being produced by encoding in ADPCM portions of the second data stream of digital codes that are out of coincidence in time sequence with the first data stream of digital codes, comprising: (a) a decoding circuit decoding first codes corresponding to a quarter of the second data stream of digital codes by adding the difference codes to the first data stream of digital codes; (b) an ADPCM decoding circuit decoding the portions of the second data stream of digital codes that are out of coincidence in time sequence with the first data stream of digital codes using the ADPCM codes and the first codes decoded by the decoding circuit; (c) a selection means for selecting the first codes decoded by the decoding circuit and the portions of the second data stream of digital code decoded by the ADPCM decoding circuit in sequence to produce a data stream of digital codes; (d) a first D/A converting circuit D/A-converting the first data stream of digital codes at a first sampling frequency into an analog signal; and (e) a second D/A converting circuit D/A converting the data stream of digital code produced by the selection means at a second sampling frequency that is four times the first sampling frequency into an analog signal.

According to a twelfth aspect of the present invention, there is provided an encoded information record carrier on which a stream of digital signals encoded by (a) a first A/D converting step converting an analog input signal at a first sampling frequency into a first data stream of digital codes; (b) a second A/D converting step converting the analog input signal at a second sampling frequency that is twice the first sampling frequency into a second data stream of digital codes; (c) a decimating step decimating the digital codes of the second data stream alternately to produce a third data stream of digital codes which are coincident in time sequence with the digital codes of the first data stream; (d) a difference code producing step determining a difference between each of the digital codes of the first data stream and one of the digital codes of the third data stream to produce a difference code; and (e) a packing step packing the first data stream of digital codes and the difference codes determined by the difference code producing step in a given format.

According to a thirteenth aspect of the present invention, there is provided an encoded information record carrier on which a stream of digital signals encoded by the following steps: (a) A/D converting an analog input signal at a first sampling frequency into a first data stream of digital codes; (b) A/D converting the analog input signal at a second sampling frequency that is four times the first sampling frequency into a second data stream of digital codes; (c) determining as reference codes each based on a function of consecutive two of the digital codes of the first data stream, either of the consecutive two of the digital codes of the first data stream, or a function of either of the consecutive two of the digital codes of the first data stream; (d) producing first difference code by determining differences between the digital codes of the first data stream and some of the digital codes of second data stream that are coincident in time sequence with the first data stream of digital codes; (e) producing second difference codes by determining differences between the reference codes and some of the second data stream of digital codes each of which are coincident in time sequence with a middle point between consecutive two of the first data stream of digital codes; and (f) packing the first data stream of digital codes and the first and second difference codes in a given format.

According to a fourteenth aspect of the present invention, there is provided an encoded information record carrier on which a stream of digital signals encoded by the following steps: (a) A/D converting an analog input signal at a first sampling frequency into a first data stream of digital codes; (b) A/D converting the analog input signal at a second sampling frequency that is four times the first sampling frequency into a second data stream of digital codes; (c) producing first difference codes by determining differences between the digital codes of the first data stream and some of the digital codes of second data stream that are coincident in time sequence with the first data stream of digital codes; (d) encoding some of the second data stream of digital codes that are out of coincidence in time sequence with the first stream of digital codes in ADPCM to produce ADPCM codes; and (e) packing the first data stream of digital codes, the difference codes, and the ADPCM codes in a given format.

According to a fifteenth aspect of the present invention, there is provided an encoding apparatus comprising: (a) an A/D converting circuit converting an analog input signal at a sampling frequency twice higher than a frequency band specified in CD, DAT (Digital Audio Tape recorder), or DVD (Digital Video Disc) standards into a first data stream of digital codes; (b) a low-pass filter circuit allowing components of the first data stream of digital codes within a band that is half that of the first data stream of digital codes to pass therethrough; (c) a decimating circuit decimating the components outputted from the low-pass filter circuit alternately to produce a second data stream of digital codes; (d) a difference code producing means for producing difference codes that are differences between digital codes produced by decimating the first data stream of digital codes alternately and the digital codes of the second data stream; and (e) a transmitting means for transmitting the second data stream of digital codes and the difference codes.

In the preferred mode of the invention, the difference code producing means further produces second difference codes that are differences between codes including portions of the first data stream of codes other than the digital codes produced by decimating the first data stream of digital codes alternately and the digital codes of the second data stream. The transmitting means further transmits the second difference codes.

A scaling means may further be provided for scaling the difference codes in each of given frames.

According to a sixteenth aspect of the present invention, there is provided an encoding apparatus comprising: (a) an A/D converting circuit converting an analog input signal at a sampling frequency twice higher than a frequency band specified in CD, DAT, or DVD standards into a first data stream of digital codes; (b) a low-pass filter circuit allowing components of the first data stream of digital codes within a band that is half that of the first data stream of digital codes to pass therethrough; (c) a decimating circuit decimating the components outputted from the low-pass filter circuit alternately to produce a second data stream of digital codes; (d) a first difference code producing means for producing first difference codes that are differences between digital codes produced by decimating the first data stream of digital codes alternately and the digital codes of the second data stream;

(e) a prediction means for predicting digital codes corresponding to portions of the first data stream of digital codes other than the digital codes produced by decimating the first data stream of digital codes alternately; (f) a second difference code producing means for producing second difference codes that are differences between the predicted digital codes and the portions of the first data stream of digital codes other than the digital codes produced by decimating the first data stream of digital codes alternately; (g) a scaling means for scaling the first and second difference codes in each of given frames; and (h) a transmitting means for transmitting the second data stream of digital codes and the first and second difference codes scaled by the scaling means.

According to a seventeenth aspect of the present invention, there is provided an encoding apparatus comprising: (a) an A/D converting circuit converting an analog input signal at a sampling frequency four times higher than a frequency band specified in CD, DAT, or DVD standards into a first data stream of digital codes; (b) a low-pass filter circuit allowing components of the first data stream of digital codes within a band that is a quarter of that of the first data stream of digital codes to pass therethrough; (c) a decimating circuit decimating the components outputted from the low-pass filter circuit to produce a second data stream of digital codes that is a quarter of the components outputted from the low-pass filter circuit; (d) a first difference code producing means for producing first difference codes that are differences between the digital codes of the second data stream and first portions of the first data stream of digital codes at fourth code intervals; (e) a second difference code producing means for producing second difference codes that are differences between second portions of the first data stream of digital codes at fourth code intervals and the first portions or values as a function of the first portions; and (f) a transmitting means for transmitting the second data stream of digital codes and the first and second difference codes.

According to an eighteenth aspect of the present invention, there is provided an encoding apparatus comprising: (a) an A/D converting circuit converting an analog input signal at a sampling frequency four times higher than a frequency band specified in CD, DAT, or DVD standards into a first data stream of digital codes; (b) a low-pass filter circuit allowing components of the first data stream of digital codes within a band that is a quarter of that of the first data stream of digital codes to pass therethrough; (c) a decimating circuit decimating the components outputted from the low-pass filter circuit to produce a second data stream of digital codes that is a quarter of the components outputted from the low-pass filter circuit; (d) a difference code producing means for producing difference codes that are differences between the digital codes of the second data stream and first portions of the first data stream of digital codes at fourth code intervals; (e) an encoding means for encoding portions of the first data stream of digital codes other than the first portions in ADPCM to produce ADPCM codes; and (f) a transmitting means for transmitting the second data stream of digital codes, the difference codes, and the ADPCM codes.

According to a nineteenth aspect of the present invention, there is provided a decoding apparatus for decoding for decoding digital signals provided by an encoding apparatus including a first data stream of digital codes and difference codes, the first data stream of digital codes being produced by A/D-converting an analog signal at a given sampling frequency two times higher than a frequency band specified in CD, DAT, or DVD standards, the difference codes indicating differences between digital codes produced by decimating the first data stream of digital codes alternately and digital codes of a second data stream produced by alternately decimating components of the first data stream of digital codes outputted from a low-pass filter circuit which allows the first data stream of digital codes within a band that is half that of the first data stream of digital codes to pass therethrough, comprising: (a) a decoding circuit adding the difference codes to the first data stream of digital codes to decode half of the first data stream of digital codes, the decoding circuit decoding all the first data stream of digital codes based on the decoded half of the first data stream of digital codes; and (b) a D/A converting circuit converting the first data stream of digital codes decoded by the decoding circuit at the given sampling frequency.

According to a twentieth aspect of the present invention, there is provided a decoding apparatus comprising: (a) an addition means for adding an input data stream of digital codes and difference codes together, the difference codes indicating differences between digital codes produced by decimating the input data stream of digital codes alternately and digital codes of a second data stream produced by alternately decimating components of the input data stream of digital codes outputted from a low-pass filter circuit which allows the input data stream of digital codes within a band that is half that of the first data stream of digital codes to pass therethrough; and (b) decoding means for decoding the digital codes produced by decimating the input data stream of digital codes alternately based on results of an addition operation of the addition means.

According to a twenty-first aspect of the present invention, there is provided a decoding apparatus for decoding for decoding digital signals provided by an encoding apparatus including a first data stream of digital codes and first and second difference codes, the first data stream of digital codes being produced by A/D-converting an analog signal at a given sampling frequency two times higher than a frequency band specified in CD, DAT, or DVD standards, the first difference codes indicating differences between first digital codes produced by decimating the first data stream of digital codes alternately and digital codes of a second data stream produced by alternately decimating components of the first data stream of digital codes outputted from a low-pass filter circuit which allows the first data stream of digital codes within a band that is half that of the first data stream of digital codes to pass therethrough, the second difference codes indicating differences between second digital codes produced by decimating the first data stream of digital codes alternately and the second data stream of the digital codes, comprising: (a) a first decoding circuit adding the first difference codes to the first data stream of digital codes to decode first half of the first data stream of digital codes; (b) a second decoding circuit decoding second half of the first data stream of digital codes using the second difference codes; and (c) a D/A converting circuit converting the first data stream of digital codes decoded by the first and second decoding circuits at the given sampling frequency.

According to a twenty-second of the present invention, there is provided a decoding apparatus for decoding for decoding digital signals provided by an encoding apparatus including a first data stream of digital codes and difference codes, the first data stream of digital codes being produced by A/D-converting an analog signal at a given sampling frequency two times higher than a frequency band specified in CD, DAT, or DVD standards, the difference codes indicating differences between digital codes produced by decimating the first data stream of digital codes alternately and digital codes of a second data stream produced by alternately decimating components of the first data stream of digital codes outputted from a low-pass filter circuit which allows the first data stream of digital codes within a band that is half that of the first data stream of digital codes to pass therethrough, the difference codes being scaled, comprising: (a) a controlling means for controlling values of the scaled difference codes using scaling information transmitted along with the digital signals provided by the encoding apparatus; (b) a first decoding means for decoding half of the first data stream of digital codes by adding the controlled difference codes to the first data stream of digital codes; (c) a second decoding means for decoding all the first data stream of digital codes using the half of the first data stream of digital codes decoded by the first decoding means; and (d) a D/A converting circuit converting the first data stream of digital codes decoded by the second decoding means at the given sampling frequency.

According to a twenty-third aspect of the present invention, there is provided a decoding apparatus for decoding for decoding digital signals provided by an encoding apparatus including a first data stream of digital codes and first and second difference codes, the first data stream of digital codes being produced by A/D-converting an analog signal at a given sampling frequency two times higher than a frequency band specified in CD, DAT, or DVD standards, the first difference codes indicating differences between first digital codes produced by decimating the first data stream of digital codes alternately and digital codes of a second data stream produced by alternately decimating components of the first data stream of digital codes outputted from a low-pass filter circuit which allows the first data stream of digital codes within a band that is half that of the first data stream of digital codes to pass therethrough, the second difference codes indicating differences between second digital codes produced by decimating the first data stream of digital codes alternately and the second data stream of the digital codes, the first and second difference codes being scaled, comprising: (a) a controlling means for controlling the scaled first and second difference codes using scaling information transmitted along with the digital signals provided by the encoding apparatus; (b) a first decoding means for decoding first half of the first data stream of digital codes by adding the controlled first difference codes to the first data stream of digital codes; (c) a second decoding means for decoding second half of the first data stream of digital codes using the controlled second difference codes; and (d) a D/A converting circuit converting the first data stream of digital codes decoded by the first and second decoding means at the given sampling frequency.

According to a twenty-fourth aspect of the present invention, there is provided a decoding apparatus for decoding for decoding digital signals provided by an encoding apparatus including a first data stream of digital codes and first and second difference codes, the first data stream of digital codes being produced by A/D-converting an analog signal at a given sampling frequency four times higher than a frequency band specified in CD, DAT, or DVD standards, the first difference codes indicating differences between first digital codes produced by picking up first portions of the first data stream of the digital codes at fourth code intervals and digital codes of a second data stream produced by picking up at fourth code intervals components of the first data stream of digital codes outputted from a low-pass filter circuit which allows the first data stream of digital codes within a band that is a quarter of that of the first data stream of digital codes to pass therethrough, the second difference codes indicating differences between the first digital codes and second digital codes produced by picking up second portions of the first data stream of digital codes at fourth code intervals or values as a function of the second digital codes, comprising: (a) a decoding circuit adding the first difference codes to the first data stream of digital codes to decode a quarter of the first data stream of digital codes, the decoding circuit decoding all the first data stream of digital codes based on the decoded quarter of the first data stream of digital codes and the second difference codes; and (b) a D/A converting circuit converting the first data stream of digital codes decoded by the decoding circuit at the given sampling frequency.

According to a twenty-fifth aspect of the present invention, there is provided a decoding apparatus for decoding for decoding digital signals provided by an encoding apparatus including a first data stream of digital codes, difference codes, and ADPCM codes, the first data stream of digital codes being produced by A/D-converting an analog signal at a given sampling frequency four times higher than a frequency band specified in CD, DAT, or DVD standards, the difference codes indicating differences between first digital codes produced by picking up first portions of the first data stream of the digital codes at fourth code intervals and digital codes of a second data stream produced by picking up at fourth code intervals components of the first data stream of digital codes outputted from a low-pass filter circuit which allows the first data stream of digital codes within a band that is a quarter of that of the first data stream of digital codes to pass therethrough, the ADPCM codes being produced by encoding second digital codes produced by second portions of the first data stream of digital codes other than the first portions, comprising: (a) a decoding circuit adding the difference codes to the first data stream of digital codes to decode the first digital codes produced by picking up the first portions of the first data stream of the digital codes at fourth code intervals which corresponds to quarter of the first data stream of digital codes; (b) an ADPCM decoder decoding the second digital codes produced by the second portions of the first data stream of digital codes other than the first portions using the ADPCM codes and the first digital codes decoded by the decoding circuit; (c) a selection means for selecting the first digital codes and the second digital codes decoded by the decoding circuit and the ADPCM decoder in sequence to produce a data stream of digital codes; and (e) a D/A converting circuit converting the data stream of digital codes produced by the selection means at the given sampling frequency.

According to a twenty-sixth aspect of the present invention, there is provided an encoded information record carrier on which a stream of digital signals encoded by the following steps: (a) A/D-converting an analog input signal at a sampling frequency twice higher than a frequency band specified in CD, DAT, or DVD standards into a first data stream of digital codes; (b) low-pass filtering components of the first data stream of digital codes within a band that is half that of the first data stream of digital codes; (c) decimating the components filtered in the low-pass filtering step alternately to produce a second data stream of digital codes; (d) producing difference codes that are differences between digital codes produced by decimating the first data stream of digital codes alternately and the digital codes of the second data stream; and (e) transmitting the second data stream of digital codes and the difference codes.

According to a twenty-seventh aspect of the present invention, there is provided an encoded information record carrier on which a stream of digital signals encoded by the following steps: (a) A/D-converting an analog input signal at a sampling frequency twice higher than a frequency band specified in CD, DAT, or DVD standards into a first data stream of digital codes; (b) low-pass filtering components of the first data stream of digital codes within a band that is half that of the first data stream of digital codes; (c) decimating the components outputted from the low-pass filtering step alternately to produce a second data stream of digital codes; (d) producing first difference codes that are differences between digital codes produced by decimating the first data stream of digital codes alternately and the digital codes of the second data stream; (e) predicting digital codes corresponding to portions of the first data stream of digital codes other than the digital codes produced by decimating the first data stream of digital codes alternately; (f) producing second difference codes that are differences between the predicted digital codes and the portions of the first data stream of digital codes other than the digital codes produced by decimating the first data stream of digital codes alternately; (g) scaling the first and second difference codes in each of given frames; and (h) transmitting the second data stream of digital codes and the first and second difference codes scaled by the scaling step.

According to a twenty-eighth aspect of the present invention, there is provided an encoded information record carrier on which a stream of digital signals encoded by the following steps: (a) A/D-converting an analog input signal at a sampling frequency four times higher than a frequency band specified in CD, DAT, or DVD standards into a first data stream of digital codes; (b) low-pass filtering components of the first data stream of digital codes within a band that is a quarter of that of the first data stream of digital codes; (c) decimating the components outputted from the low-pass filtering step to produce a second data stream of digital codes that is a quarter of the components outputted from the low-pass filter step; (d) producing first difference codes that are differences between the digital codes of the second data stream and first portions of the first data stream of digital codes at fourth code intervals; (e) producing second difference codes that are differences between second portions of the first data stream of digital codes at fourth code intervals and the first portions or values as a function of the first portions; and (f) transmitting the second data stream of digital codes and the first and second difference codes.

According to a twenty-ninth aspect of the present invention, there is provided an encoded information record carrier on which a stream of digital signals encoded by the following steps: (a) A/D-converting an analog input signal at a sampling frequency four times higher than a frequency band specified in CD, DAT, or DVD standards into a first data stream of digital codes; (b) low-pass filtering components of the first data stream of digital codes within a band that is a quarter of that of the first data stream of digital codes; (c) decimating the components outputted from the low-pass filtering step to produce a second data stream of digital codes that is a quarter of the components outputted from the low-pass filtering step; (d) producing difference codes that are differences between the digital codes of the second data stream and first portions of the first data stream of digital codes at fourth code intervals; (e) encoding portions of the first data stream of digital codes other than the first portions in ADPCM to produce ADPCM codes; and (f) transmitting the second data stream of digital codes, the difference codes, and the ADPCM codes.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Embodiments of the invention, as discussed below, are designed to encode audio signals within a pass band that is twice higher than that in, for example, typical CDs, DATs, or DVDs in data compression or to decode or store the encoded audio signals. In the CD standards, a sampling frequency is 44.1 kHz, and a pass band ranges to a maximum of 22.05 kHz. Frequency components within a double pass band are, thus, frequency components within a band up to 44.1 kHz sampled at 88.2 kHz, and frequency components within a quadruple pass band of two times the double pass band are frequency components within a band up to 88.2 kHz sampled at 176.4 kHz. In the DAT standards, a sampling frequency is 48 kHz, and a pass band ranges to a maximum of 24 kHz. Frequency components within a double pass band are, thus, frequency components within a band up to 48 kHz sampled at 96 kHz, and frequency components within a quadruple pass band of two times the double pass band are frequency components within a band up to 96 kHz sampled at 192 kHz. In the DVD standards, a sampling frequency is 96 kHz, and a pass band ranges to a maximum of 48 kHz. Frequency components within a double pass band are frequency components within a band up to 96 kHz sampled at 192 kHz, and frequency components within a quadruple pass band of two times the double pass band are frequency components within a band up to 192 kHz sampled at 384 kHz. The sampling frequencies (e.g., 88.2 kHz) used in the embodiments, as discussed below, are however not limited to the above frequencies.

Figure 1:
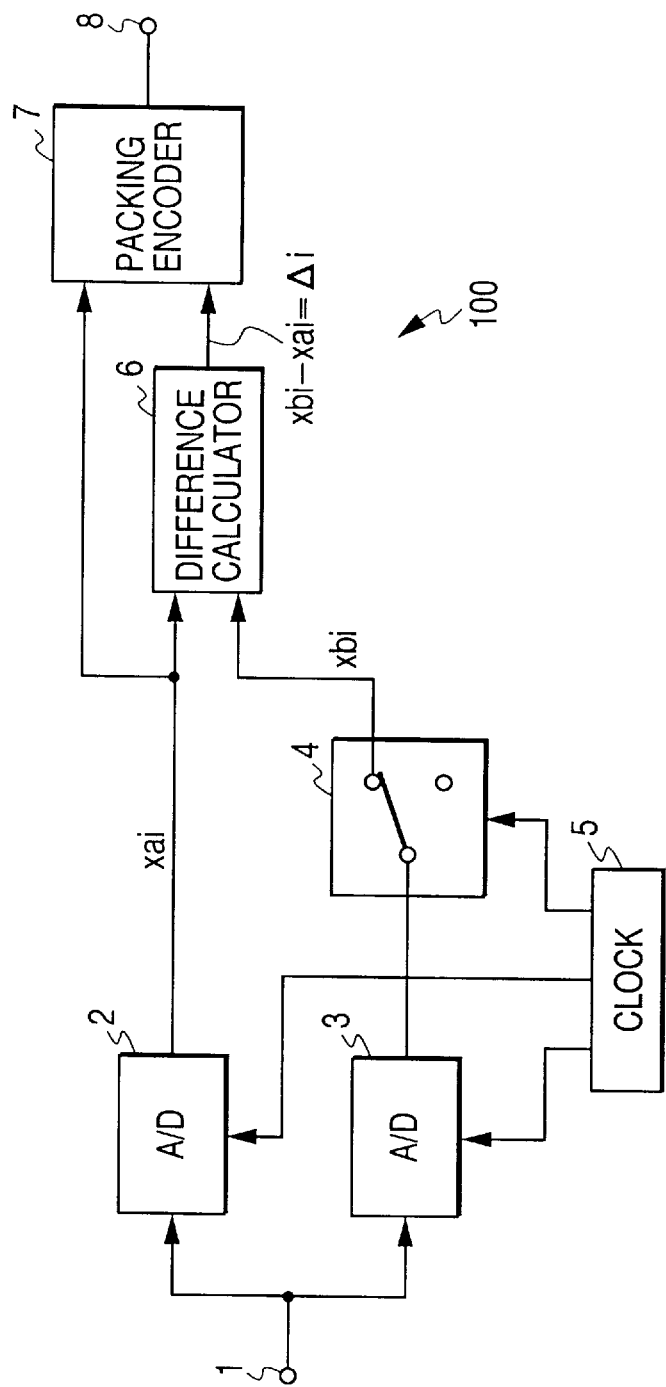
FIG. 1 is a block diagram which shows an encoding apparatus according to the first embodiment of the invention.
Figure 2:
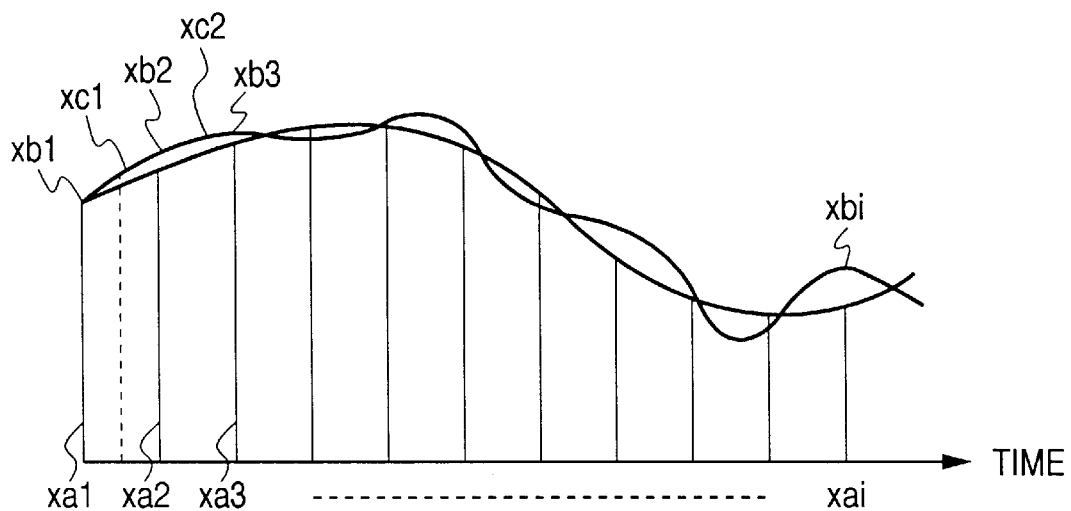
FIG. 2 an illustration which shows waveforms of signals A/D-converted by the encoding apparatus shown in FIG. 1.

Referring now to the drawings, wherein like reference numbers refer to like parts throughout several views, particularly to FIG. 1, there is shown an encoding apparatus 100 according to the first embodiment of the invention which includes A/D converters 2 and 3, a switch 4, a clock generator 5, a difference calculator 6, and a packing encoder 7 and is designed to convert an analog signal into digital signals having waveforms, as shown in FIG. 2.

In operation, an audio analog signal inputted to an input terminal 1 is supplied both to the A/D converters 2 and 3. The A/D converter 2 converts the input signal at a sampling frequency of, for example, 48 kHz according to a clock signal from the clock generator 5 into a data stream of xa1, xa2, xa3, . . . , xai, . . . (i=a natural number indicating a number of a sample), as shown in FIG. 2. Similarly, the A/D converter 3 converts the input signal at a sampling frequency of, for example, 96 kHz that is twice that of the A/D converter 2 according to the clock signal from the clock generator 5 into a data stream of xb1, xc1, xb2, xc2, . . . , xbi, xci, . . . , as shown in FIG. 2. These conversions into the data streams are achieved in a resolution of 24 bits.

The switch 4 selectively establishes communication between the A/D converter 3 and the difference calculator 6 to supply a data stream of xb1, xb2, . . . , xbi, . . . to the difference calculator 6. The difference calculator 6 determines a difference between xbi and xai (=xbi−xai) to provide a difference code Δi which is expressed with 24 bits or less. The expression of the difference code Δi with 24 bits enables complete reversible compression (i.e., lossless compression).

Figure 3:
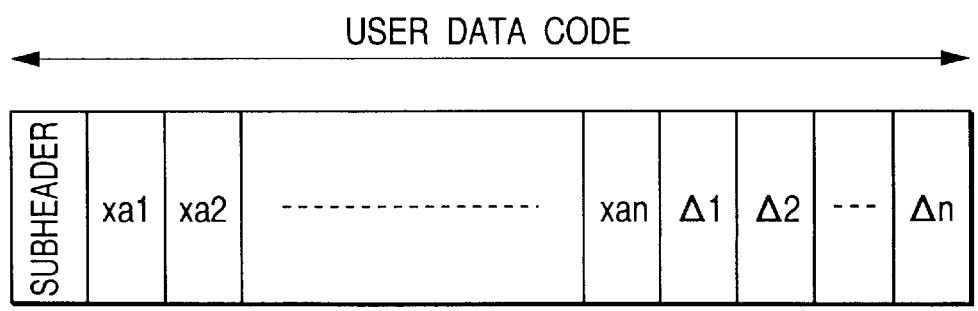
FIG. 3 is an illustration which shows a user data code produced by the encoding apparatus in FIG. 1.

The packing encoder 7 receives the data code xai from the A/D converter 2 and the difference code Δi and packs them to provide a user data code, as shown in FIG. 3, to an output terminal 8. When the user data code is represented with 2034 bytes, the number of data codes xai is 338, and the number of the difference codes Δi is also 338. A subheader is represented with 6 bytes. Note that in a DVD, the user data code is referred to as a packet, and the subheader is referred to as a packet header.

A master may be made using the signals picked up from the output terminal 8 of the packing encoder 7 to produce a record carrier such as an optical disc (e.g., a DVD).

Figure 4:
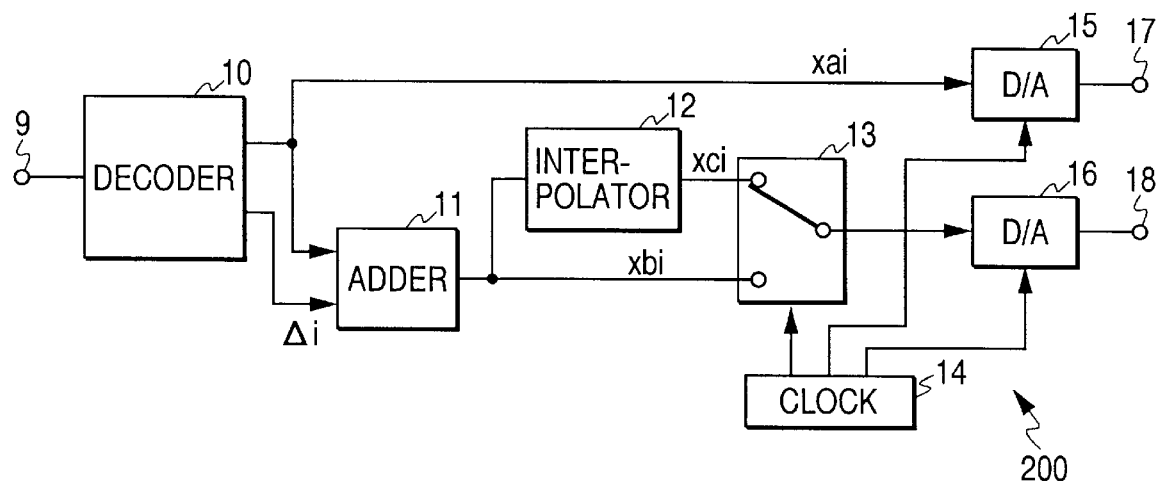
FIG. 4 is a block diagram which shows a decoding apparatus according to the second embodiment of the invention.

FIG. 4 shows a decoding apparatus 200 according to the second embodiment of the invention which includes an unpacking decoder 10, an adder 11, an interpolator 12, a switch 13, a clock generator 14, and D/A converters 15 and 16.

Figure 5:
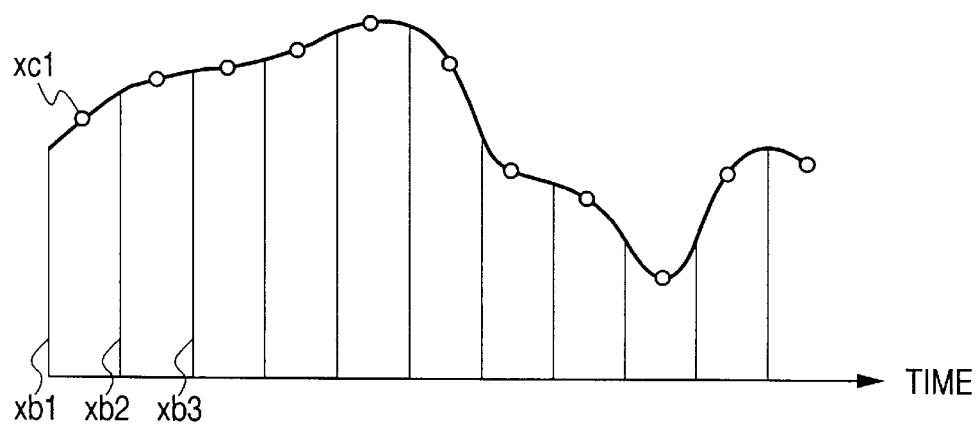
FIG. 5 is an illustration which shows a waveform of a signal D/A-converted by the decoding apparatus shown in FIG. 4.

In operation, an input signal (i.e., encoded digital data) appearing at an input terminal 9 is unpacked by the unpacking decoder 10. The adder 11 performs a mathematical operation of Δi +xai=xbi, as shown in FIG. 5. Note that xbi is expressed by 24 bits.

The interpolator 12 determines data codes xc1, xc2, . . . , xci, . . . , as shown in FIG. 5, between samples (i.e., the data codes xbi). For example, the interpolation of the data codes xbi may be achieved by setting the data codes xci to zeros (0s) using the so-called up sampling technique and passing them through a low-pass filter. The switch 13 selects outputs from the adder 11 and the interpolator 12 in sequence to produce a data stream of xb1, xc1, . . . , xbi, xci, . . . . The D/A converter 16 converts the output from the switch 13 into an analog signal and outputs it through an output terminal 18. A data stream of xai sampled at a given sampling frequency by the unpacking decoder 10 is supplied directly to the D/A converter 15. The D/A converter 15 converts the input into an analog signal with an accuracy of 24 bits and outputs it through an output terminal 17. Specifically, the conversion of the data stream of xai into the analog signal is achieved at high quality levels because they does not undergo the data compression. One series of data codes xbi of the data stream of xb1, xc1, . . . , xbi, xci, . . . sampled at a frequency of two times that of the data stream of xai is subjected only to the addition operation and thus reproduced without deterioration. The other series of data codes xci of the data stream of xbi, xci, . . . , xbi, xci, . . . are capable of being interpolated well, so that the deterioration (i.e., the S/N ratio) thereof will be within several bits at high frequency.

Figure 6:
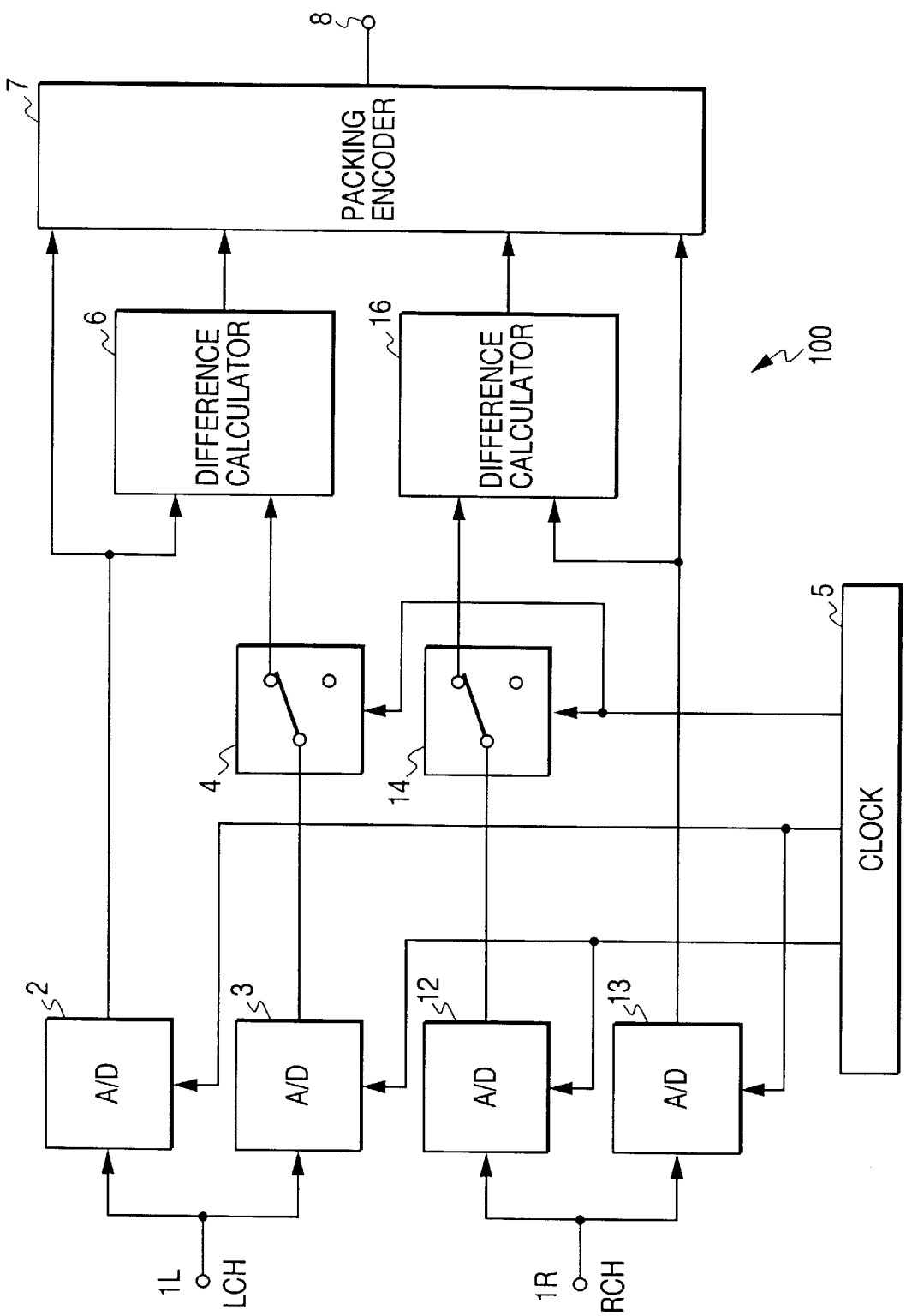
FIG. 6 is a block diagram which shows an encoding apparatus according to the third embodiment of the invention.

FIG. 6 shows an encoding apparatus 100 according to the third embodiment of the invention which includes R and L channel circuits identical in structure and operation with each other. Stereo signals entering input terminals 1L and 1R are sampled by the A/D converters 2, 12, 3, and 13 at a given sampling frequency and a double sampling frequency, as shown in FIG. 2. The following discussion will refer only to the L channel circuit for the sake of simplicity of explanation.

The L-channel signal inputted to the input terminal 1L is converted by the A/D converter 2 at a sampling frequency of, for example, 48 kHz according to a clock signal from the clock generator 5 into a data stream of xa1, xa2, xa3, . . . , xai, . . . each represented with 24 bits and also converted by the A/D converter 3 at a sampling frequency of 96 kHz that is twice the sampling frequency of the A/D converter 2 according to the clock signal from the clock generator 5 into a data stream of xb1, xc1, xb2, xc2, . . . , xbi, xci, . . . each represented with 24 bits The switch 4 selectively establishes communication between the A/D converter 3 and the difference calculator 6 to provide a data stream of xb1, xb2, . . . , xbi, . . . to the difference calculator 6. The difference calculator 6 determines a difference between xbi and xai (=xbi−xai) to provide a difference code Δi which is expressed with 12 bits or less.

Figure 7:
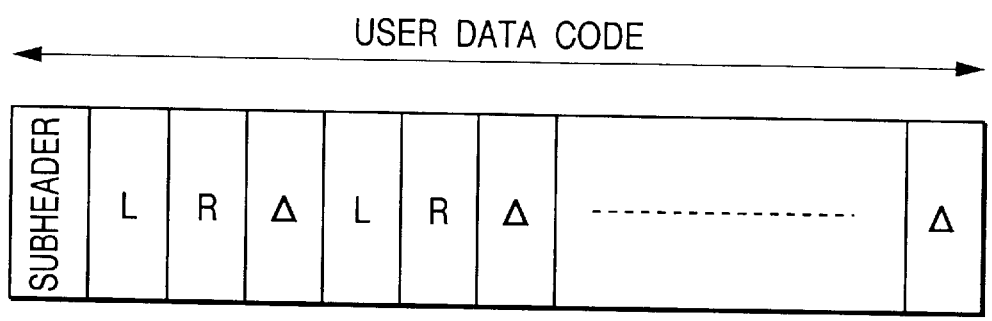
FIG. 7 an illustration which shows a user data code produced by the encoding apparatus in FIG. 6.

The packing encoder 7 receives the data code xai from the A/D converter 2 and the difference code Δi and packs them to provide a user data code, as shown in FIG. 7, to an output terminal 8. When the user data code is represented with 2034 bytes, the number of data codes xai at the L channel is 225, the number of data codes xai at the R channel is 225, and the number of the difference codes Δi is also 225. A subheader is represented by 9 bytes. Specifically, each of the difference codes Δi is arranged as a third channel following a pair of L and R channel data codes and consists of 12 higher order bits indicating the difference code Δi at the L-channel and 12 lower order bits indicating the difference code Δi at the R-channel.

Figure 8:
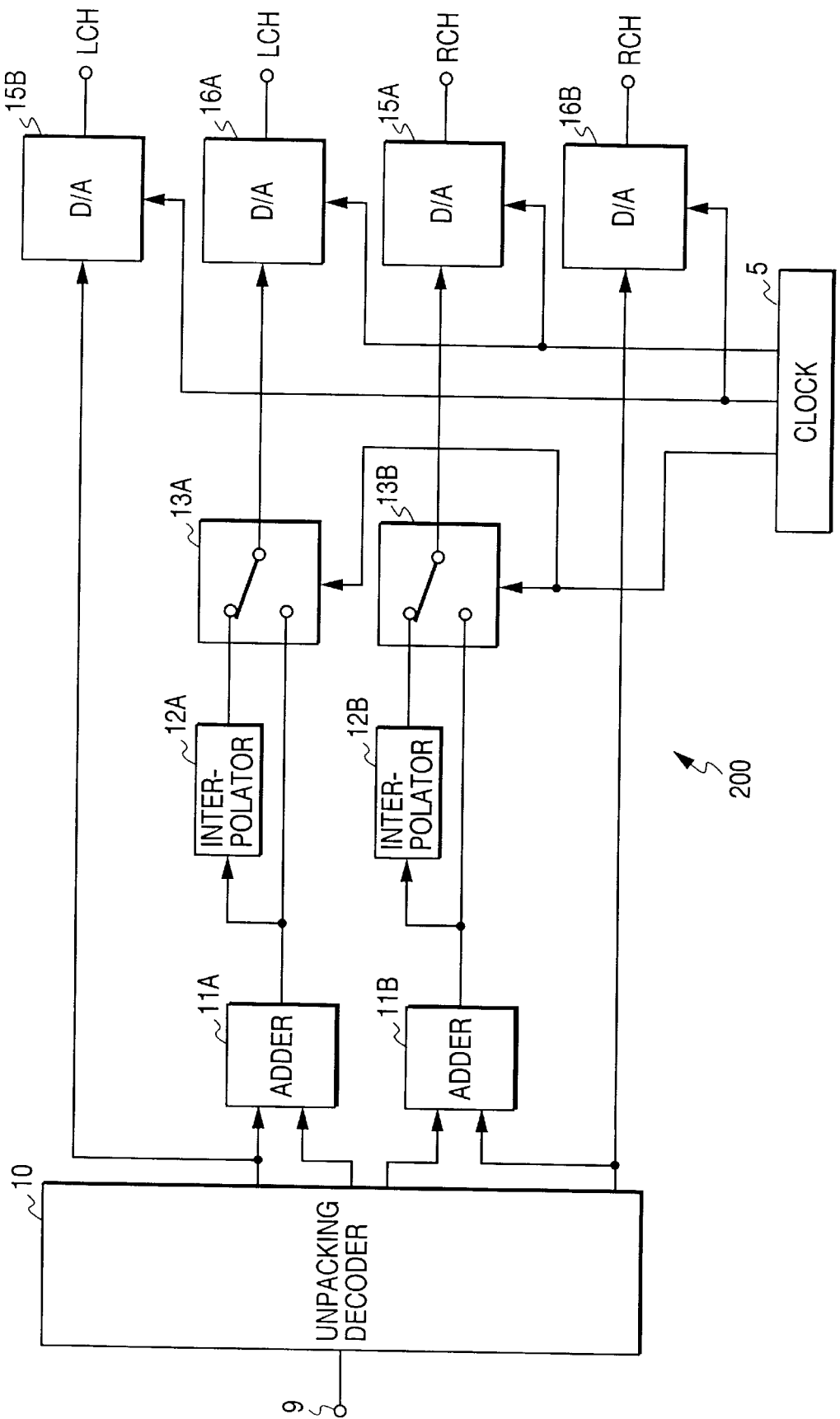
FIG. 8 is a block diagram which shows a decoding apparatus according to the fourth embodiment of the invention.
Figure 11:
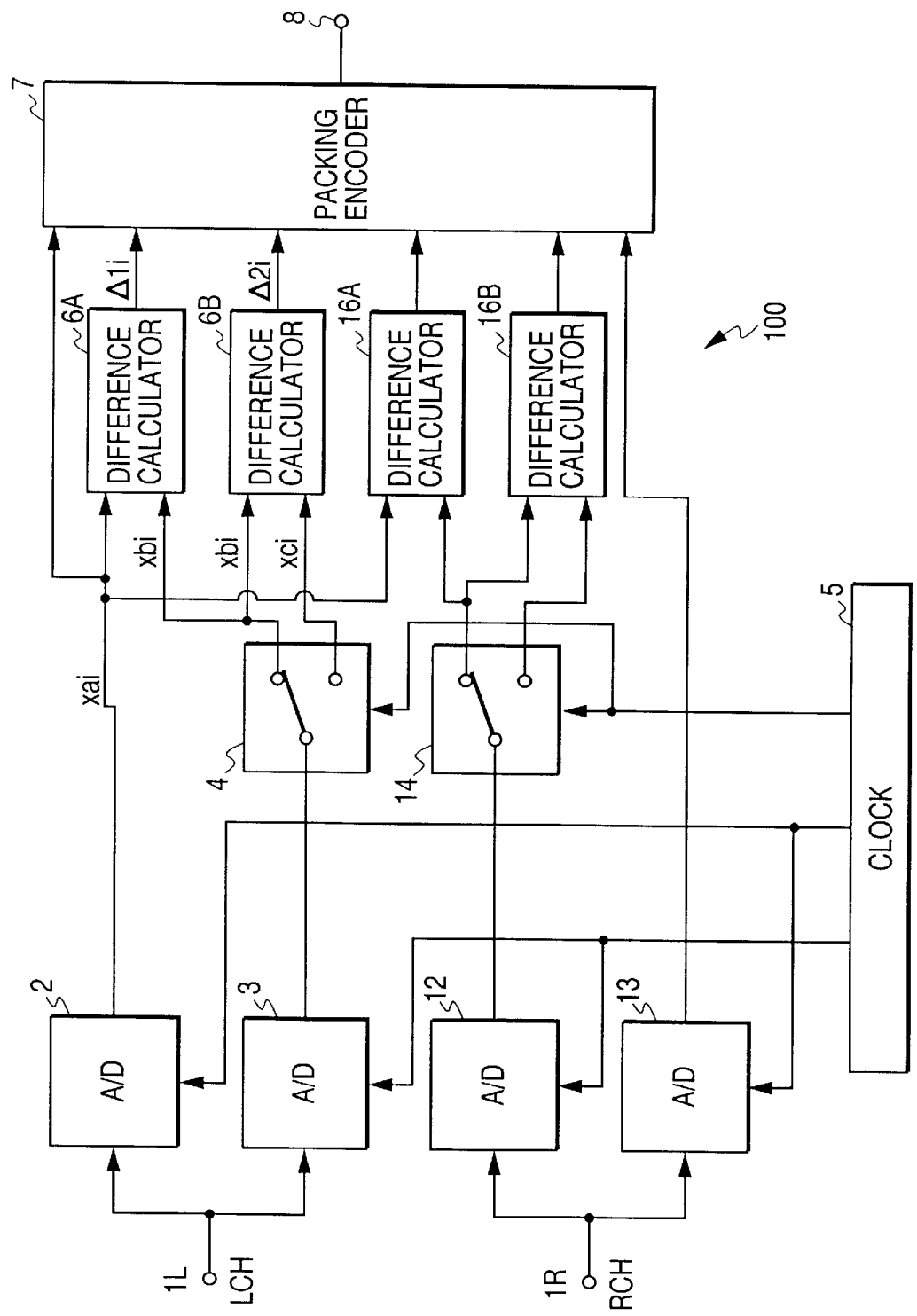
FIG. 11 is a block diagram which shows an encoding apparatus according to the seventh embodiment of the invention.

FIG. 8 shows a decoding apparatus 200 according to the fourth embodiment of the invention which is designed to convert a signal digitized by the encoding apparatus 100, as shown in FIG. 11, into an analog signal having the waveform as shown in FIG. 5.

The decoding apparatus 200, as can be seen from the drawing, includes L and R channel decoding circuits each identical with the one shown in FIG. 4, and explanation thereof in detail will be omitted here.

Specifically, each of the D/A converters 15B and 16B converts a data stream of xai outputted from the unpacking decoder 10 into an analog signal at a given frequency, while each of the D/A converters 15A and 16A converts a data stream of xb1, xc1, . . . , xbi, xci, . . . outputted from corresponding one of the switches 13A and 13B into an analog signal at a frequency of twice that of the D/A converters 15B and 16B, as shown in FIG. 5.

Figure 9:
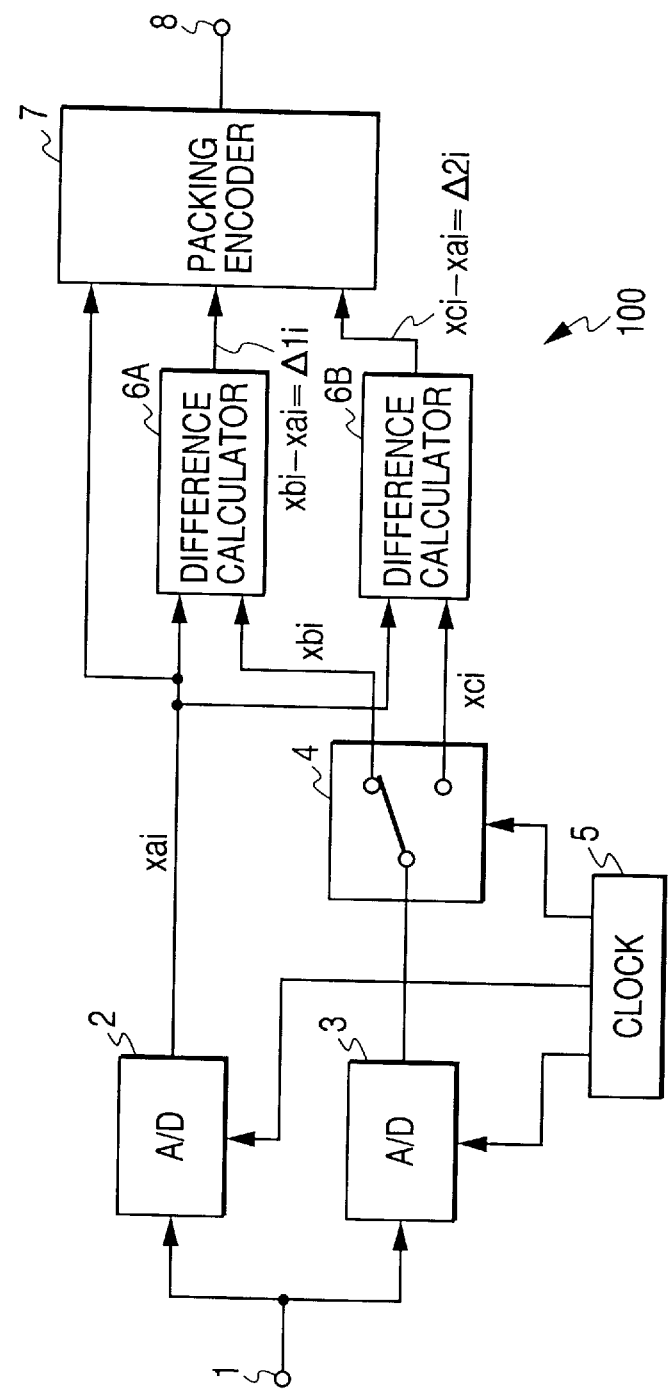
FIG. 9 is a block diagram which shows an encoding apparatus according to the fifth embodiment of the invention.

FIG. 9 shows an encoding apparatus 100 according to the fifth embodiment of the invention which is different from the one shown in FIG. 1 only in that a difference calculator 6B is arranged between the switch 4 and the packing encoder 7.

An input signal appearing at the input terminal 1 is sampled at a given sampling frequency and a double sampling frequency to produce streams of data codes having waveforms, as shown in FIG. 2.

Specifically, the A/D converter 2 converts the input signal at a sampling frequency of, for example, 48 kHz according to a clock signal from the clock generator 5 into a data stream of xa1, xa2, xa3, . . . , xai, . . . . Similarly, the A/D converter 3 converts the input signal at a sampling frequency of, for example, 96 kHz that is twice the sampling frequency of the A/D converter 2 according to the clock signal from the clock generator 5 into a data stream of xb1, xc1, xb2, xc2, . . . , xbi, xci, . . . . These conversions into the data streams are achieved in a resolution of 24 bits.

The switch 4 selectively establishes communications between the A/D converter 3 and the difference calculator 6A and between the A/D converter 3 and the difference calculator 6B to supply a data stream of xb1, xb2, . . . , xbi, . . . to the difference calculator 6A and a data stream of xc1, xc2, . . . , xci, . . . to the difference calculator 6B, respectively. The difference calculator 6A determines a difference between xbi and xai (=xbi−xai) to provide a difference code $\Delta 1i$ which is expressed with 24 bits or less. Similarly, the difference calculator 6B determines a difference between xci and xai (=xci−xai) to provide a difference code $\Delta 2i$ which is expressed with 8 bits or less. The difference code $\Delta 2i$ may alternatively be determined based on an average of samples preceding and following the data code xci (i.e., xci−(xai+xa(i+1))/2).

Figure 13:
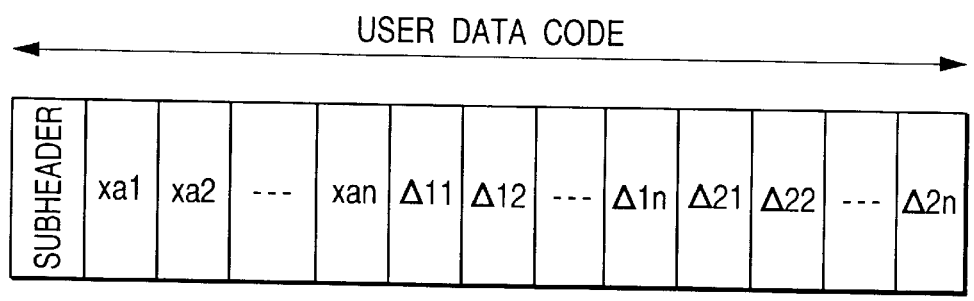
FIG. 13 is an illustration which shows a user data code produced by the encoding apparatuses of the fifth and thirteenth embodiments.

The packing encoder 7 receives the data code xai from the A/D converter 2 and the difference codes $\Delta 1i$ and $\Delta 2i$ from the difference calculators 6A and 6B and packs them to provide the user data code, as shown in FIG. 13, to an output terminal 8. When the user data code is represented with 2034 bytes, the number of data codes xai is 406, and the number of each of the difference codes $\Delta 1i$ and $\Delta 2i$ is also 406. A subheader is represented with 4 bytes.

Figure 10:
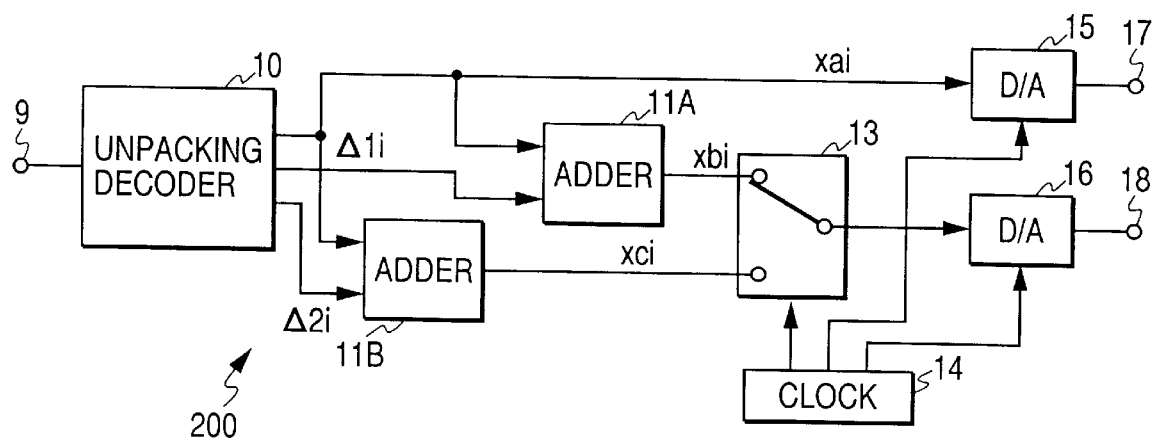
FIG. 10 is a block diagram which shows a decoding apparatus according to the sixth embodiment of the invention.

FIG. 10 shows a decoding apparatus 200 according to the sixth embodiment of the invention.

In operation, the adder 11A determines a data code xbi, as shown in FIG. 5, expressed by 24 bits by summing $\Delta 1i$ and xai (i.e., $\Delta 1i$ +xai=xbi) based on an output from the unpacking decoder 10. The adder 11B determines a data code xci, as shown in FIG. 5, expressed by 24 bits by summing $\Delta 2i$ and xai (i.e., $\Delta 2i$ +xai=xci) based on an output from the unpacking decoder 10. The data code xci may alternatively be determined according to the equation of $\Delta 2i$ +(xai+xa(i+1))/2=xci.

The switch 13 selects outputs from the adders 11A and 11B in sequence to provide a data stream of xb1, xc1, . . . , xbi, xci, . . . to the D/A converter 16. The D/A converter 15 converts a data code xai supplied directly from the unpacking decoder 10 into an analog signal at a given sampling frequency and outputs it to the output terminal 17. The D/A converter 16 converts the output from the switch 13 at a sampling frequency of twice that of the D/A converter 15 into an analog signal and outputs it through the output terminal 18.

FIG. 11 shows an encoding apparatus according to the seventh embodiment of the invention which is, as clearly shown in the drawing, a modification of the one shown in FIG. 6.

Stereo signals entering input terminals 1L and 1R are sampled by the A/D converters 2, 12, 3, and 13 at a given sampling frequency and a double sampling frequency, as shown in FIG. 2. The following discussion will refer only to the L channel circuit for the sake of simplicity of explanation.

The L-channel signal inputted to the input terminal 1L is converted by the A/D converter 2 at a sampling frequency of, for example, 48 kHz according to a clock signal from the clock generator 5 into a data stream of xa1, xa2, xa3, . . . , xai, . . . each expressed by 24 bits and also converted by the A/D converter 3 at a sampling frequency of 96 kHz that is twice the sampling frequency of the A/D converter 2 according to the clock signal from the clock generator 5 into a data stream of xb1, xc1, xb2, xc2, . . . , xbi, xci, . . . each expressed by 24 bits.

The switch 4 selects a data stream of xb1, xb2, . . . , xbi, . . . and provides it to the difference calculator 6A. The difference calculator 6A determines a difference between xbi and xai (=xbi−xai) to provide a difference code $\Delta 1i$ which is expressed with 6 bits or less on average. The switch 4 also selects a data stream of xc1, xc2, . . . , xci, . . . and provides it to the difference calculator 6B. The difference calculator 6B determines a difference between xbi and xci (=xbi−xci) to provide a difference code $\Delta 2i$ which is expressed with 6 bits or less on average.

The packing encoder 7 receives the data code xai supplied directly from the A/D converters 2 and 12, the difference codes $\Delta 1i$ and $\Delta 2i$ supplied from the difference calculators 6A to 16B and packs them to provide the user data code, as shown in FIG. 7, to the output terminal 8. When the user data code is represented with 2034 bytes, the number of data codes xai at the L channel is 225, the number of data codes xai at the R channel is 225, and the number of each of the difference codes $\Delta 1i$ and $\Delta 2i$ is also 225. A subheader is represented with 9 bytes. Specifically, each of the difference codes $\Delta i$ is arranged as a third channel following a pair of L and R channel data codes and consists of 6 higher order bits on average indicating the difference code $\Delta i$ at the L-channel and 6 lower order bits on average indicating the difference code $\Delta i$ at the R-channel.

Figure 12:
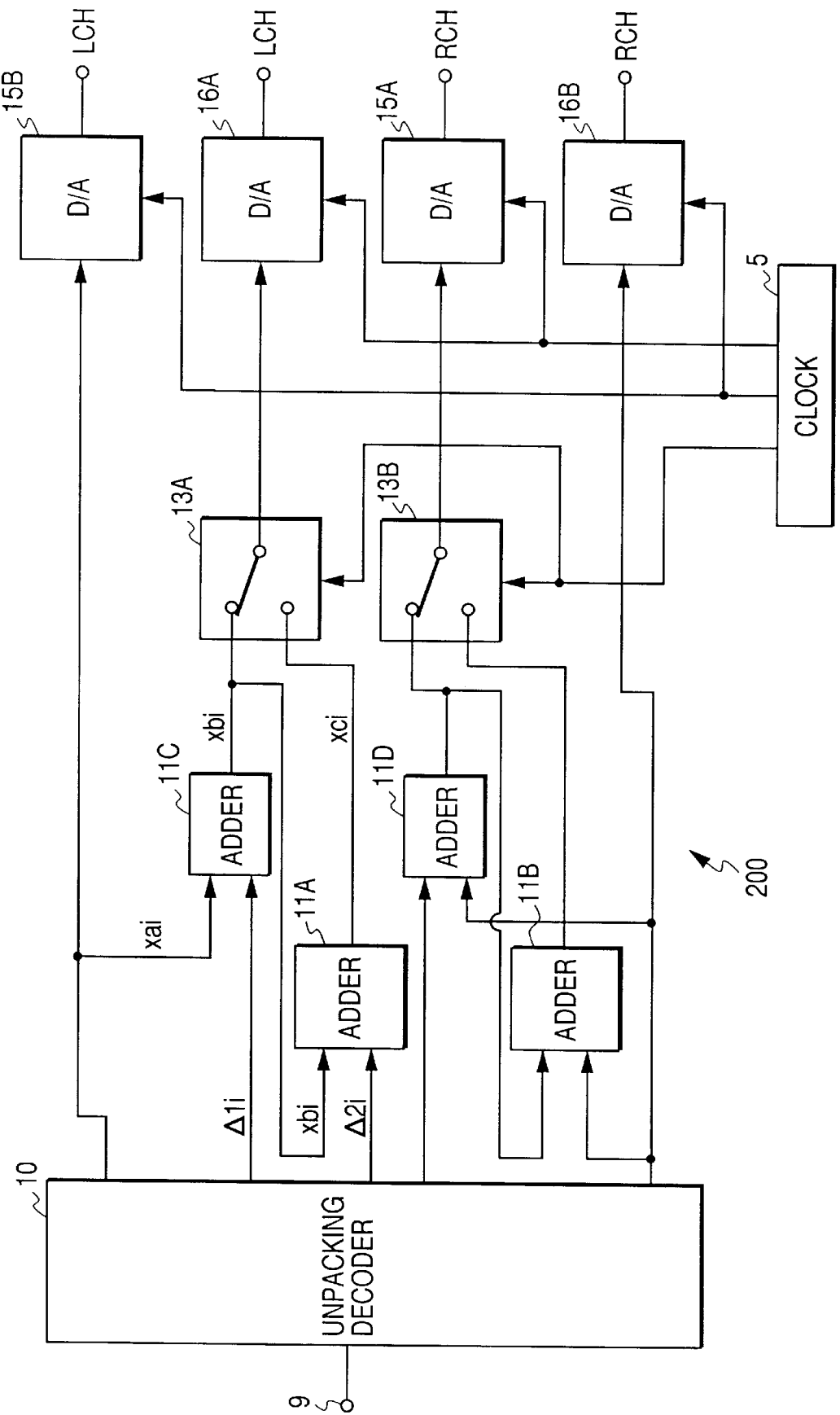
FIG. 12 is a block diagram which shows a decoding apparatus according to the eighth embodiment of the invention.

FIG. 12 shows a decoding apparatus 200 according to the eighth embodiment of the invention which is designed to decode a signal digitized by the encoding apparatus 100 of the seventh embodiment, as shown in FIG. 11. The decoding apparatus 200 of this embodiment includes L and R channel circuits each identical with each other. Each of the L and R channel circuits adds the second difference code $\Delta 2i$ to a data code xbi decoded through the adder 11C (or 11D) by adding the first difference code $\Delta 1i$ to a data code xai which is digitized at a given sampling frequency by the encoding apparatus of, for example, the seventh embodiment, as shown in FIG. 11, and which is unpacked by the unpacking decoder 10 to provide a data code xci to the switch 13A. The switch 13A selectively arranges the data code xbi and the data code xci to produce a data stream of xbi and xci.

An encoding apparatus 100 according to the ninth embodiment of the invention will be discussed below with reference to FIG. 1.

The A/D converter 2 converts an input signal at a sampling frequency of, for example, 48 kHz according to a clock signal from the clock generator 5 into a data stream of xa1, xa2, xa3, . . . , xai, . . . . Similarly, the A/D converter 3 converts an input signal at a sampling frequency of, for example, 96 kHz that is twice the sampling frequency of the A/D converter 2 according to the clock signal from the clock generator 5 into a data stream of xb1, xc1, xb2, xc2, . . . , xbi, xci, . . . .

These conversions into data streams are achieved in a resolution of 24 bits.

The switch 4 selects a data stream of xb1, xb2, . . . , xbi, . . . and provides it to the difference calculator 6. The difference calculator 6 determines a difference between xbi and xai (=xbi−xai) to provide a difference code $\Delta i$ which is expressed in the packing encoder 7 as a 12-bit normalized scaled data code.

The packing encoder 7 receives the data code xai supplied directly from the A/D converter 2 and the difference code $\Delta i$ and packs them to provide a user data code, as shown in FIG. 3, to the output terminal 8. When the user data code is represented with 2034 bytes, the number of data codes xai is 450, and the number of the difference codes $\Delta i$ is also 450. A subheader is represented by 7 bytes three of which are used to express a peak value Spj (j indicates a frame) as a scaling factor for each frame of the difference codes $\Delta i$ to be scaled. The peak value Spk is determined by a maximum value of the difference codes $\Delta i$ in each frame.

Figure 14:
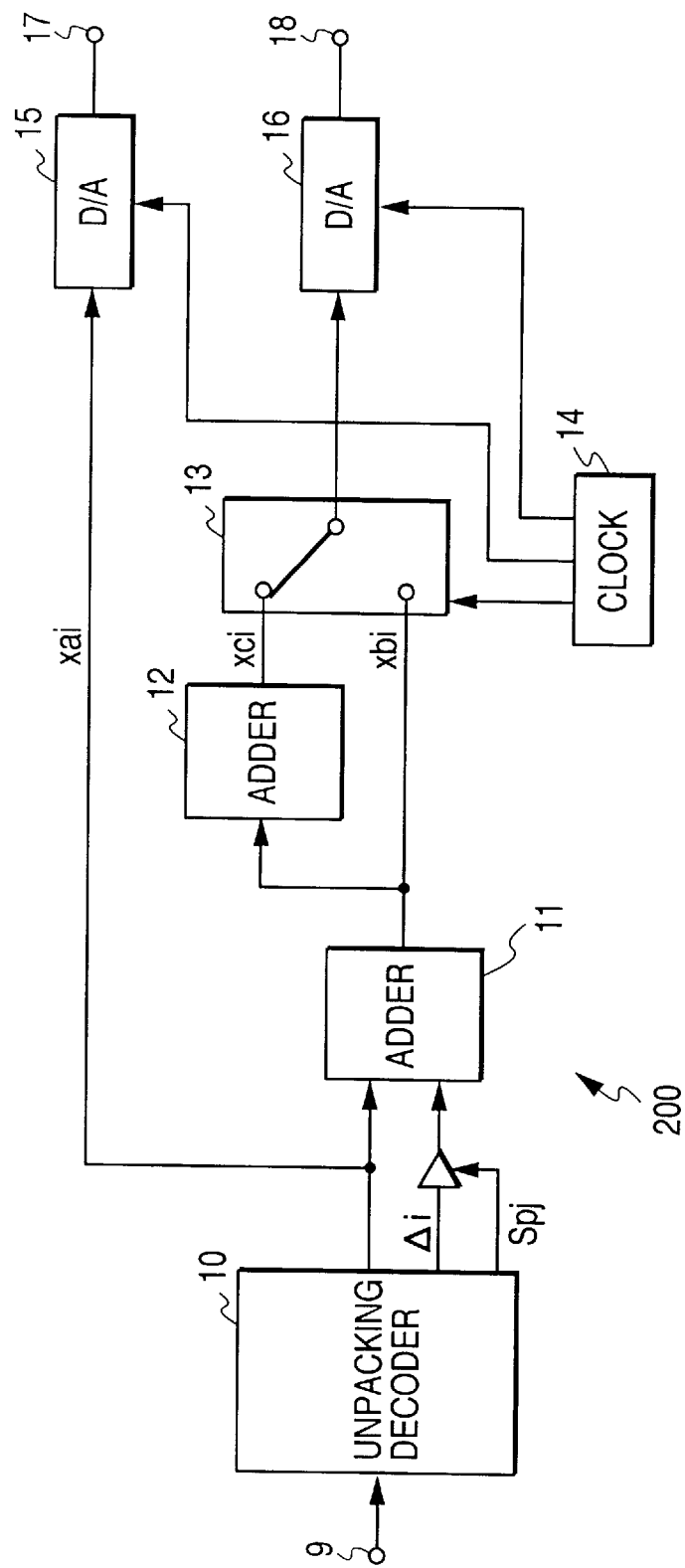
FIG. 14 is a block diagram which shows a decoding apparatus according to the tenth embodiment of the invention.

FIG. 14 shows a decoding apparatus 200 according to the tenth embodiment of the invention which is a modification of the one shown in FIG. 8 and which is designed to decode a signal digitized by the encoding apparatus 100 of the ninth embodiment.

The adder 11 determines a data code xbi by summing the product of $\Delta 1i$ and the peak value Spj and xai (i.e., $\Delta 1i$ ·Spj+xai=xbi) based on an output from the unpacking decoder 10. Note that j indicates a natural number, and each code xbi is expressed by 24 bits.

The interpolator 12 determines data codes xc1, xc2, ..., xci, ... between samples (i.e., the data codes xbi). For example, the interpolation of the data codes xbi may be achieved by setting the data codes xci to zeros (0s) using the so-called up sampling technique and passing them through a low-pass filter.

The switch 13 selects outputs from the adder 11 and the interpolator 12 in sequence to produce a data stream of xb1, xc1, ..., xbi, xci, .... The D/A converter 16 converts the output from the switch 13 into an analog signal and outputs it through the output terminal 18. A data stream of xai sampled at a given sampling frequency by the unpacking decoder 10 is supplied directly to the D/A converter 15. The D/A converter 15 converts the input into an analog signal with an accuracy of 24 bits and outputs it through the output terminal 17.

An encoding apparatus 100 according to the eleventh embodiment of the invention will be described below with reference to FIG. 9.

An input signal appearing at the input terminal 1 is sampled at a given sampling frequency and a double sampling frequency to produce data streams of codes having the waveforms, as shown in FIG. 2.

Specifically, the A/D converter 2 converts the input signal at a sampling frequency of, for example, 48 kHz according to a clock signal from the clock generator 5 into a data stream of xa1, xa2, xa3, ..., xai, .... Similarly, the A/D converter 3 converts the input signal at a sampling frequency of, for example, 96 kHz that is twice the sampling frequency of the A/D converter 2 according to the clock signal from the clock generator 5 into a data stream of xb1, xc1, xb2, xc2, ..., xbi, xci, .... These conversions into the data streams are achieved in a resolution of 24 bits.

The switch 4 selectively establishes communications between the A/D converter 3 and the difference calculator 6A and between the A/D converter 3 and the difference calculator 6B to supply a data stream of xb1, xb2, ..., xbi, ... to the difference calculator 6A and a data stream of xc1, xc2, ..., xci, ... to the difference calculator 6B, respectively. The difference calculator 6A determines differences between xbi and xai to provide difference codes $\Delta 1i$ (=xbi−xai) each of which is expressed in the packing encoder 7 as an 8-bit normalized scaled data code. Similarly, the difference calculator 6B determines differences between xci and xai to provide difference codes $\Delta 2i$ (=xci−xai) each of which is expressed in the packing encoder 7 as an 8-bit normalized scaled data code.

The packing encoder 7 receives the data code xai supplied directly from the A/D converter 2 and the difference codes $\Delta 1i$ and $\Delta 2i$ supplied from the difference calculators 6A and 6B and packs them to provide the user data code, as shown in FIG. 3, to the output terminal 8. When the user data code is represented with 2034 bytes, the number of data codes xai is 405, and the number of each of the difference codes $\Delta 1i$ and $\Delta 2i$ is also 405. A subheader is represented with 9 bytes three of which are used to express the peak value Sp1j of the difference codes $\Delta 1i$ to be scaled and other three of which are used to express the peak value Sp2j of the difference codes $\Delta 2i$ to be scaled.

Figure 15:
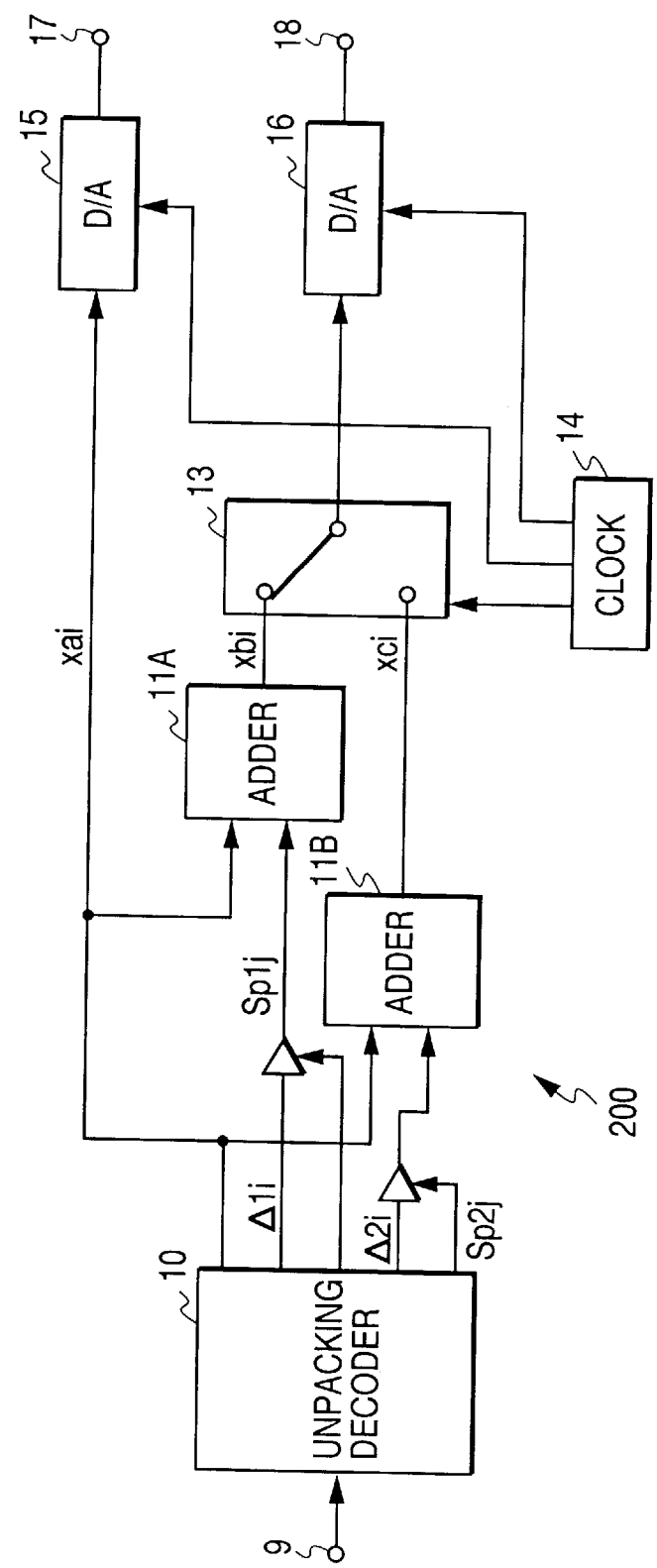
FIG. 15 is a block diagram which shows a decoding apparatus according to the twelfth embodiment of the invention.

FIG. 15 shows an decoding apparatus 200 according to the twelfth embodiment of the invention which is designed to convert a signal digitized by the encoding apparatus 100 of the eleventh embodiment into an analog signal, as shown in FIG. 5.

The adder 11A determines a data code xbi which is expressed with 24 bits by summing the product of $\Delta 1i$ and the peak value Sp1j and xai (i.e., $\Delta 1i$ ·Sp1j+xai=xbi) based on an output from the unpacking decoder 10. Similarly, the adder 11B determines a data code xci by summing the product of $\Delta 2i$ and the peak value Sp2j and xai (i.e., $\Delta 2i$ ·Sp2j+xai=xci) based on an output from the unpacking decoder 10.

The switch 13 selectively establishes communications between the adder 11A and the D/A converter 16 and between the adder 11B and the D/A converter 16 to provide a data stream of xb1, xc1, ..., xbi, xci, ... to the D/A converter 16. The D/A converter 16 converts the output from the switch 13 into an analog signal and outputs it through the output terminal 18. A data stream of xai sampled at a given sampling frequency by the unpacking decoder 10 is supplied directly to the D/A converter 15. The D/A converter 15 converts the input into an analog signal with an accuracy of 24 bits and outputs it through the output terminal 17.

An encoding apparatus 200 according to the thirteenth embodiment of the invention will be described below with reference to FIG. 11.

Stereo signals entering input terminals 1L and 1R are sampled by the A/D converters 2, 12, 3, and 13 at a given sampling frequency and a double sampling frequency, as shown in FIG. 2. The following discussion will refer only to the L channel circuit for the sake of simplicity of explanation.

The L-channel signal inputted to the input terminal 1L is converted by the A/D converter 2 at a sampling frequency of, for example, 48 kHz according to a clock signal from the clock generator 5 into a data stream of xa1, xa2, xa3, ..., xai, ... each expressed by 24 bits and also converted by the A/D converter 3 at a sampling frequency of 96 kHz that is twice the sampling frequency of the A/D converter 2 according to the clock signal from the clock generator 5 into a data stream of xb1, xc1, xb2, xc2, ..., xbi, ... each expressed by 24 bits.

The switch 4 selects a data stream of xb1, xb2, ..., xbi, ... and provides it to the difference calculator 6A. The difference calculator 6A determines a difference between xbi and xai to provide a difference code $\Delta 1i$ (=xbi−xai) which is expressed in the packing encoder 8 by a normalized value of 6 bits or less on average. The switch 4 also selects a data stream of xc1, xc2, ..., xci, ... and provides it to the difference calculator 6B. The difference calculator 6B determines a difference between xci and xai to provide a difference code $\Delta 2i$ (=xci−xai) which is expressed in the packing encoder 8 by a normalized value of 6 bits or less on average. The normalization is made on the peak value PL that is a maximum value of the differences $\Delta 1i$ and $\Delta 2i$. At the R-channel, the normalization is made on the peak value PR.

The packing encoder 7 receives the data codes xai supplied directly from the A/D converters 2 and 12, the difference codes $\Delta 1i$ and $\Delta 2i$ supplied from the difference calculators 6A to 16B and packs them to provide the user data code, as shown in FIG. 7, to the output terminal 8. When the user data code is represented with 2034 bytes, the number of data codes xai at the L channel is 225, the number of data codes xai at the R channel is 225, and the number of each of the difference codes $\Delta 1i$ and $\Delta 2i$ is also 225. A subheader is represented with 9 bytes. Specifically, each of the difference codes $\Delta 1i$ and $\Delta 2i$ is arranged as a third channel following a pair of L and R channel data codes and consists of 6 higher order bits for the L-channel and 6 lower order bits for the R-channel.

Figure 16:
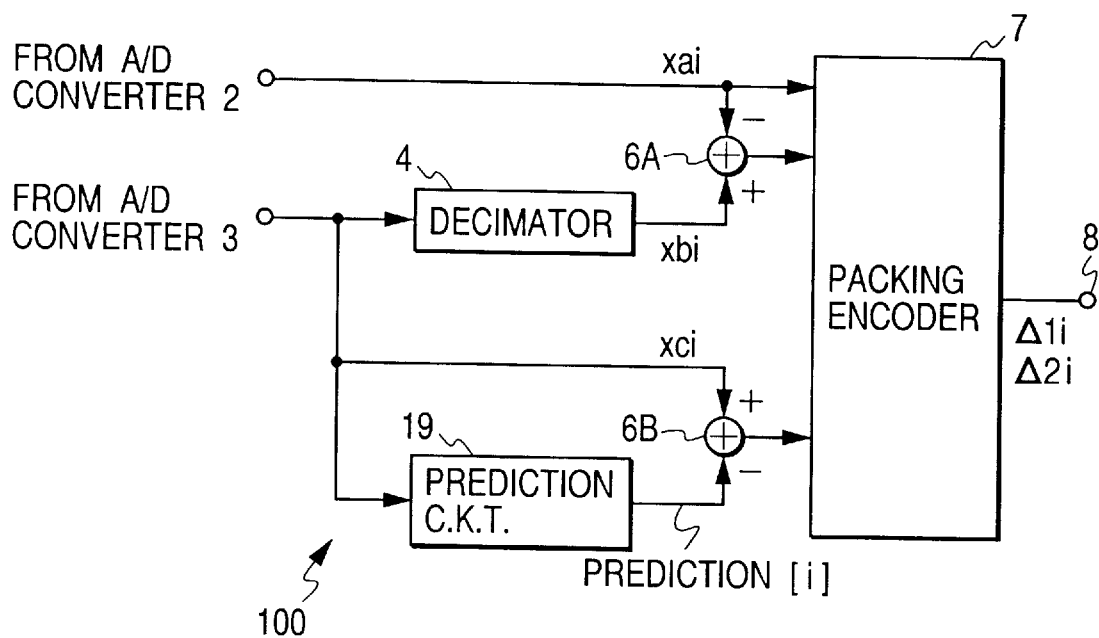
FIG. 16 is a partial block diagram which shows an encoding apparatus according to the fourteenth embodiment of the invention.

FIG. 16 shows an encoding apparatus 100 according to the fourteenth embodiment of the invention which is different from the above embodiments using the two difference codes $\Delta 1i$ and $\Delta 2i$ in that the second difference code $\Delta 2i$ is determined by the relation of xci−Prediction [i]=$\Delta 2i$ where xai−Prediction [i] is an N-order linear predicted value. When N=3, Prediction [i] is expressed by $$\text{Prediction } [i]=A1 \cdot xc(i-1)+A2 \cdot xbi+A3 \cdot xb(i+1)$$

where A1, A2, and A3 are prediction factors.

Specifically, Prediction [i] may be projected as points lying on a curve extending through three points xa(i−1), xbi, and xa(i+1). Such linear prediction is performed by a linear prediction circuit 19. An output from the A/D converter 2 is supplied directly to the packing encoder 7. A signal sampled by the A/D converter 3 at a high sampling frequency, as much as 192 kHz, is supplied to the packing encoder 7 through a decimator 4.

Figure 17:
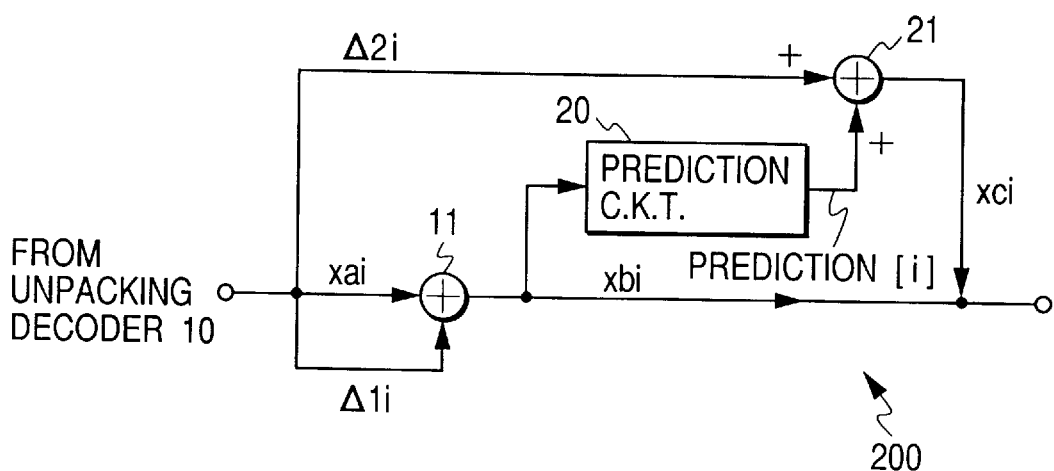
FIG. 17 is a partial block diagram which shows a decoding apparatus according to the fifteenth embodiment of the invention.

FIG. 17 shows a decoding apparatus 200 according to the fifteenth embodiment of the invention which is different from the above embodiments using the two difference codes $\Delta 1i$ and $\Delta 2i$ in that the adder 21 adds $\Delta 2i$ and Prediction [i] to determine xai (i.e., $\Delta 2i$ +Prediction [i]=xci). Prediction [i] is an N-order liner predicted value. When N=3, Predication [i] is expressed by $$\text{Prediction } [i]=A1 \cdot xc(i-1)+A2 \cdot xbi+A3 \cdot xb(i+1)$$

wherein A1, A2, and A3 are prediction factors.

Specifically, Prediction [i] may be projected as points lying on a curve extending through three points xc(i−1), xbi, and xb(i+1). Such linear prediction is performed by a linear prediction circuit 20. The circuit shown in FIG. 17 is disposed following the unpacking decoder 10. The data code xai is converted into analog signal at 96 kHz.

Figure 18:
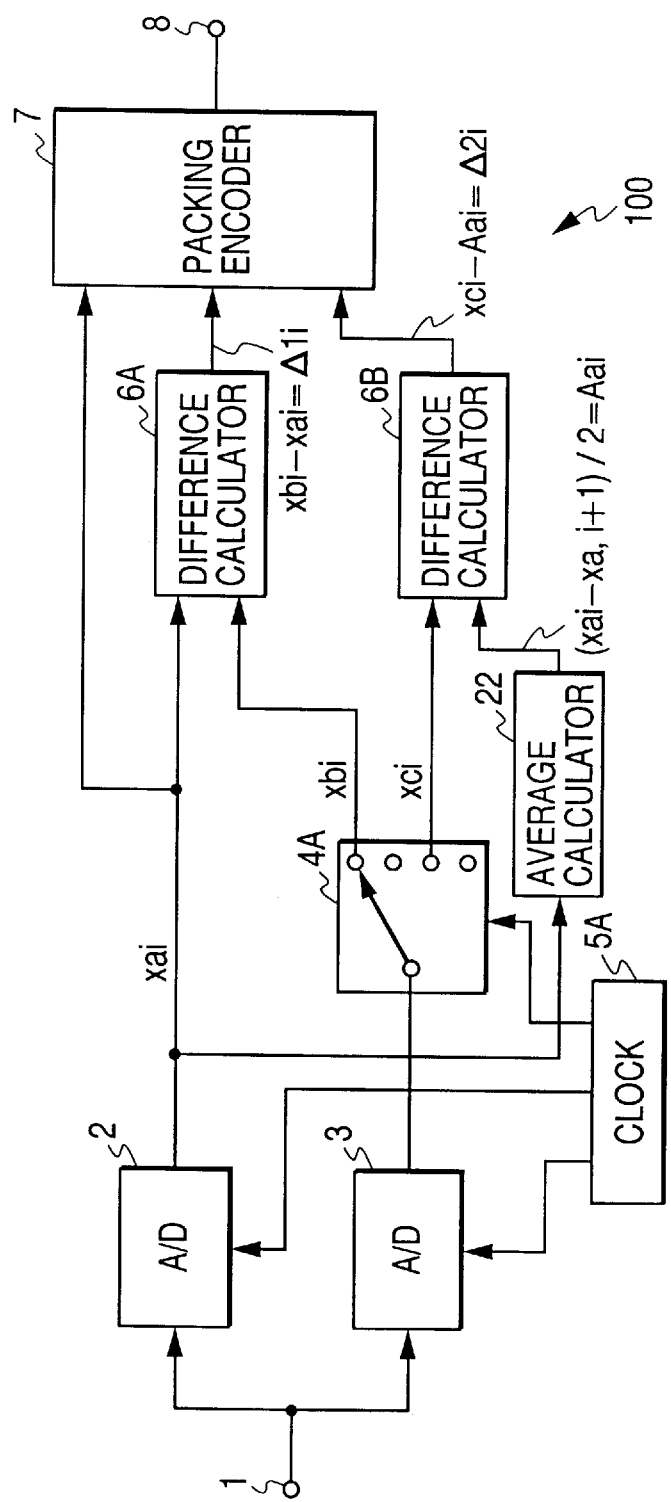
FIG. 18 is a block diagram which shows an encoding apparatus according to the sixteenth embodiment of the invention.
Figure 19:
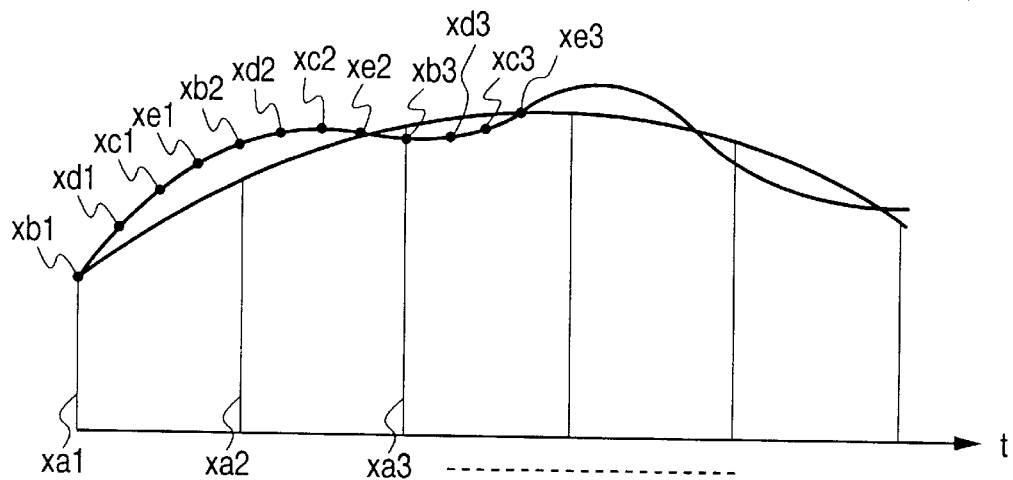
FIG. 19 is an illustration which shows waveforms of signals A/D-converted by the encoding apparatus shown in FIG. 18.

FIG. 18 shows an encoding apparatus 100 according to the sixteenth embodiment of the invention. A signal inputted to the input terminal 1 is sampled at a given sampling frequency and a quadruple sampling frequency to produce streams of data codes having the waveforms, as shown in FIG. 19.

Specifically, the A/D converter 2 converts the input signal at a sampling frequency of, for example, 48 kHz according to a clock signal from the clock generator 5A into a data stream of xa1, xa2, xa3, . . . , xai, . . . (i=a natural number indicating a sampling number), as shown in FIG. 19. At the same time, the A/D converter 3 converts the input signal at a sampling frequency of, for example, 192 kHz that is four times the sampling frequency of the A/D converter 2 according to the clock signal from the clock generator 5A into a data stream of xb1, xd1, xc1, xe1, xb2, xd2, xc2, xe2, . . . , xbi, xdi, xci, xei, . . . , as shown in FIG. 19. These conversions into the data streams are achieved in a resolution of 24 bits.

The switch 4 provides data codes xb1, xb2, . . . , xbi, . . . to the difference calculator 6A and data codes xc1, xc2, . . . , xci, . . . to the difference calculator 6B. The difference calculator 6A determines a difference between xbi and xai to provide a difference code $\Delta 1i$ (=xbi−xai) which is expressed with 12 bits or less. The output from the A/D converter 2 is also supplied to an average calculator 22 to determine an average Aai of consecutive two of data codes (i.e., (xai+xa(i+1))/2).

The difference calculator 6B determines a difference between xci and Aai (=(xai+xa(i+1))/2) to provide a difference code $\Delta 2i$ which is expressed with 12 bits or less. In this embodiment, the difference code $\Delta 2i$ (=xci−Aai) is determined using the average Aai of consecutive two of the data codes xai as a reference value, however, may alternatively be determined based on a function of consecutive two of data codes xai, either of the consecutive two of the data codes xai, or a function thereof.

Figure 20:
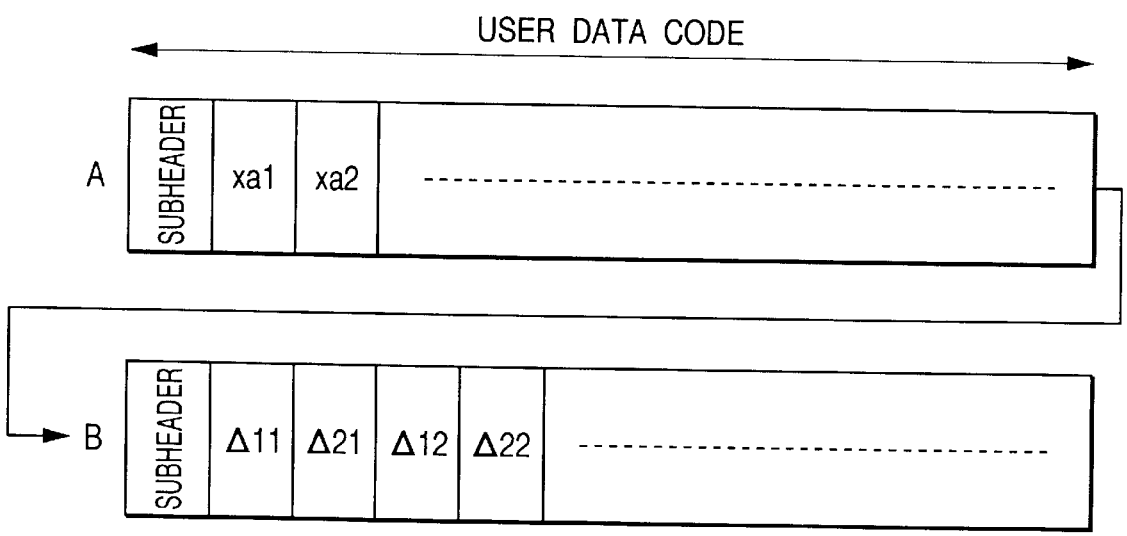
FIG. 20 is an illustration which shows a user data code produced by the encoding apparatus in FIG. 18.

The packing encoder 7 receives the data code xai from the A/D converter 2 and the difference codes $\Delta 1i$ and $\Delta 2i$ from the difference calculators 6A and 6B and packs them to provide a series of user data codes A and B, as shown in FIG. 20, to an output terminal 8. When each of the user data codes A and B is represented with 2034 bytes, the number of data codes xai is 677, and the number of each of the difference codes $\Delta 1i$ and $\Delta 2i$ is also 677. A subheader is represented with 3 bytes. Note that in a DVD, the user data code is referred to as a packet, and the subheader is referred to as a packet header.

Figure 21:
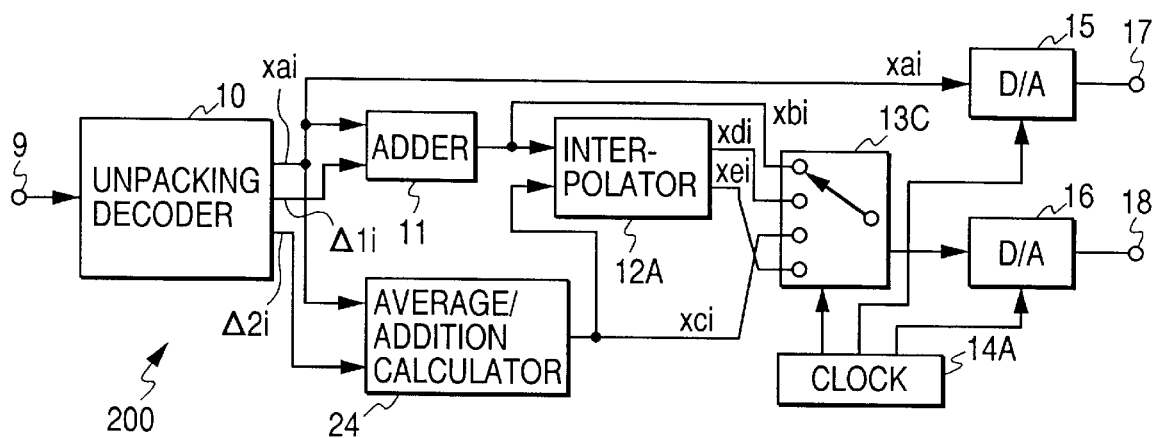
FIG. 21 is a block diagram which shows a decoding apparatus according to the seventeenth embodiment of the invention.
Figure 22:
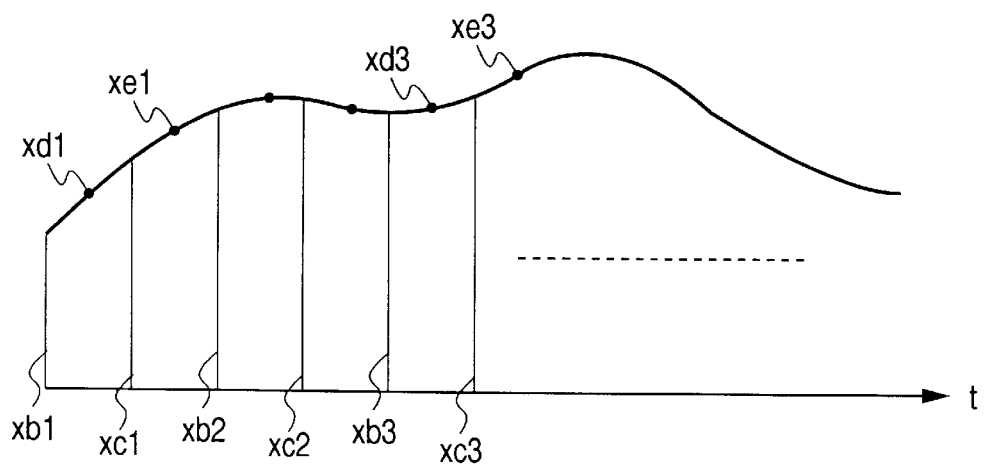
FIG. 22 is an illustration which shows a waveform of a signal D/A-converted by the decoding apparatus shown in FIG. 21.

FIG. 21 shows a decoding apparatus 200 according to the seventeenth embodiment of the invention which is designed to D/A convert an input signal into an analog signal having the waveform, as shown in FIG. 22.

Specifically, the input signal is unpacked by the unpacking decoder 10 to produce data codes xai, $\Delta 1i$, and $\Delta 2i$. The adder 11 performs a mathematical operation of $\Delta i+xai=xbi$ to output a data code xbi represented with 24 bits. The average/addition circuit 24 performs an operation of $\Delta 2i$ +(xai+xa(i+1))/2 =xci to produce a data code xci expressed with 24 bits.

The interpolator 12A determines data codes xd1, xe1, xd2, xe2, . . . , xdi, xei, . . . , as shown in FIG. 21, between samples (i.e., the data codes xbi and xci). For example, the interpolation of these data codes may be achieved by setting the data codes xbi and xci to zeros (0s) using the so-called up sampling technique and passing them through a low-pass filter. The switch 13C receives the outputs from the adder 11, the average/addition circuit 24, and the interpolator 12A to produce a data stream of xb1, xd1, xc1, xe1, . . . , xbi, xdi, xci, xei, . . . . The D/A converter 16 converts the output from the switch 13 into an analog signal at a sampling frequency that is four times that of the D/A converter 15 and outputs it through the output terminal 18. A data code xai is supplied from the unpacking decoder 10 directly to the D/A converter 15. The D/A converter 15 converts the input into an analog signal with an accuracy of 24 bits and outputs it through the output terminal 17.

An encoding apparatus 100 according to the eighteenth embodiment of the invention will be described below which is a combination of the ones, as shown in FIGS. 6 and 18.

Specifically, the R and L channel circuits, as shown in FIG. 6, are connected to the packing encoder 7, as shown in FIG. 18. Each of signals inputted to the input terminals 1L and 1R is sampled at a given sampling frequency and a quadruple sampling frequency to produce streams of data codes having the waveforms, as shown in FIG. 18.

In practice, the A/D converter 2 converts the input signal at a sampling frequency of, for example, 48 kHz according to a clock signal from the clock generator 5A into a data stream of xa1, xa2, xa3, . . . , xa1, . . . . At the same time, the A/D converter 3 converts the input signal at a sampling frequency of, for example, 192 kHz that is four times the sampling frequency of the A/D converter 2 according to the clock signal from the clock generator 5A into a data stream of xb1, xd1, xc1, xe1, xb2, xd2, xc2, xe2, . . . , xbi, xdi, xci, xei, . . . . These conversions into the data streams are achieved in a resolution of 24 bits.

The switch 4A provides data codes xb1, xb2, . . . . , xbi, . . . to the difference calculator 6A and data codes xc1, xc2, . . . , xci, . . . to the difference calculator 6B. The difference calculator 6A determines a difference between xbi and xai to provide a difference code $\Delta i$ (=xbi−xai) which is expressed with 6 bits or less. The output from the A/D converter 2 is also supplied to the average calculator 22 to determine an average Aai of consecutive two of data codes (i.e., (xai +xa(i+1))/2). The difference calculator 6B determines a difference between xci and Aai (=(xai+xa(i+1))/2) to provide a difference code $\Delta 2i$ (=xci−Aai) which is expressed with 6 bits or less.

Figure 23:
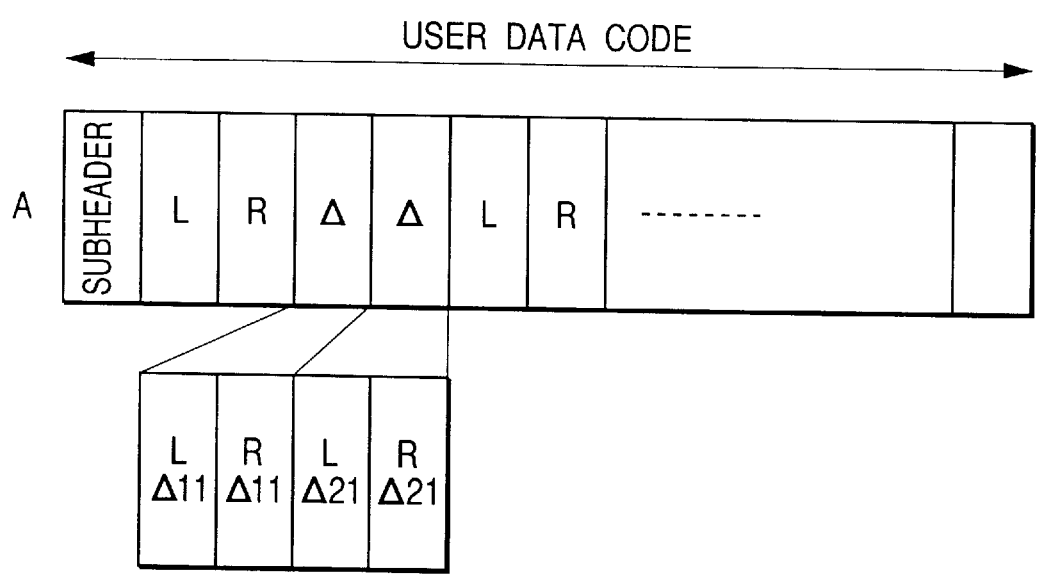
FIG. 23 is an illustration which shows a user data code produced by an encoding apparatus according to the eighteenth embodiment of the invention.

The packing encoder 7 receives the data code xai from the A/D converter 2 and the difference codes $\Delta 1i$ and $\Delta 2i$ from the difference calculators 6A and 6B and packs them to provide a user data code, as shown in FIG. 23, to the output terminal 8. When the user data code is represented with 2034 bytes, the number of data codes xai at each of the R and L channels is 225, and the number of each of the difference codes $\Delta 1i$ and $\Delta 2i$ at one of the L and R channels is also 225. A subheader is represented with 9 bytes. Specifically, each of the difference codes $\Delta 1i$ and $\Delta 2i$ which is expressed with 12 bits is provided both for the R and L channels and used as a third channel code.

A decoding apparatus 200 according to the nineteenth embodiment of the invention will be described below which includes the same circuit structure as shown in FIG. 21 for each of R and L channels. The decoding apparatus of this embodiment is designed to D/A convert at a given sampling frequency and a quadruple sampling frequency R and L channels signals provided by the encoding apparatus 100 of the eighteenth embodiment, as described above, into an analog signal having the waveform shown in FIG. 22. Other arrangements are substantially the same as those described in the above embodiments, and explanation thereof in detail will be omitted here.

Figure 24:
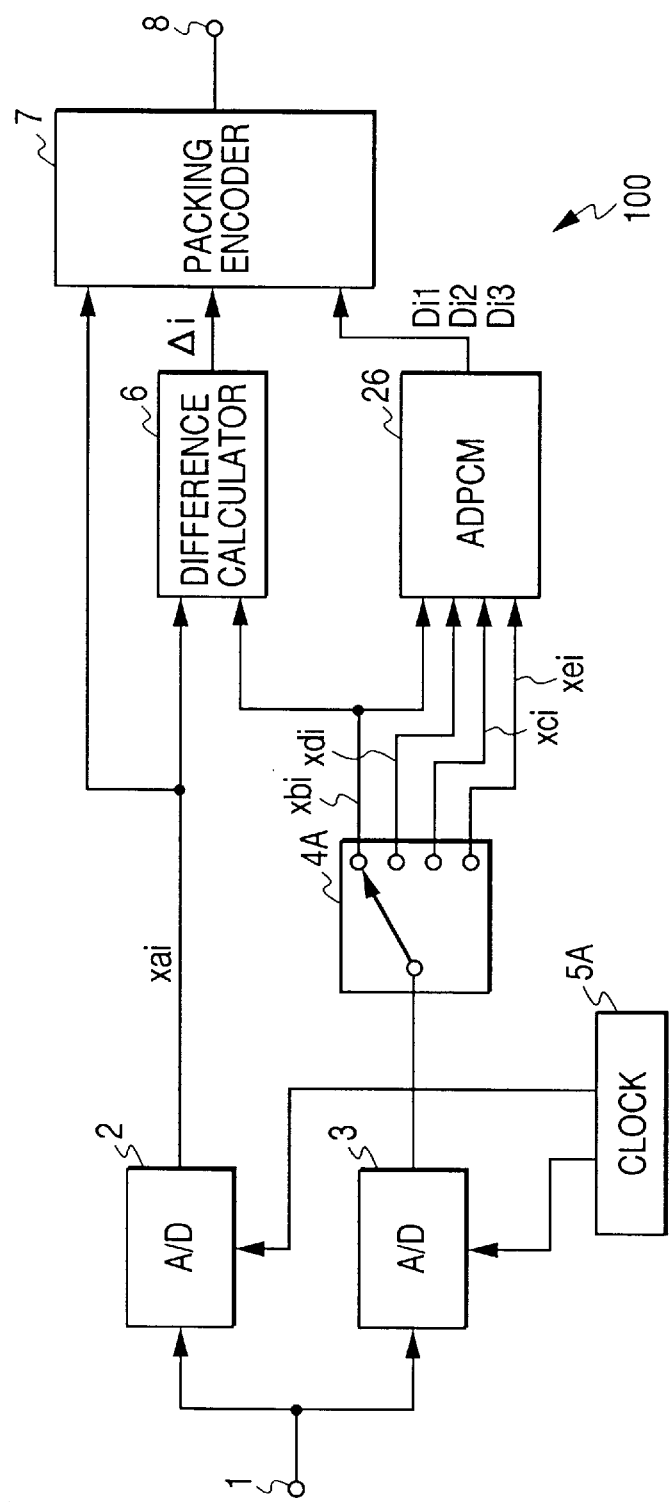
FIG. 24 is a block diagram which shows an encoding apparatus according to the twentieth embodiment of the invention.

FIG. 24 shows an encoding apparatus 100 according to the twentieth embodiment of the invention.

A signal inputted to the input terminal 1 is sampled at a given sampling frequency and a quadruple sampling frequency to produce streams of data codes having the waveforms, as shown in FIG. 22.

Specifically, the A/D converter 2 converts the input signal at a sampling frequency of, for example, 48 kHz according to a clock signal from the clock generator 5 into a data stream of xa1, xa2, xa3, . . . , xa1, . . . (i=a natural number indicating a sampling number). At the same time, the A/D converter 3 converts the input signal at a sampling frequency of, for example, 192 kHz that is four times that of the A/D converter 2 according to the clock signal from the clock generator 5 into a data stream of xb1, xd1, xc1, xe1, xb2, xd2, xc2, xe2, . . . , xbi, xdi, xci, xei, . . . . These conversions into the data streams are achieved in a resolution of 20 bits.

The switch 4A separates data codes xbi, xdi, xci, and xei from the output from the A/D converter 3. The difference calculator 6 determines a difference between xbi and xai (=xbi−xai) to provide a difference code $\Delta i$ which is expressed with 11 bits or less. The ADPCM circuit 26 receives the data codes xbi, xdi, xci, and xei to determine three difference codes below.

xdi−xbi=Di1
xci−xdi=Di2
xei−xci=Di3 which will generally be referred to as an ADPCM code Dik hereinafter and which is expressed with 3 bits or less.

Figure 25:
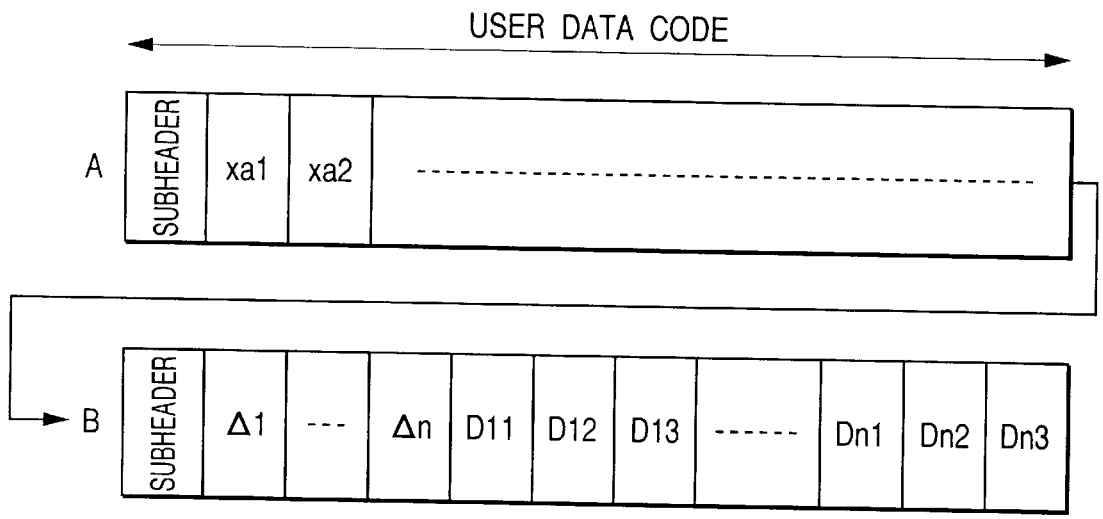
FIG. 25 is an illustration which shows user data codes produced by the encoding apparatus in FIG. 24.

The packing encoder 7 receives the data code xai, the difference code $\Delta i$, and the ADPCM code Dik and packs them to produce a series of user data codes A and B, as shown in FIG. 25. When each of the user data codes A and B is represented with 2034 bytes, the number of data codes xai is 812, and the number of each of the difference codes $\Delta i$ and ADPCM codes is also 812. A subheader is represented with 4 bytes. Note that in a DVD, the user data code is referred to as a packet, and the subheader is referred to as a packet header.

Figure 26:
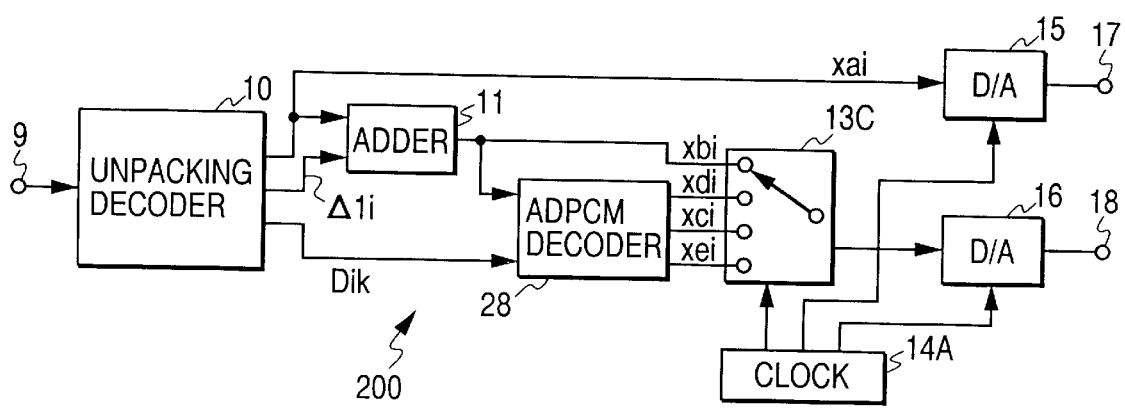
FIG. 26 is a block diagram which shows a decoding apparatus according to the twenty-first embodiment of the invention.

FIG. 26 shows a decoding apparatus 200 according to the twenty-first embodiment of the invention which is designed to D/A convert an input signal digitized by the encoding apparatus 100 of the twentieth embodiment at a given sampling frequency and a quadruple sampling frequency into an analog signal having the waveform, as shown in FIG. 22.

Specifically, the input signal is unpacked by the unpacking decoder 10 to produce data codes xai, $\Delta i$, and Dik. The adder 11 performs a mathematical operation of $\Delta i$+xai=xbi to output a data code xbi represented with 20 bits.

The data codes Dik and xbi from the unpacking decoder 10 and the adder 11 are inputted to the ADPCM decoder 28. The ADPCM decoder 28 determines data codes xdi, xci, xei, . . . between samples using the data codes Dik and xbi. The switch 13C receives the outputs from the adder 11 and the ADPCM decoder 28 and combines in a given order them to produce a data stream of xb1, xd1, xc1, xe1, . . . , xbi, xdi, xci, xei, . . . . The D/A converter 16 converts the output from the switch 13C into an analog signal at a sampling frequency that is four times that of the D/A converter 15 and outputs it through the output terminal 18. A data code xai is supplied from the unpacking decoder 10 directly to the D/A converter 15. The D/A converter 15 converts the input into an analog signal with an accuracy of 20 bits and outputs it through the output terminal 17.

Figure 27:
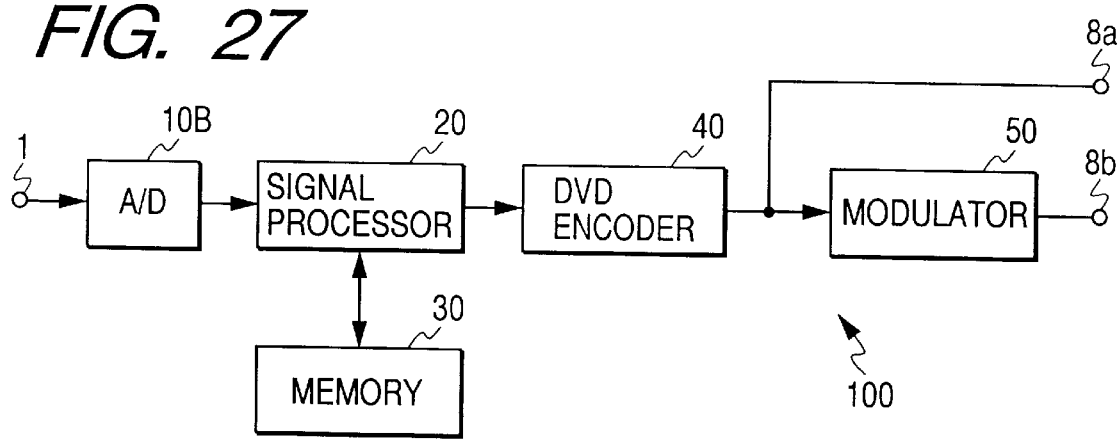
FIG. 27 is a block diagram which shows an encoding apparatus according to the twenty-second embodiment of the invention.

FIG. 27 shows an encoding apparatus 100 according to the twenty-second embodiment of the invention which includes an A/D converter 10B, a signal processing circuit 20, a memory 30, a DVD encoding circuit 40, and a modulator 50.

Figure 29:
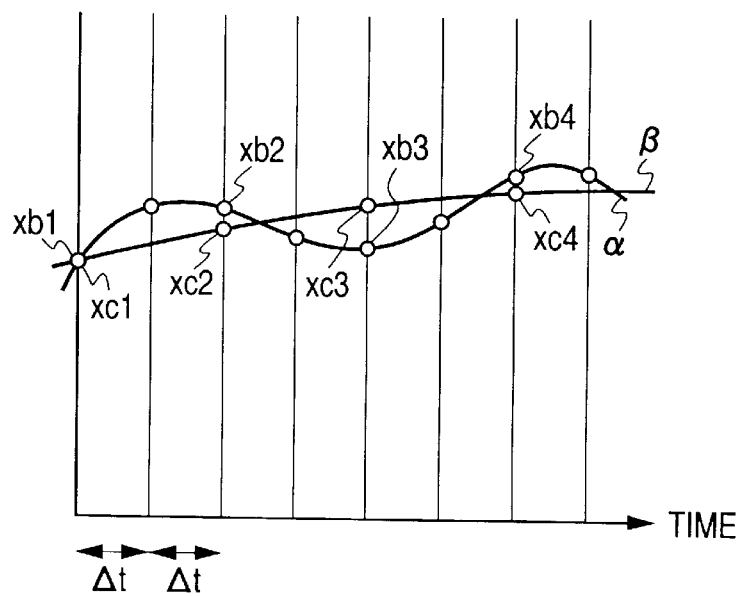
FIG. 29 is an illustration which shows waveforms of signals A/D-converted by the encoding apparatus in FIG. 27.

The encoding apparatus 100 is designed to sample an input signal appearing at the input terminal 1 at time intervals $\Delta t$ (e.g., 96 kHz) to produce streams of data codes having waveforms, as shown in FIG. 29.

Specifically, the A/D converter 10B converts the input signal at a sampling frequency of, for example, 96 kHz into PCM signals forming a data stream of xb1, . , xb2, . , xb3, . , . . . each represented with 24 bits and outputs them to the signal processing circuit 20. The signal processing circuit 20 compresses the input data stream using the memory 30 which is, in turn, packed by the DVD encoding circuit 40. The packed data is supplied to the output terminal 8a and the modulator 50. An output signal from the output terminal 8b modulated by the modulator 50 is recorded on a record carrier, for example.

Figure 28:
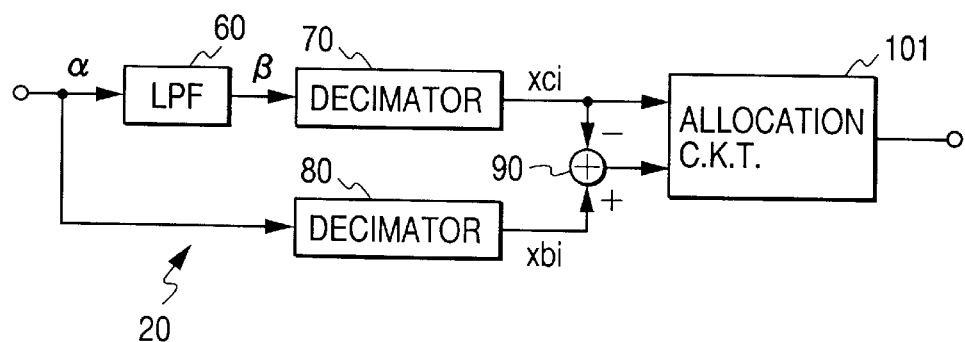
FIG. 28 is a block diagram which shows a circuit structure of a signal processing circuit of the encoding apparatus in FIG. 27.

The signal processing circuit 20 includes, as shown in FIG. 28, a low-pass filter 60, decimators 70 and 80, a difference calculator 90, and an allocation circuit 101.

The low-pass filter 60 includes an FIR filter allowing an input signal to pass therethrough within a ½ band to produce data codes xc1, . , xc2, . , xc3, . , . . . on a curve β, as shown in FIG. 29 (data codes on a curve α are signals before passing through the filter 60). The decimator 70 removes signals between adjacent two of the data codes xci to produce a data stream of xc1, xc2, xc3, . . . . Similarly, the decimator 80 removes signals between adjacent two of the data codes xbi outputted from the A/D converter 10B to produce a data stream of xb1, xb2, xb3, . . . . Specifically, the decimators 70 and 80 bring outputs thereof into agreement with each other in time sequence. The difference calculator 90 includes an adder circuit and determines a difference (i.e., a difference code $\Delta i$) between the outputs from the decimators 70 and 80 according to the equation of xbi−xci=$\Delta i$ where i indicates a sampling number. The difference code $\Delta i$ is expressed with 12 bits or less which may have either of a fixed and a variable length.

The allocation circuit 101 receives the data code xci and the difference code $\Delta i$ from the decimator 70 and the difference calculator 90 and packs them in a given order to produce a user data code (referred to as a packet in a DVD). When the user data code is represented with 2034 bytes, the number of data codes xci is 450, and the number of the difference codes $\Delta i$ is also 450. A subheader is represented with 9 bytes.

Figure 30:
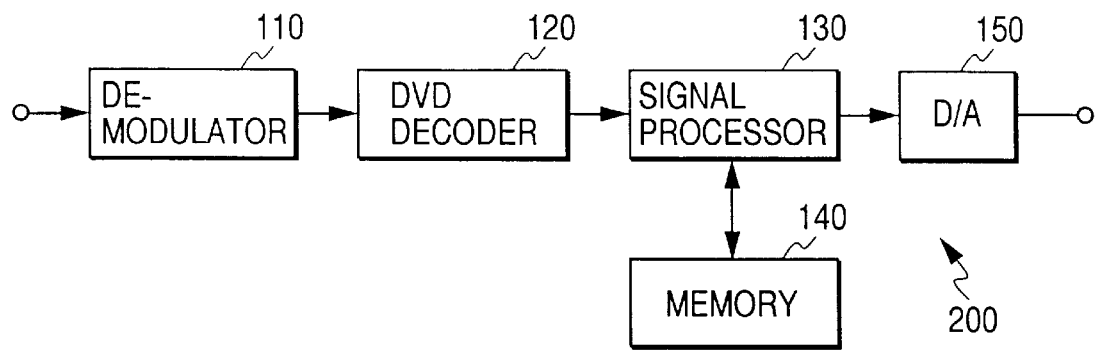
FIG. 30 is a block diagram which shows a decoding apparatus according to the twenty-third embodiment of the invention.
Figure 32:
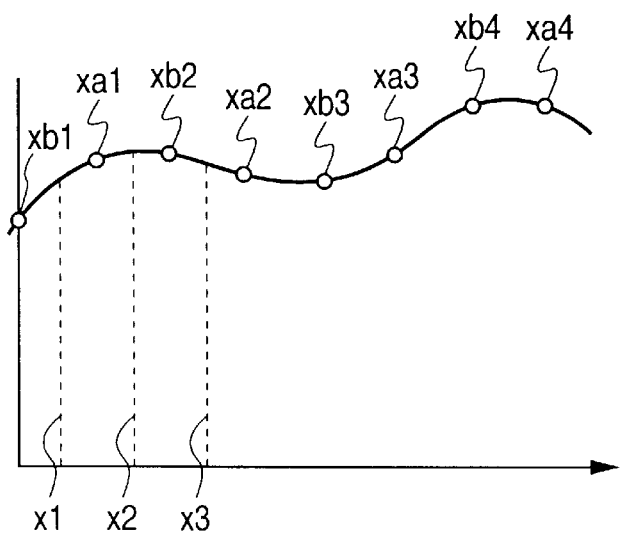
FIG. 32 is an illustration which shows a waveform of a signal D/A-converted by the decoding apparatus shown in FIG. 30.

FIG. 30 shows a decoding apparatus 200 according to the twenty-third embodiment of the invention which is designed to decode an input signal into a signal having a waveform, as shown in FIG. 32.

The decoding apparatus 200 includes a demodulator 110, a DVD decoder 120, a signal processing circuit 130, a memory 140, and a D/A converter 150.

The input signal is demodulated by the demodulator 110, unpacked by the DVD decoder 120, and outputted to the signal processing circuit 130.

Figure 31:
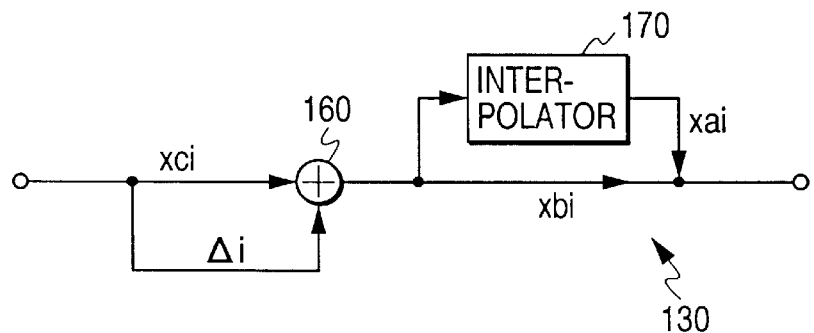
FIG. 31 is a block diagram which shows a signal processing circuit of the decoding apparatus in FIG. 30.

The signal processing circuit 130 includes, as shown in FIG. 31, an adder 160 and an interpolator 170. The data codes xci and $\Delta i$ unpacked by the DVD decoder 120 are inputted to the adder 160. The adder 160 determines the sum of xci and $\Delta i$ to produce a data code xbi (i.e., $\Delta i$+xci=xbi) which is expressed with 24 bits identical with those of the data code xbi in FIG. 29. The interpolator 170 determines data codes xa1, xa2, xa3, . . . , as shown in FIG. 32, between samples (i.e., the data codes xbi) based on the data codes xbi derived by the adder 160. The interpolation may be achieved by setting the data codes xai to zeros (0s) using the so-called up sampling technique and passing them through a low-pass filter or by using the so-called curve approximation or predictive approximation technique.

Thus, a data stream of xbi, xai, . . . , xbi, xai, . . . is inputted to the D/A converter 150. The D/A converter 150 converts the input into an analog signal at a sampling frequency of 96 kHz.

The data xci may alternatively be inputted from the DVD decoder 120 directly into the D/A converter 150 and converted into an analog signal in a resolution of 24 bits at a sampling frequency of 48 kHz.

In the signal processing circuit 130, the data code xbi is, as described above, determined only by the addition operation, so that it is reproduced without any deterioration. The data code xai is determined only by the interpolation, for example, a one-time nonrecursive filtering operation, so that it is reproduced with a high-operation accuracy. Specifically, an interpolation error will lie within several bits in a high-frequency band. As is well known in the art, a conventional QMF filter performs an FFT operation consisting of a large number of multiplication operations which will cause an operation accuracy to be decreased so that a 24-bit operation accuracy which is assured by the present invention cannot be maintained.

A master may be made using signals picked up from the output terminal 8a of the packing encoder 7 in FIG. 27 to produce a record carrier such as an optical disc (e.g., a DVD).

The interpolation in the interpolator 170 in FIG. 31 may alternatively be achieved by embedding a hold data code (e.g., xb1) between adjacent two (e.g., xb1 and xb2) of the data codes xbi using the so-called up sampling technique and passing them through a low-pass filter. Specifically, the interpolation in the interpolator 170 is not limited to a method of determining values intermediate between samples in the up sampling.

Figure 33:
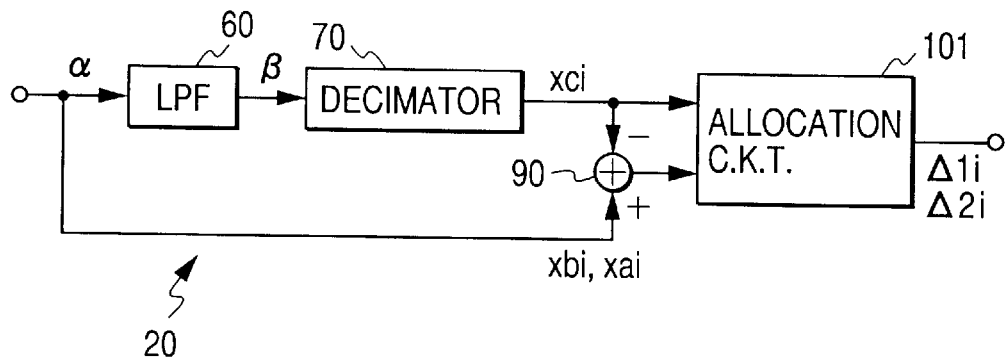
FIG. 33 is a block diagram which shows a signal processing circuit which is used in encoding apparatuses according to the twenty-fourth and twenty-eighth embodiments of the invention.

FIG. 33 shows a signal processing circuit 20 according to the twenty-fourth embodiment of the invention which may be used in the encoding apparatus 100 in FIG. 27 and which is a modification of the one shown in FIG. 28.

Figure 34:
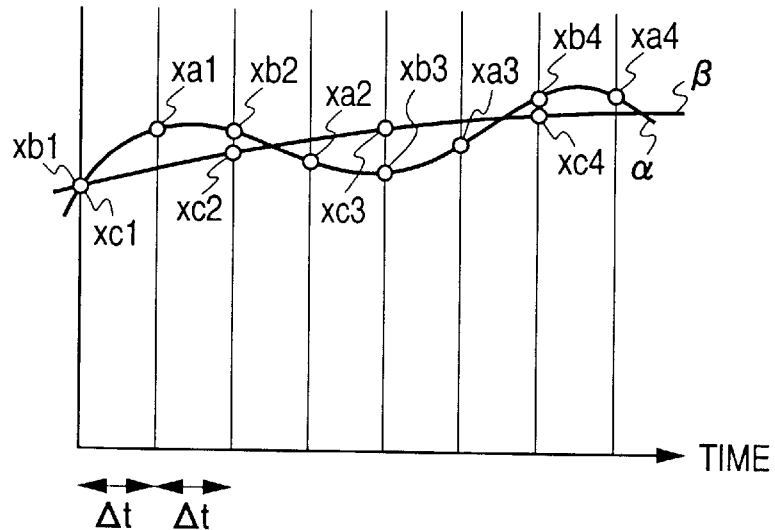
FIG. 34 an illustration which shows waveforms of signals A/D-converted by encoding apparatuses according to the twenty-fourth and twenty-eighth embodiments of the invention.

The low-pass filter 60 includes an FIR filter allowing an input signal to pass therethrough within a ½ band to pass therethrough to produce data codes xc1, . , xc2, . , xc3, . , . . . on a curve β, as shown in FIG. 34. The decimator 70 decimates signals between adjacent two of the data codes xci to produce a data stream of xc1, xc2, xc3, . . . . The difference calculator 90 determines differences (first difference codes) between the data codes xc1, xc2, xc3, . . . derived, as shown in FIG. 34, by decimation in the decimator 70 and the data codes xb1, xb2, xb3, derived by alternately decimating signals (i.e., data codes xai) on a curve α, as shown in FIG. 34, and also determines differences (second difference codes) between the data codes xa1, xa2, xa3, . . . decimated alternately when producing the data codes xb1, xb2, xb3, . . . and the data codes xc1, xc2, xc3, . . . , as shown below.

xbi−xci=$\Delta 1 i$ (first difference code)

xai−xci=$\Delta 2 i$ (second difference code)

where each of the first and second difference codes $\Delta 1 i$ and $\Delta 2 i$ is represented with 12 bits or less and may have either of fixed and variable length.

The allocation circuit 101 receives the data code xci outputted from the decimator 70 and the first and second difference code $\Delta 1 i$ and $\Delta 2 i$ outputted from the difference calculator 90 and packs them in a given order to produce a user data code. When the user data code is represented with 2034 bytes, the number of data codes xci is 338, and the number of each of the difference codes $\Delta 1 i$ and $\Delta 2 i$ is also 338. A subheader is represented with 4 bytes.

Figure 35:
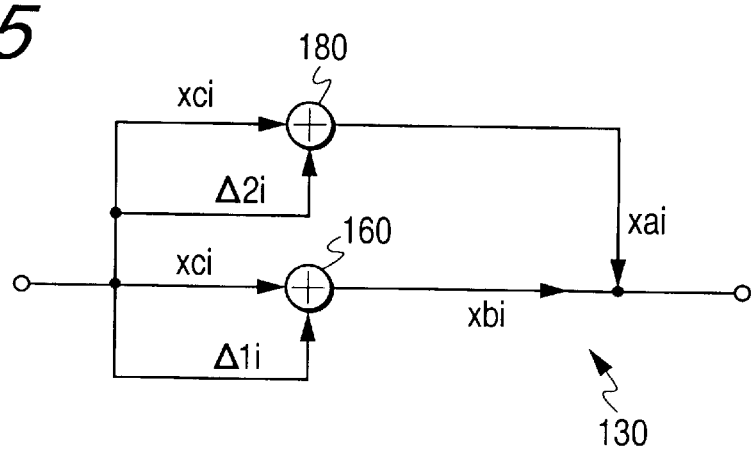
FIG. 35 is a circuit diagram which shows a signal processing circuit of a decoding circuit according to the twenty-fifth embodiment of the invention.

FIG. 35 shows a signal processing circuit 130 according to the twenty-fifth embodiment of the invention which may be used in the decoding apparatus 200 in FIG. 30 designed to decode an input signal into an analog signal having the waveform shown in FIG. 32.

The adder 160 receives the data code xci and the difference code $\Delta 1 i$ and adds them to produce a data code xbi (=$\Delta 1 i$ +xci). Similarly, the adder 180 receives the data code xci and the difference code $\Delta 2 i$ and adds them to produce a data code xai (=$\Delta 2 i$ +xci). Each of the data codes xci and xai is represented with 24 bits identical with those of the data codes xbi and xai shown in FIG. 34.

The outputs of the adders 160 and 180 are, as shown in the drawing, combined to produce a data stream of xbi, xai, . . . , xbi, xai, . . . which is inputted to the D/A converter 150. The D/A converter 150 converts the input into an analog signal at a sampling frequency of 96 kHz.

The data xci may alternatively be inputted from the DVD decoder 120 directly into the D/A converter 150 and converted into an analog signal in a resolution of 24 bits at a sampling frequency of 48 kHz.

In the signal processing circuit 130, the data codes xbi and xai are, as described above, determined only by the addition operations of the adders 160 and 180 so that they are reproduced accurately without any deterioration. The use of a conventional QMF filter in reproducing the data codes xbi and xai requires an FFT operation consisting of a large number of multiplication operations which will cause an operation accuracy to be decreased so that a 24-bit operation accuracy which will be assured by the decoding apparatus 200 of this embodiment cannot be maintained.

An encoding apparatus 100 according to the twenty-sixth embodiment of the invention will be described below which has the same circuit structure as that of the twenty-second embodiment, as shown in FIGS. 27 and 28.

The encoding apparatus 100 of this embodiment is designed to scale difference information for each of given frames to minimize data compression-caused errors.

Figure 36:
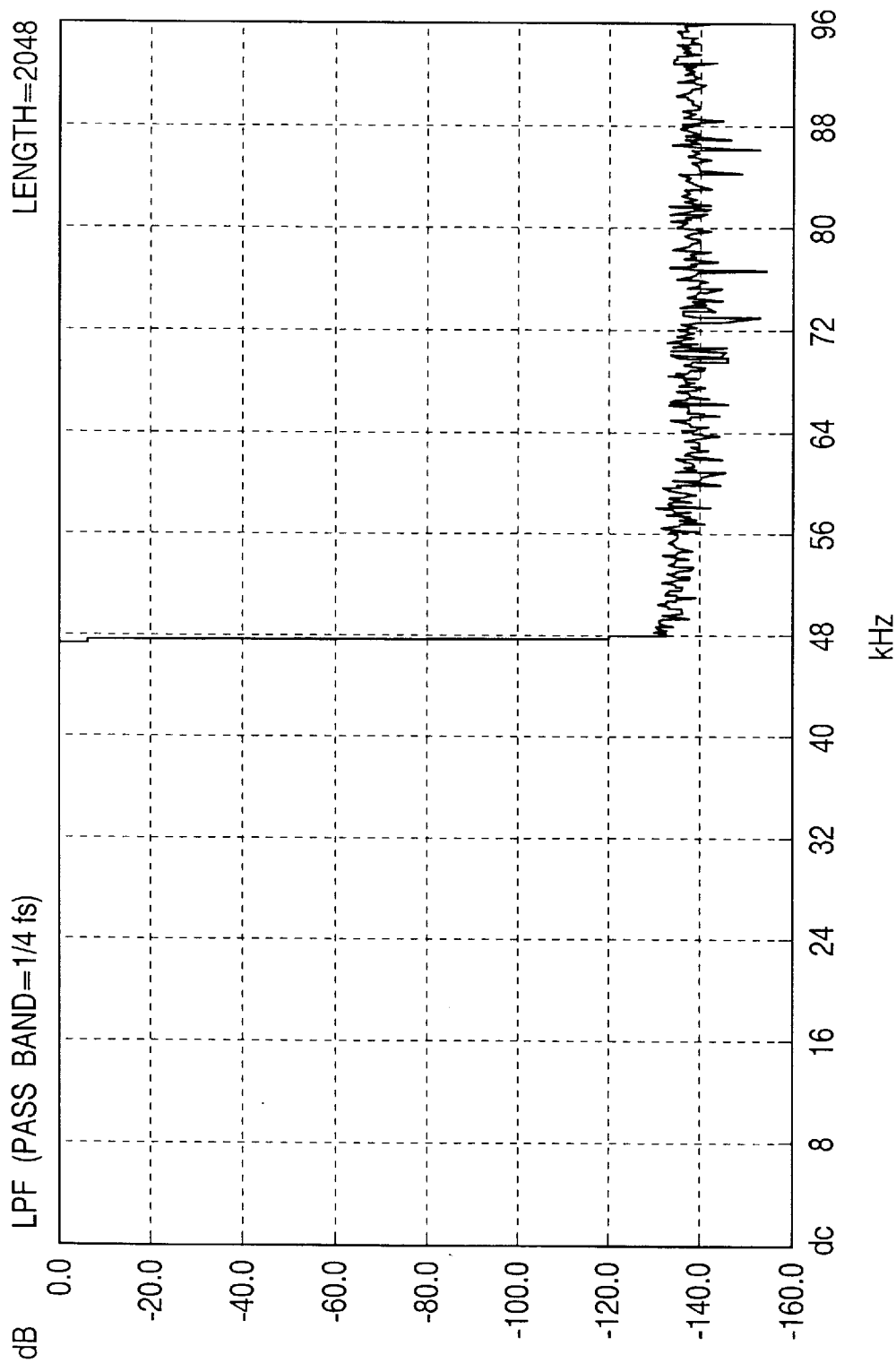
FIG. 36 is a graph which shows the characteristics of a filter used in the signal processing circuits in FIG. 28 and 33.

Specifically, the signal processing circuit 20, as shown in FIG. 28, produces data codes xc1, . , xc2, . , xc3, . , . . . on the curve β, as shown in FIG. 29, through the low-pass filter 60 consisting of a FIR filter. The FIR filter has a filter characteristic, as shown in FIG. 36, which rolls off sharply.

The difference calculator 90 determines a difference (i.e., a difference code Δi) between the outputs from the decimators 70 and 80 according to the equation of xbi−xci=Δi. The difference code Δi is provided in the allocation circuit 101 as a normalized data code which is scaled and which is expressed with variable or fixed 12 bits.

The allocation circuit 101 receives the data code xci and the difference code Δi from the decimator 70 and the difference calculator 90 and normalizes them using a peak value Sp within each frame which are, in turn, packed in a given order and outputted as a user data code. When the user data code is represented with 2034 bytes, the number of data codes xci is 450, and the number of the difference codes Δi is 455. A subheader is represented with 9 bytes three of which is used to represent the peak value Sp as a scaling factor used in scaling.

Figure 37:
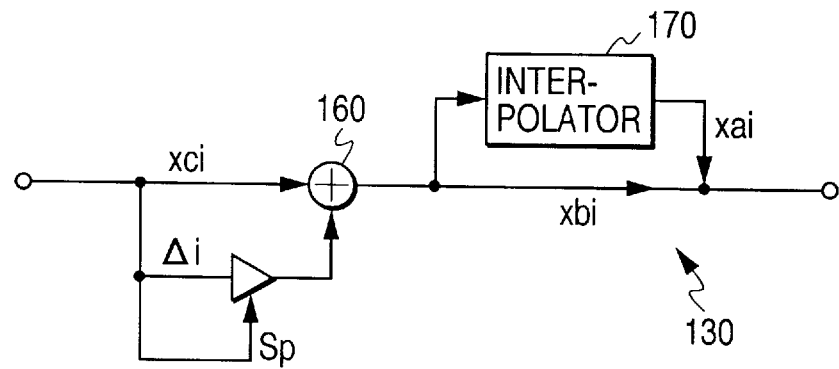
FIG. 37 is a circuit diagram which shows a signal processing circuit of a decoding circuit according to the twenty-seventh embodiment of the invention.

FIG. 37 shows a signal processing circuit 130 according to the twenty-seventh embodiment of the invention which may be used in the decoding apparatus 200 in FIG. 30.

The signal processing circuit 130 of this embodiment is designed to decode a signal coded by the encoding apparatus 100 of the above described twenty-sixth embodiment.

The adder 160 performs an operation below using the data codes xci and Δi inputted to the signal processing circuit 130.

$$\Delta i \cdot Sp + xci = xbi$$

where Sp is a peak value used for scaling in an encoding operation, and the data code xbi is expressed with 24 bits identical with that of the data code xbi shown in FIG. 29.

The interpolator 170 determines data codes xa1, xa2, xa3, . . . , as shown in FIG. 32, between samples (i.e., the data codes xbi) based on the data codes xbi derived by the adder 160.

An encoding apparatus 100 according to the twenty-eighth embodiment of the invention which has the same circuit structures as those shown in FIGS. 27 and 33.

The low-pass filter 60 including an FIR filter produces data codes xc1, . , xc2, . , xc3, . , . . . lying on the curve β, as shown in FIG. 34. The FIR filter has the filter characteristic, as shown in FIG. 36, which rolls off sharply.

The decimator 70 decimates signals between adjacent two of the data codes xci to produce a data stream of xc1, xc2, xc3, . . . . The difference calculator 90 determines differences (i.e., a first difference code Δ1i) between the data codes xc1, xc2, xc3, . . . derived, as shown in FIG. 34, by decimation in the decimator 70 and the data codes xb1, xb2, xb3, . . . according to the equation of xbi−xci=Δ1i. The first difference code Δ1i is expressed in the allocation circuit 101 with a 6-bit normalized value. The difference calculator 90 also determines differences (i.e., a second difference code Δ2i) between the data codes xa1, xa2, xa3, . . . decimated alternately when producing the data codes xb1, xb2, xb3, . . . and the data codes xc1, xc2, xc3, . . . according to the equation of xai−xci=Δ2i. The second difference code Δ2i is expressed in the allocation circuit 101 with a normalized data code which is scaled and expressed with variable or fixed 6 bits. The normalization is made with respect to an L-channel peak value $P_L$ in a combination of the first and second difference codes Δ1i and Δ2i. The normalization is also made with respect to a R-channel peak value $P_R$ similar to L-channel the peak value $P_L$.

The allocation circuit 101 receives the data code xci and the difference codes Δ1i and Δ2i and normalizes them based on a peak value Sp within each frame which are, in turn, packed in a given order and outputted as a user data code. When the user data code is represented with 2034 bytes, the number of data codes xci is 225, and the number of each of the difference codes Δ1i and Δ2i is also 225. A subheader is represented with 9 bytes. Specifically, each of the difference codes Δ1i and Δ2i is expressed with 6 bits at each of the R- and L-channels and used as a third channel data code. In the subheader, the R- and L-channel peak values $P_R$ and $P_L$ each represented with 3 bytes are arranged.

Figure 38:
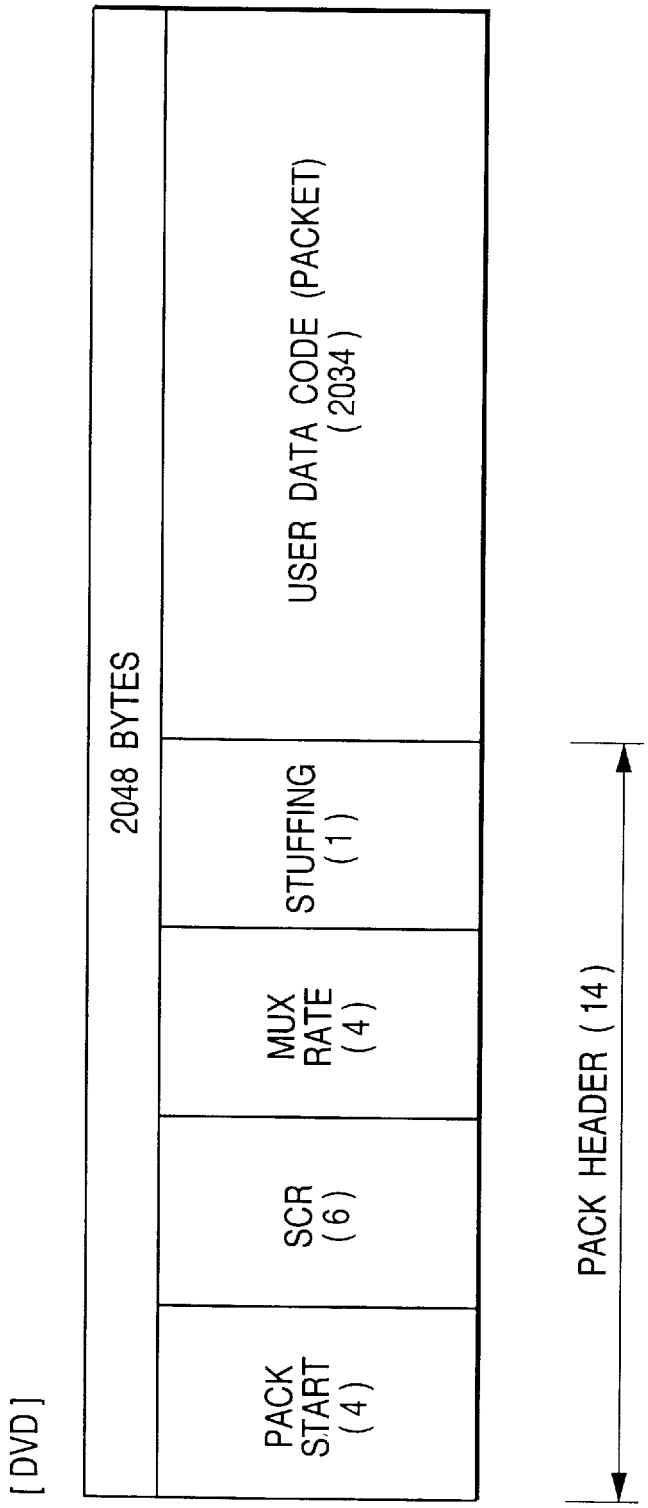
FIG. 38 is an illustration which shows a user data code packed by a DVD encoder of an encoding apparatus according to the twenty-eighth embodiment of the invention.

The DVD coding circuit 40 receives the data code xai and the first and second difference codes Δ1i and Δ2i and packs them to produce a code, as shown in FIG. 38.

Figure 39:
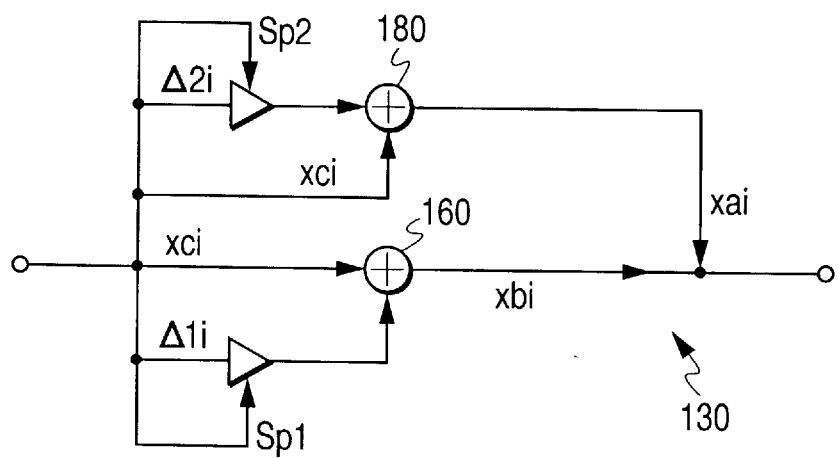
FIG. 39 is a circuit diagram which shows a signal processing circuit used in a decoding apparatus according to the twenty-ninth embodiment of the invention.

FIG. 39 shows a signal processing circuit 130 according to the twenty-ninth embodiment of the invention which may be used in the decoding apparatus 200 in FIG. 30 designed to decode an input signal into an analog signal having the waveform shown in FIG. 34.

An input signal is demodulated by the demodulator 110, unpacked by the DVD decoder 120, and outputted to the signal processing circuit 130. The signal processing circuit 130 produces interpolated data codes using the memory 14 which are, in turn, converted by the D/A converter 150 into an analog signal.

In the signal processing circuit 130, the adder 160 multiplies the difference code Δ1i and the peak value Sp1 together and adds the data code xci to it to produce a data code xbi (Δ1i·Sp1+xci=xbi) which is expressed with 24 bits. Similarly, the adder 180 multiplies the difference code Δ2i and the peak value Sp2 together and adds the data code xci to it to produce a data code xai (Δ2i·Sp2+xci=xai) which is expressed with 24 bits.

The outputs of the adders 160 and 180 are, as shown in the drawing, combined to produce a data stream of xbi, xai, . . . , xbi, xai, . . . which is inputted to the D/A converter 150. The D/A converter 150 converts the input into an analog signal at a sampling frequency of 96 kHz.

Figure 40:
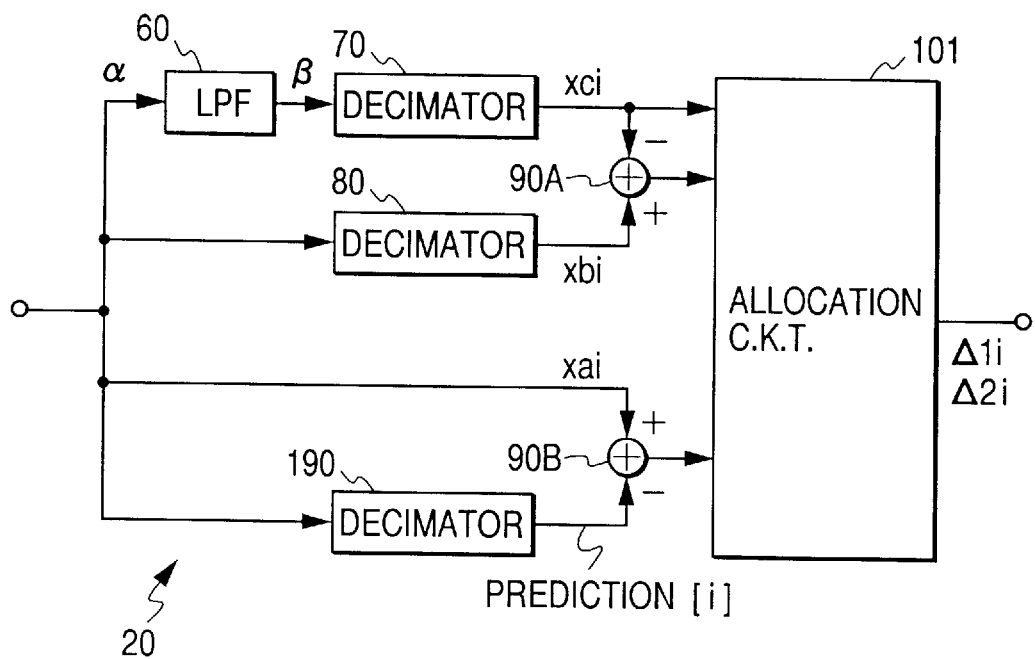
FIG. 40 is a block diagram which shows an encoding apparatus according to the thirtieth embodiment of the invention.

FIG. 40 shows a signal processing circuit 20 according to the thirtieth embodiment of the invention which may be used in the encoding apparatus 100 in FIG. 27 which is a modification of the twenty-fourth embodiment and different therefrom in determining the second difference code Δ2i.

Specifically, the second difference code Δ2i is determined according to the equation below.

$$xai - \text{Predication }[i] = \Delta 2i$$

where xai−Prediction [i] is an N-order linear predicted value. When N=3, Predication [i] is expressed by $$\text{Prediction }[i] = A1 \cdot xa(i-1) + A2 \cdot xbi + A3 \cdot xa(i+1)$$

where A1, A2, and A3 are prediction factors.

Figure 41:
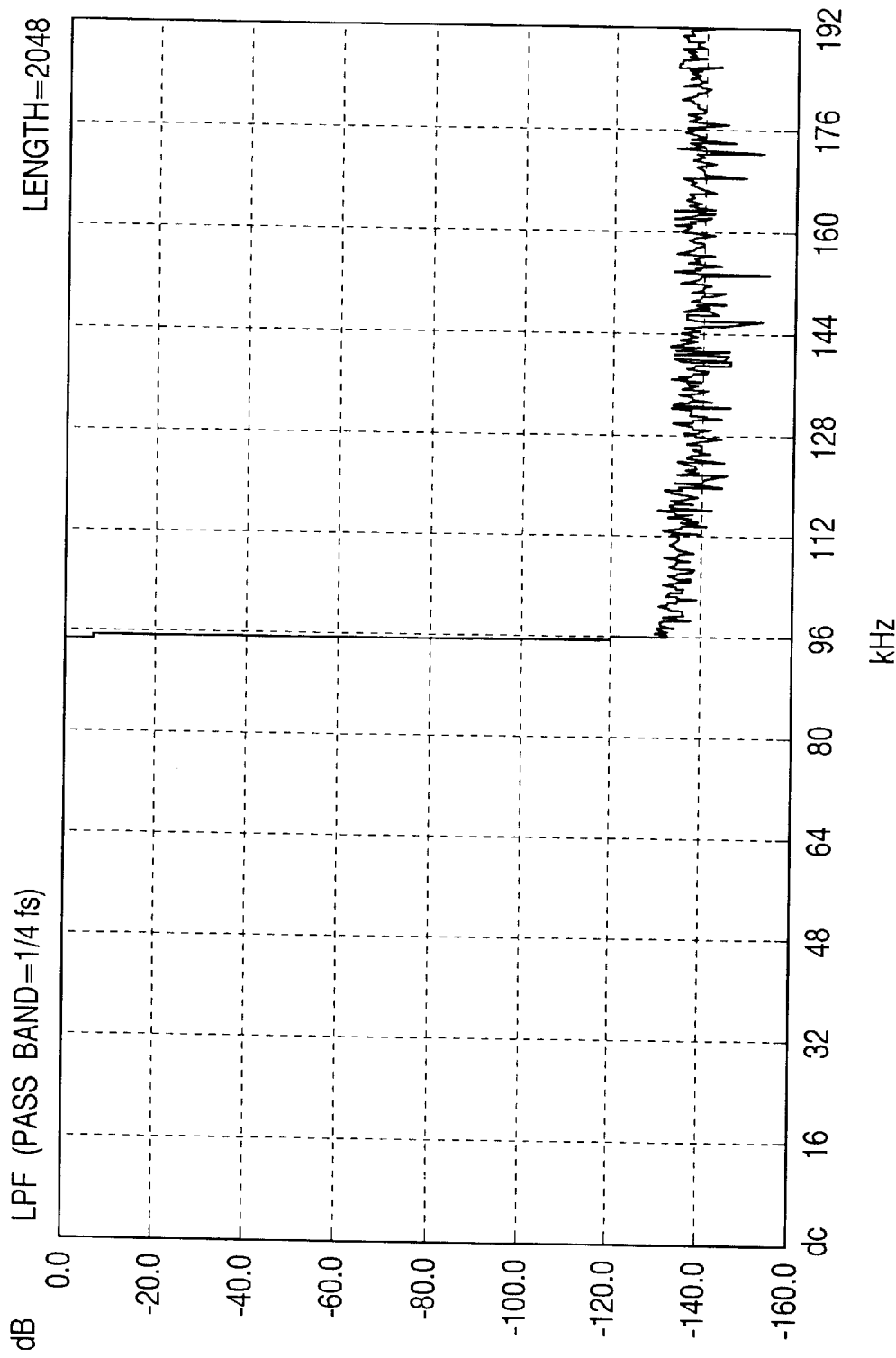
FIG. 41 is a graph which shows the characteristics of a filter used in the signal processing circuit in FIG. 40.

Specifically, Prediction [i] may be projected as points lying on a curve extending through three points xa(i−1), xbi, and xa(i+1). Such linear prediction is performed by a linear prediction circuit 190. The output signal Predication [i] of the linear prediction circuit 190 is inputted to the adder 90B and subtracted from the data code xai. In this embodiment, the A/D converter 10 uses a sampling frequency of 192 kHz. The low-pass filter 60 has the characteristic shown in FIG. 41.

Figure 42:
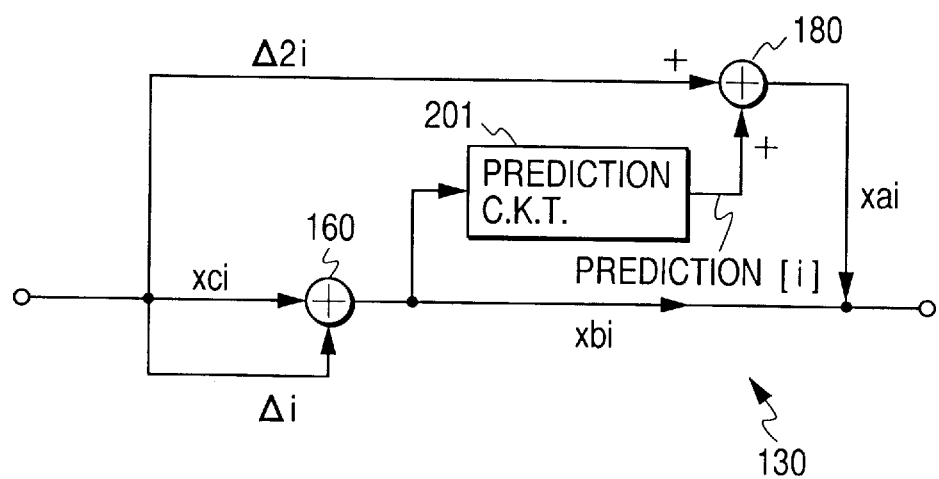
FIG. 42 is a block diagram which shows a signal processing circuit of a decoding apparatus according to the thirty-first embodiment of the invention.

FIG. 42 shows a signal processing circuit 130 according to the thirty-first embodiment of the invention which is used in the decoding apparatus 200 and which is a modification of the twenty-fifth embodiment, as shown in FIG. 35, and different therefrom in determining the data code xai.

Specifically, the adder 180 determines the data code xai according to the equation below.

$$\Delta 2i + \text{Predication } [i] = xai$$

where Prediction [i] is an N-order linear predicted value. When N=3, Predication [i] is expressed by $$\text{Prediction } [i] = A1 \cdot xa(i-1) + A2\ xbi + A3\ xa(i+1)$$

where A1, A2, and A3 are prediction factors.

Specifically, Prediction [i] may be projected as points lying on a curve extending through three points xa(i−1), xbi, and xa(i+1). Such linear prediction is performed by a linear prediction circuit 201 in FIG. 42. In this embodiment, the D/A converter 150 uses a sampling frequency of 192 kHz. 96 kHz is reproduced from the data codes sampled at a haploid sampling frequency. The detection of the second difference code $\Delta 2i$, as can be seen from the above embodiment, may be based on any data.

Figure 43:
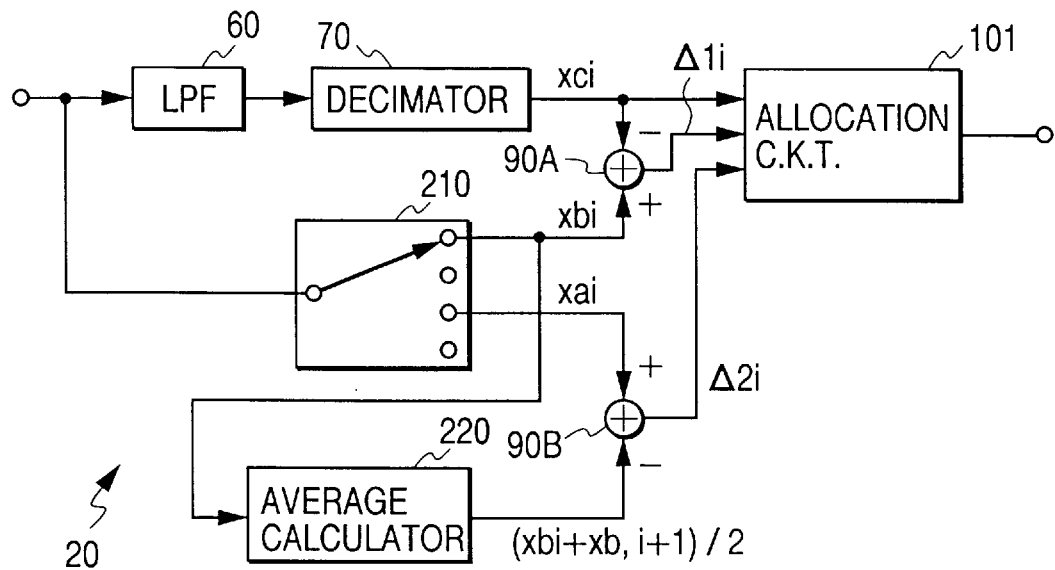
FIG. 43 is a block diagram which shows an encoding apparatus according to the thirty-second embodiment of the invention.

FIG. 43 shows a signal processing circuit 20 according to the thirty-second embodiment of the invention which is used in the encoding apparatus 100, as shown in FIG. 27, and which is different from the twenty-second embodiment in the following.

Figure 44:
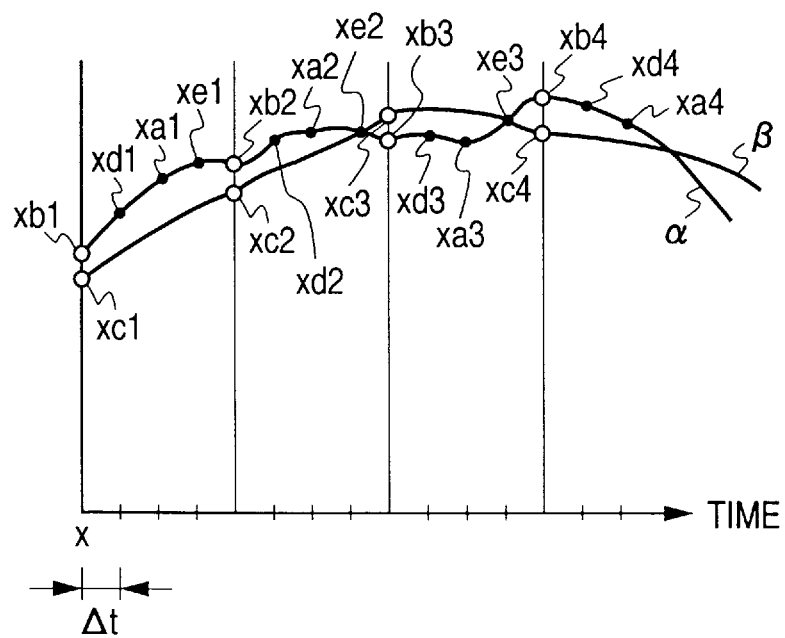
FIG. 44 is an illustration which shows waveforms of signals A/D-converted by the encoding apparatus in FIG. 43.

In the following discussion, it is assumed that an input signal (an audio signal) appearing at the input terminal 1 is sampled at time intervals Δt (e.g., a high rate of 192 kHz) to produce streams of data codes having waveforms, as shown in FIG. 44.

Specifically, the A/D converter 10 converts the input signal at a sampling frequency of four times that specified in the DAT standards, for example, into PCM signals forming a data stream of xb1, xd1, xa1, xe1, xb2, xd2, xa2, xe2, xb3, xd3, xa3, xe3, . . . each represented with 20 bits and outputs them to the signal processing circuit 20. The signal processing circuit 20 compresses the input data stream using the memory 30 which is, in turn, packed by the DVD coding circuit 40. The packed data is supplied to the output terminal 8a and the modulator 50. An output signal from the output terminal 8b modulated by the modulator 50 is recorded on a record carrier, for example.

In the signal processing circuit 20 shown in FIG. 43, the low-pass filter 60 including an FIR filter allowing input signals to pass therethrough within a ¼ band to produce signals xc1, . . . , xc2, . . . , xc3, . . . on a curve β, as shown in FIG. 44. The decimator 70 decimates or decreases the signals inputted from the low-pass filter 60 to a quarter (¼) thereof to produce a data stream of xc1, xc2, xc3, . . . which is, in turn, inputted to a minus (−) terminal of the first difference calculator 90A. The input signals to the low-pass filter 60 are also supplied to the switch 210. The switch 210 separates the input signals into the data codes xbi and the data codes xai which are, as shown in FIG. 44, arranged on the curve α at four time intervals Δt, respectively. The data codes xbi are supplied to a plus (+) terminal of the first difference calculator 90A and the average calculator 220, while the data code xai are supplied to a plus (+) terminal of the second difference calculator 90B. The average calculator 220 adds the two consecutive data codes xbi and xb(i+1) and divides the sum by two to determine an average value ((xbi+xb(i+1))/2) and outputs it to a minus (−) terminal of the second difference calculator 90B.

The first difference calculator 90A determines a difference (i.e., a difference code $\Delta 1i$) between the data code xci lying on the curve β outputted from the decimator 70 and the data code xbi lying on the curve α in synchronization with the data code xci according to the equation of xbi−xci=$\Delta 1i$ which is expressed with variable or fixed 10 bits or less.

The second difference calculator 90B determines a difference (i.e., a difference code $\Delta 2i$) between the data code xai lying on the curve α outputted from the switch 210 and the average value ((xbi+xb(i+1))/2) outputted from the average calculator 220 according to the equation of xai−(xbi+xb(i+1))/2=$\Delta 2i$ which is expressed with variable or fixed 10 bits or less.

The allocation circuit 101 receives the data code xci and the first and second difference codes $\Delta 1i$ and $\Delta 2i$ and packs them in a given order to produce a use data code. When the user data code is represented with 2034 bytes as in a DVD, the number of data codes xci is 406, and the number of each of the first and second difference codes $\Delta 1i$ and $\Delta 2i$ is also 406. A subheader is represented with 4 bytes.

Figure 45:
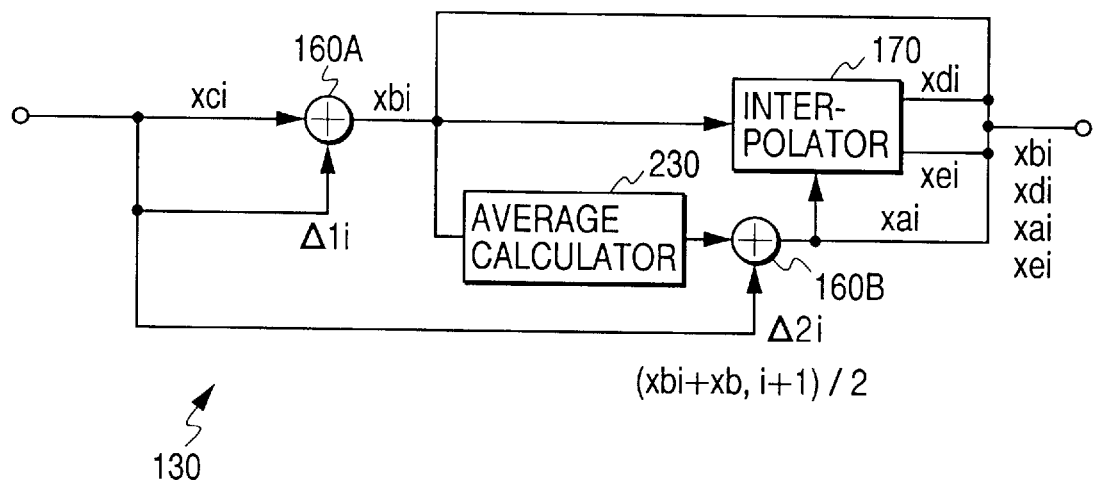
FIG. 45 is a block diagram which shows a decoding apparatus according to the thirty-third embodiment of the invention.

FIG. 45 shows a signal processing circuit 130 according to the thirty-third embodiment of the invention which is used in a decoding apparatus having the same circuit structure as that shown in FIG. 30.

Figure 46:
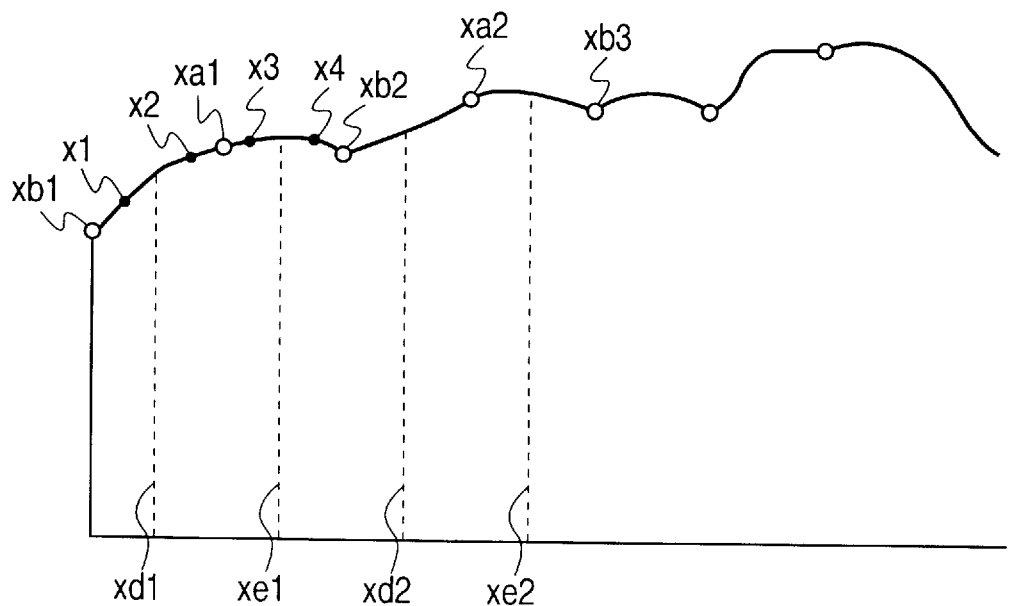
FIG. 46 is an illustration which shows a waveform of a signal D/A-converted by the decoding apparatus in FIG. 45.

The decoding apparatus of this embodiment decodes an input signal to produce an analog signal having a waveform, as shown in FIG. 46. Specifically, the input signal is demodulated by the demodulator 110, unpacked by the DVD decoder 120, and outputted to the signal processing circuit 130. The signal processing circuit 130 produces interpolated data codes using the memory 140 which are, in turn, converted by the D/A converter 150 into the analog signal.

In the signal processing circuit 130 in FIG. 45, the first adder 160A performs an operation below using the data codes xci and $\Delta 1i$ inputted to the signal processing circuit 130 to produce the data code xbi.

$$\Delta 1i + xci = xbi$$

where the data code xbi is expressed with 24 bits identical with that of the original data code xbi shown in FIG. 44.

The data code xbi is supplied to an output terminal, the interpolator 170, and the average calculator 230. The average calculator 230 adds the two consecutive data codes xbi and xb(i+1) and divides the sum by two to determine an average value ((xbi+xb(i+1))/2) and outputs it to the second adder 160B. The second adder 160B determines the sum of the second difference code $\Delta 2i$ and the average value (xbi+xb(i+1))/2 to produce the data code xai which is expressed with 24 bits identical with that of the original data code xai shown in FIG. 44.

The output of the second adder 160B is supplied to the interpolator 170 and the output terminal. The interpolator 170 determines data codes xd1, xe1, xd2, xe2, . . . , xdi, xei, . . . , as shown in FIG. 46, based on the data codes xai and xbi inputted from the first and second adders 160A and 160B using the up sampling technique.

The data codes xbi, xdi, xai, and xei are, thus, outputted to the D/A converter 150 and then converted into an analog signal at 192 kHz. The output (i.e., the data code xci) of the DVD decoder 120 may alternatively be transmitted directly to the D/A converter 150 and then converted into an analog signal at, for example, 48 kHz with an accuracy of 24 bits.

In the signal processing circuit 130, the data codes xbi and xai are, as described above, determined only by the addition operations of the first and second adders 160A and 160B so that they are reproduced without any deterioration. The other data codes are determined only by the interpolation of the interpolator 170, for example, a one-time nonrecursive filtering operation so that they are reproduced with a high-operation accuracy. Specifically, an interpolation error will lie within several bits in a high-frequency band. The use of a conventional QMF filter in reproducing the data codes xbi and xai requires an FFT operation consisting of a large number of multiplication operations which will cause an operation accuracy to be decreased so that a 24-bit operation accuracy which will be assured by the decoding apparatus 200 of this embodiment cannot be maintained.

A master may be made using signals picked up from the output terminal 8*a* of the DVD encoder 40 in FIG. 27 to produce a record carrier such as an optical disc (e.g., a DVD).

The interpolation in the interpolator 170 in FIG. 45 may alternatively be achieved by embedding a hold data code (e.g., xb1) between adjacent two (e.g., xb1 and xb2) of the data codes xbi using the so-called up sampling technique and passing them through a low-pass filter to determine signals x1, x2, x3, . . . , as shown in FIG. 46. Specifically, the interpolation in the interpolator 170 is not limited to a method of determining the intermediate data codes xa1, xa2, xa3, . . . .

Figure 47:
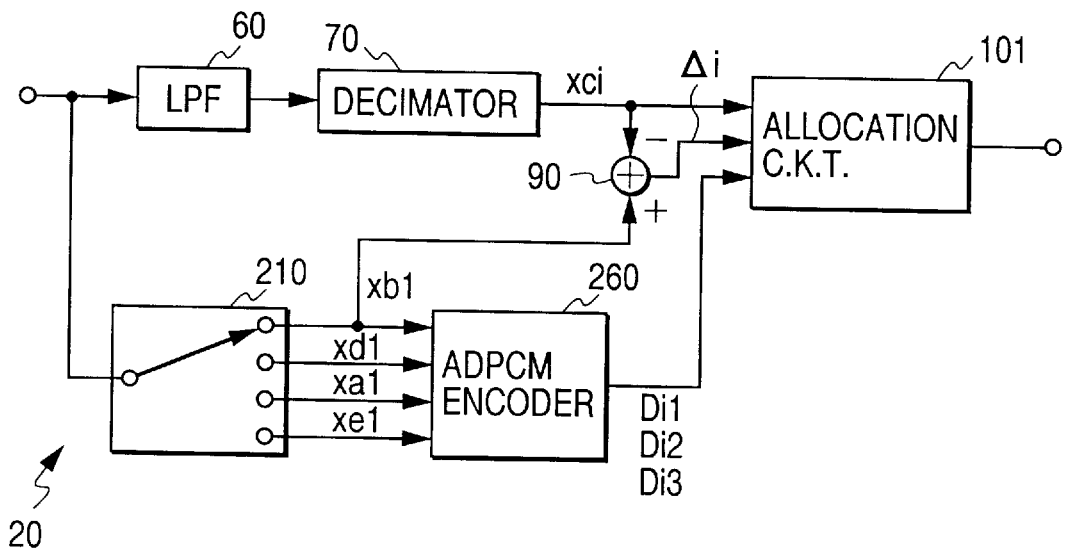
FIG. 47 is a block diagram which shows an encoding apparatus according to the thirty-fourth embodiment of the invention.

FIG. 47 shows a signal processing circuit 20 according to the thirty-fourth embodiment of the invention which is used in the encoding apparatus 100, as shown in FIG. 27, and which is a modification of the one shown in FIG. 28.

An input signal (an audio signal) appearing at the input terminal 1 is sampled at time intervals At (e.g., a high rate of 192 kHz) to produce streams of data codes having waveforms, as shown in FIG. 44.

Specifically, the A/D converter 10 converts the input signal at a sampling frequency of four times that specified in the DAT standards, for example, into PCM signals forming a data stream of xb1, xd1, xa1, xe1, xb2, xd2, xa2, xe2, xb3, xd3, xa3, xe3, . . . each represented with 20 bits and outputs them to the signal processing circuit 20. The signal processing circuit 20 compresses the input data stream using the memory 30 which is, in turn, packed by the DVD coding circuit 40. The packed data is supplied to the output terminal 8*a* and the modulator 50. An output signal from the output terminal 8*b* modulated by the modulator 50 is recorded on a record carrier, for example.

In the signal processing circuit 20 shown in FIG. 47, the low-pass filter 60 including an FIR filter allowing input signals to pass therethrough within a ¼ band thereof to produce signals xc1, . . . , xc2, . . . , xc3, . . . on the curve β, as shown in FIG. 44. The decimator 70 decimates or decreases the signals inputted from the low-pass filter 60 to a quarter (¼) thereof to produce a data stream of xc1, xc2, xc3, . . . which is, in turn, inputted to a minus (−) terminal of the difference calculator 90A. The input signals to the low-pass filter 60 are also supplied to the switch 210. The switch 210 separates the input signals into the data codes xbi, xdi, xai, and xei lying on the curve α at time intervals Δt and outputs them to the ADPCM encoder 260. The data code xbi is also supplied to a plus (+) terminal of the difference calculator 90A.

The difference calculator 90A determines a difference (i.e., a difference code Δi) between the data code xci outputted from the decimator 70 and the data code xbi outputted from the switch 210 according to the equation of xbi−xci=Δi which is expressed with variable or fixed 11 bits or less.

The ADPCM encoder 260 receives the data codes xbi, xdi, xci, and xei to determine three difference codes below.

xdi−xbi=Di1
xai−xdi=Di2
xei−xai=Di3 which will generally be referred to as an ADPCM code Dik hereinafter and which is expressed with 3 bits or less.

The allocation circuit 101 receives the data code xci, and the difference code Δi, and the ADPCM code Dik and packs them in a given order to produce a use data code. When the user data code is represented with 2034 bytes as in a DVD, the number of data codes xci is 812, and the number of each of the difference codes Δi and the ADPCM codes Dik is also 812. A subheader is represented with 4 bytes.

Figure 48:
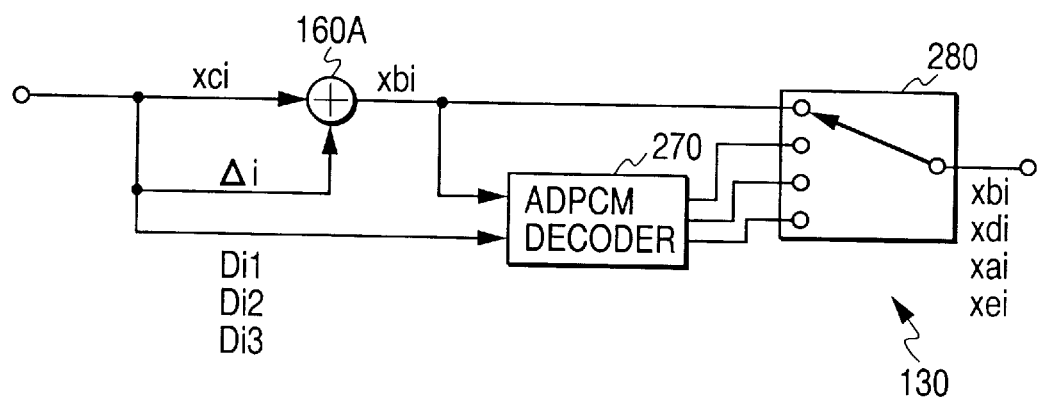
FIG. 48 is a block diagram which shows a signal processing circuit of a decoding apparatus according to the thirty-fifth embodiment of the invention.

FIG. 48 shows a signal processing circuit 130 according to the thirty-fifth embodiment of the invention which is used in a decoding apparatus having the same circuit structure as that shown in FIG. 30.

The decoding apparatus of this embodiment decodes an input signal to produce an analog signal having a waveform, as shown in FIG. 46. Specifically, the input signal is demodulated by the demodulator 110, unpacked by the DVD decoder 120, and outputted to the signal processing circuit 130. The signal processing circuit 130 produces interpolated data codes using the memory 140 which are, in turn, converted by the D/A converter 150 into the analog signal.

In the signal processing circuit 130 in FIG. 48, the adder 160A performs an operation below using the data codes xci and Δ1*i* inputted to the signal processing circuit 130 to produce the data code xbi.

$$\Delta 1i + xci = xbi$$

where the data code xbi is expressed with 20 bits identical with that of the original data code xbi shown in FIG. 44.

The data code xbi outputted from the adder 160A is supplied to an input terminal of the switch 280 and the ADPCM decoder 270. The ADPCM decoder 270 also receives the ADPCM code Dik and determines the data codes xdi, xai, and xei between samples using the ADPCM code Dik and the data code xbi. The data codes xdi, xai, and xei are each represented with 20 bits identical with those of an original digital data (i.e., the data code xbi in FIG. 44).

The switch 280 receives the data codes xbi, xdi, xai, and xe1 and outputs a data stream of xb1, xd1, xa1, xe1, . . . , xbi, xdi, xai, xei, . . . to the D/A converter 150. The D/A converter 150 converts the input into an analog signal at 192 kHz.

The output (i.e., the data code xci) of the DVD decoder 120 may alternatively be transmitted directly to the D/A converter 150 and then converted into an analog signal at, for example, 48 kHz with an accuracy of 24 bits.

In the signal processing circuit 130, the data code xbi is, as described above, determined only by the addition operation of the adder 160A so that it is reproduced without any deterioration. The other data codes are determined only by the adaptive operation of the ADPCM decoder 270, for example, a one-time nonrecursive filtering operation so that they are reproduced with a high-operation accuracy. Specifically, an adaptive operation error will lie within several bits in a high-frequency band. The use of a conventional QMF filter in reproducing the data code xbi requires an FFT operation consisting of a large number of multiplication operations which will cause an operation accuracy to be decreased so that a 20-bit operation accuracy which will be assured by the decoding apparatus 200 of this embodiment cannot be maintained.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An encoding apparatus comprising:

a first A/D converting circuit converting an analog input signal at a first sampling frequency into a first data stream of digital codes;

a second A/D converting circuit converting an analog input signal at a second sampling frequency that is twice the first sampling frequency into a second data stream of digital codes;

decimating means for decimating the digital codes of the second data stream alternately to produce a third data stream of digital codes which are coincident in time sequence with the digital codes of the first data stream;

a difference code producing circuit determining a difference between each of the digital codes of the first data stream and one of the digital codes of the third data stream to produce a difference code; and packing means for packing the first data stream of digital codes and the difference codes determined by said difference code producing circuit in a given format.

2. An encoding apparatus as set forth in claim 1, further comprising:

a third A/D converting circuit converting a second analog input signal that is different in channel from said analog input signal at the first sampling frequency into a fourth data stream of digital codes;

a fourth A/D converting circuit converting the second analog input signal at the second sampling frequency into a fifth data stream of digital codes;

second decimating means for decimating the digital codes of the fifth data stream alternately to produce a sixth data stream of digital codes which are coincident in time sequence with the digital codes of the fourth data stream; and a second difference code producing circuit determining a difference between each of the digital codes of the fourth data stream and one of the digital codes of the sixth data stream to produce a second difference code, wherein said packing means packs the first and fourth data streams of digital codes and the first and second difference codes in a given format to produce a data code, said packing means locating in the data code the first and second difference codes as a third channel separate from the first and fourth data streams of digital codes.

3. An encoding apparatus as set forth in claim 1, wherein said decimating means separates the second data stream of digital codes into the third data stream of digital codes and a fourth stream of digital codes, and further comprising a second difference code producing circuit determining a difference between each of the digital codes of the first data stream or a data code as a function of each of the digital codes of the first data stream and one of the digital codes of the fourth data stream to produce a second difference code, and wherein said packing means packs the first data stream of digital codes and the difference codes determined by said difference code producing circuit and the second difference codes determined by said second difference code producing circuit in a given format.

4. An encoding apparatus as set forth in claim 1, further comprising scaling means for scaling the difference codes in each of given frames.

5. An encoding apparatus as set forth in claim 3, further comprising scaling means for scaling the difference codes determined by said difference code producing circuit and the second difference codes determined by said second difference code producing circuit in each of given frames.

6. An encoding apparatus as set forth in claim 1, wherein said decimating means separates the second data stream of digital codes into the third data stream of digital codes and a fourth stream of digital codes, and further comprising predicted code producing means for producing predicted codes based on the second data stream of digital codes, a second difference code producing circuit determining a difference between each of the digital codes of the fourth data stream and one of the predicted codes to produce a second difference code, and scaling means for scaling the difference codes determined by said difference code producing circuit and the second difference codes determined by said second difference code producing circuit in each of given frames, and wherein said packing means packs the first data stream of digital codes and the difference codes determined by said difference code producing circuit and the second difference codes determined by said second difference code producing circuit in a given format.

7. An encoding apparatus comprising:

a first A/D converting circuit converting an analog input signal at a first sampling frequency into a first data stream of digital codes;

a second A/D converting circuit converting the analog input signal at a second sampling frequency that is four times the first sampling frequency into a second data stream of digital codes;

reference code determining means determining as reference codes each based on a function of consecutive two of the digital codes of the first data stream, either of the consecutive two of the digital codes of the first data stream, or a function of either of the consecutive two of the digital codes of the first data stream;

a first difference code producing circuit determining differences between the digital codes of the first data stream and some of the digital codes of second data stream that are coincident in time sequence with the first data stream of digital codes to produce first difference codes;

a second difference code producing circuit determining differences between the reference codes and some of the second data stream of digital codes each of which are coincident in time sequence with a middle point between consecutive two of the first data stream of digital codes to produce second difference codes; and packing means for packing the first data stream of digital codes and the first and second difference codes in a given format.

8. An encoding apparatus comprising:

a first A/D converting circuit converting an analog input signal at a first sampling frequency into a first data stream of digital codes;

a second A/D converting circuit converting the analog input signal at a second sampling frequency that is four times the first sampling frequency into a second data stream of digital codes;

a first difference code producing circuit determining differences between the digital codes of the first data stream and some of the digital codes of second data stream that are coincident in time sequence with the first data stream of digital codes to produce first difference codes;

encoding means for encoding some of the second data stream of digital codes that are out of coincidence in time sequence with the first stream of digital codes in ADPCM to produce ADPCM codes; and packing means for packing the first data stream of digital codes, the difference codes, and the ADPCM codes in a given format.

9. A decoding apparatus for decoding digital signals provided by an encoding apparatus including a first data stream of digital codes into which an analog signal is A/D-converted at a first sampling frequency and difference codes between the first data stream of digital codes and a third data stream of digital codes that are coincident in time sequence with the first data stream of digital codes and that are produced by A/D-converting the analog signal at a second sampling frequency that is twice the first sampling frequency to produce a second data stream of digital codes and decimating the digital codes of the second data stream alternately, comprising:

a decoding circuit adding the difference codes to the first data steam of digital codes to decode half of a fourth data stream of digital codes that are twice the first data stream of digital codes and decoding the fourth data stream of digital codes based on the decoded half of the fourth data stream of digital codes;

a first D/A converting circuit D/A-converting the first data stream of digital codes at a first sampling frequency into an analog signal; and a second D/A converting circuit D/A-converting the fourth data stream of digital codes at a second sampling frequency that is four times the first sampling frequency into an analog signal.

10. A decoding apparatus for decoding digital signals provided by an encoding apparatus including a first data stream of digital codes into which a two-channel analog signal is A/D-converted at a first sampling frequency and difference codes between the first data stream of digital codes and a third data stream of digital codes that are coincident in time sequence with the first data stream of digital codes and that are produced by A/D-converting the two-channel analog signal at a second sampling frequency that is twice the first sampling frequency to produce a second data stream of digital codes and decimating the digital codes of the second data stream alternately, comprising:

a decoding circuit adding the difference codes to the first data steam of digital codes to decode half of a fourth data stream of digital codes that are twice the first data stream of digital codes and decoding the fourth data stream of digital codes based on the decoded half of the fourth data stream of digital codes;

a first D/A converting circuit D/A-converting the first data stream of digital codes at a first sampling frequency into an analog signal; and a second D/A converting circuit D/A-converting the fourth data stream of digital codes at a second sampling frequency that is four times the first sampling frequency into an analog signal.

11. A decoding apparatus for decoding digital signals provided by an encoding apparatus, including a first data stream of digital codes, first difference codes, a second data stream of digital codes, and second difference codes, the first data stream of digital code being produced by A/D-converting an analog signal at a first sampling frequency, the first difference codes being produced by differences between the first data stream of digital codes and a third data stream of digital codes that are coincident in time sequence with the first data stream of digital codes and that are produced by A/D-converting the analog signal at a second sampling frequency that is twice the first sampling frequency to produce a second data stream of digital code and decimating the digital codes of the second data stream alternately, and the second difference codes being produced by differences between the first data stream of digital codes or data codes each being provided as a function of one of the digital codes of the first data stream and a fourth data stream of digital codes including the remainder of the second data stream other than the third data stream of digital codes, comprising:

a first decoding circuit adding the first data stream of digital codes to the first difference codes to decode the third data stream;

a second decoding circuit adding the second difference codes to the decoded third data stream or to the first data stream of digital codes or data codes each being as a function of one of the first data stream of digital codes to decode the fourth data stream of digital codes;

a first D/A converting circuit D/A-converting the first data stream of digital codes at a first sampling frequency into an analog signal; and a second D/A converting circuit D/A-converting the third and fourth data streams of digital codes decoded by said first and second decoding circuits at a second sampling frequency that is twice the first sampling frequency into an analog signal.

12. A decoding apparatus for decoding digital signals provided by an encoding apparatus including a first data stream of digital codes into which a two-channel analog signal is A/D-converted at a first sampling frequency and difference codes between the first data stream of digital codes and a third data stream of digital codes that are coincident in time sequence with the first data stream of digital codes and that are produced by A/D-converting the two-channel analog signal at a second sampling frequency that is twice the first sampling frequency to produce a second data stream of digital codes and decimating the digital codes of the second data stream alternately, the difference codes being scaled in each of given frames, comprising:

difference code controlling means for controlling values of the difference codes using scaling information contained in the digital signals;

a decoding circuit adding the difference codes controlled by said difference code controlling means to the first data steam of digital codes to decode half of a fourth data stream of digital codes that are twice the first data stream of digital codes and decoding the fourth data stream of digital codes based on the decoded half of the fourth data stream of digital codes;

a first D/A converting circuit D/A-converting the first data stream of digital codes at a first sampling frequency into an analog signal; and a second D/A converting circuit D/A-converting the fourth data stream of digital codes at a second sampling frequency that is four times the first sampling frequency into an analog signal.

13. A decoding apparatus for decoding digital signals provided by an encoding apparatus, including a first data stream of digital codes, first difference codes, and second difference codes, the first data stream of digital code being produced by A/D-converting an analog signal at a first sampling frequency, the first difference codes being produced by differences between the first data stream of digital codes and a third data stream of digital codes that are coincident in time sequence with the first data stream of digital codes and that are produced by A/D-converting the analog signal at a second sampling frequency that is twice the first sampling frequency to produce a second data stream of digital codes and decimating the digital codes of the second data stream alternately, and the second difference codes being produced by differences between the first data stream of digital codes or data codes each being provided as a function of one of the digital codes of the first data stream and a fourth data stream of digital codes including the remainder of the second data stream other than the third data stream of digital codes, the first and second difference codes being scaled in each of given frames, comprising:

difference code controlling means for controlling values of the first and second difference codes using scaling information contained in the digital signals;

a first decoding circuit adding the first difference codes controlled by said difference code controlling means to the first data stream of digital codes to decode the third data stream;

a second decoding circuit adding the second difference codes controlled by said difference code controlling means to the decoded third data stream or to the first data stream of digital codes or data codes each being as a function of one of the first data stream of digital codes to decode the fourth data stream of digital codes;

a first D/A converting circuit D/A-converting the first data stream of digital codes at a first sampling frequency into an analog signal; and a second D/A converting circuit D/A-converting the third and fourth data streams of digital codes decoded by said first and second decoding circuits at a second sampling frequency that is twice the first sampling frequency into an analog signal.

14. A decoding apparatus for decoding digital signals provided by an encoding apparatus, including a first data stream of digital codes, first difference codes, and second difference codes, the first data stream of digital code being produced by A/D-converting an analog signal at a first sampling frequency, the first difference codes being produced by differences between the first data stream of digital codes and a third data stream of digital codes that are coincident in time sequence with the first data stream of digital codes and that are produced by A/D-converting the analog signal at a second sampling frequency that is twice the first sampling frequency to produce a second data stream of digital codes and decimating the digital codes of the second data stream alternately, and the second difference codes being produced by differences between the first data stream of digital codes or data codes each being provided as a function of one of the digital codes of the first data stream and a fourth data stream of digital codes including the remainder of the second data stream other than the third data stream of digital codes, the first and second difference codes being scaled in each of given frames, comprising:

difference code controlling means for controlling values of the first and second difference codes using scaling information contained in the digital signals;

a first decoding circuit adding the first difference codes controlled by said difference code controlling means to the first data stream of digital codes to decode the third data stream;

predicted value producing means for producing predicted codes based on the second data stream of digital codes;

a second decoding circuit adding the second difference codes controlled by said difference code controlling means to the predicted values to decode the fourth data stream of digital codes;

a first D/A converting circuit D/A-converting the first data stream of digital codes at a first sampling frequency into an analog signal; and a second D/A converting circuit D/A-converting the third and fourth data streams of digital codes decoded by said first and second decoding circuits at a second sampling frequency that is twice the first sampling frequency into an analog signal.

15. A decoding apparatus for decoding digital signals provided by an encoding apparatus, including a first data stream of digital codes, first difference codes, and second difference codes, the first data stream of digital code being produced by A/D-converting an analog signal at a first sampling frequency, the first difference codes being produced by differences between the first data stream of digital codes and some of a second data stream of digital codes that are coincident in time sequence with the first data stream of digital codes, the second data stream being produced by A/D-converting the analog signal at a second sampling frequency that is four times the first sampling frequency, the second difference codes being produced by differences between reference codes each determined using one or consecutive two of the first data stream of digital codes and some of the second data stream of digital codes each of which is coincident in time sequence with an intermediate signal between consecutive two of the digital codes of the first data stream, comprising:

a first decoding circuit decoding first codes corresponding to a quarter of the second data stream of digital codes by adding the first difference codes to the first data stream of digital codes;

a second decoding circuit decoding second codes corresponding to another quarter of the second data stream of digital codes by determining the reference codes using one or consecutive two of the first data stream of digital codes and decoding some of the second data stream of digital code corresponding to the intermediate signals using the reference codes and the second difference codes;

a third decoding circuit decoding third and fourth codes corresponding to the remainder of the second data stream of digital codes using the first and second codes decoded by the first and second decoding circuits;

selection means for selecting the first, second, third, and fourth codes in sequence to produce a data stream of digital codes;

a first D/A converting circuit D/A-converting the first data stream of digital codes at a first sampling frequency into an analog signal; and a second D/A converting circuit D/A-converting the data stream of digital code produced by said selection means at a second sampling frequency that is four times the first sampling frequency into an analog signal.

16. A decoding apparatus for decoding digital signals provided by an encoding apparatus, including a first data stream of digital codes, difference codes, and ADPCM codes, the first data stream of digital code being produced by A/D-converting an analog signal at a first sampling frequency, the difference codes being produced by differences between the first data stream of digital codes and some of a second data stream of digital codes that are coincident in time sequence with the first data stream of digital codes, the second data stream being produced by A/D-converting the analog signal at a second sampling frequency that is four times the first sampling frequency, the ADPCM codes being produced by encoding in ADPCM portions of the second data stream of digital codes that are out of coincidence in time sequence with the first data stream of digital codes, comprising:

a decoding circuit decoding first codes corresponding to a quarter of the second data stream of digital codes by adding the difference codes to the first data stream of digital codes;

an ADPCM decoding circuit decoding the portions of the second data stream of digital codes that are out of coincidence in time sequence with the first data stream of digital codes using the ADPCM codes and the first codes decoded by said decoding circuit;

selection means for selecting the first codes decoded by said decoding circuit and the portions of the second data stream of digital code decoded by said ADPCM decoding circuit in sequence to produce a data stream of digital codes;

a first D/A converting circuit D/A-converting the first data stream of digital codes at a first sampling frequency into an analog signal; and a second D/A converting circuit D/A-converting the data stream of digital code produced by said selection means at a second sampling frequency that is four times the first sampling frequency into an analog signal.

17. An encoded information record carrier on which a stream of digital signals encoded by a first A/D converting step converting an analog input signal at a first sampling frequency into a first data stream of digital codes;

a second A/D converting step converting the analog input signal at a second sampling frequency that is twice the first sampling frequency into a second data stream of digital codes;

a decimating step decimating the digital codes of the second data stream alternately to produce a third data stream of digital codes which are coincident in time sequence with the digital codes of the first data stream;

a difference code producing step determining a difference between each of the digital codes of the first data stream and one of the digital codes of the third data stream to produce a difference code; and a packing step packing the first data stream of digital codes and the difference codes determined by said difference code producing step in a given format.

18. An encoded information record carrier as set forth in claim 17, wherein the steps encoding the stream of digital signals further includes:

a third A/D converting step converting a second analog input signal that is different in channel from said analog input signal at the first sampling frequency into a fourth data stream of digital codes;

a fourth A/D converting step converting the second analog input signal at the second sampling frequency into a fifth data stream of digital codes;

a second decimating step decimating the digital codes of the fifth data stream alternately to produce a sixth data stream of digital codes which are coincident in time sequence with the digital codes of the fourth data stream; and a second difference code producing step determining a difference between each of the digital codes of the fourth data stream and one of the digital codes of the sixth data stream to produce a second difference code, and wherein said packing step packs the first and fourth data streams of digital codes and the first and second difference codes in a given format to produce a data code, said packing step locating in the data code the first and second difference codes as a third channel separate from the first and fourth data streams of digital codes.

19. An encoded information record carrier as set forth in claim 17, wherein said decimating step separates the second data stream of digital codes into the third data stream of digital codes and a fourth stream of digital codes, and wherein the steps encoding the stream of digital signals further comprises a second difference code producing step determining a difference between each of the digital codes of the first data stream or a data code as a function of each of the digital codes of the first data stream and one of the digital codes of the fourth data stream to produce a second difference code, and wherein said packing step packs the first data stream of digital codes and the difference codes determined by said difference code producing step and the second difference codes determined by said second difference code producing step in a given format.

20. An encoded information record carrier as set forth in claim 17, wherein the steps encoding the stream of digital signals further comprises a scaling step scaling the difference codes in each of given frames.

21. An encoded information record carrier as set forth in claim 19, wherein the steps encoding the stream of digital signals comprises: a scaling step scaling the difference codes determined by said difference code producing step and the second difference codes determined by said second difference code producing step in each of given frames.

22. An encoded information record carrier as set forth in claim 17, wherein said decimating step separates the second data stream of digital codes into the third data stream of digital codes and a fourth stream of digital codes, and wherein the steps encoding the stream of digital signals further comprises a predicted code producing step producing predicted codes based on the second data stream of digital codes, a second difference code producing step determining a difference between each of the digital codes of the fourth data stream and one of the predicted codes to produce a second difference code, and a scaling step scaling the difference codes determined by said difference code producing step and the second difference codes determined by said second difference code producing step in each of given frames, and wherein said packing step packs the first data stream of digital codes and the difference codes determined by said difference code producing step and the second difference codes determined by said second difference code producing step in a given format.

23. An encoded information record carrier on which a stream of digital signals encoded by the following steps:

A/D converting an analog input signal at a first sampling frequency into a first data stream of digital codes;

A/D converting the analog input signal at a second sampling frequency that is four times the first sampling frequency into a second data stream of digital codes;

determining as reference codes each based on a function of consecutive two of the digital codes of the first data stream, either of the consecutive two of the digital codes of the first data stream, or a function of either of the consecutive two of the digital codes of the first data stream;

producing first difference code by determining differences between the digital codes of the first data stream and some of the digital codes of second data stream that are coincident in time sequence with the first data stream of digital codes;

producing second difference codes by determining differences between the reference codes and some of the second data stream of digital codes each of which are coincident in time sequence with a middle point between consecutive two of the first data stream of digital codes; and packing the first data stream of digital codes and the first and second difference codes in a given format.

24. An encoded information record carrier on which a stream of digital signals encoded by the following steps:

A/D converting an analog input signal at a first sampling frequency into a first data stream of digital codes;

A/D converting the analog input signal at a second sampling frequency that is four times the first sampling frequency into a second data stream of digital codes;

producing first difference codes by determining differences between the digital codes of the first data stream and some of the digital codes of second data stream that are coincident in time sequence with the first data stream of digital codes;

encoding some of the second data stream of digital codes that are out of coincidence in time sequence with the first stream of digital codes in ADPCM to produce ADPCM codes; and packing the first data stream of digital codes, the difference codes, and the ADPCM codes in a given format.

25. An encoding apparatus comprising:

an A/D converting circuit converting an analog input signal at a sampling frequency twice higher than a frequency band specified in CD, DAT, or DVD standards into a first data stream of digital codes;

a low-pass filter circuit allowing components of the first data stream of digital codes within a band that is half that of the first data stream of digital codes to pass therethrough;

a decimating circuit decimating the components outputted from said low-pass filter circuit alternately to produce a second data stream of digital codes;

difference code producing means for producing difference codes that are differences between digital codes produced by decimating the first data stream of digital codes alternately and the digital codes of the second data stream; and transmitting means for transmitting the second data stream of digital codes and the difference codes.

26. An encoding apparatus as set forth in claim 25, wherein said difference code producing means further produces second difference codes that are differences between codes including portions of the first data stream of codes other than the digital codes produced by decimating the first data stream of digital codes alternately and the digital codes of the second data stream, and wherein said transmitting means further transmits the second difference codes.

27. An encoding apparatus as set forth in claim 25, further comprising scaling means for scaling the difference codes in each of given frames.

28. An encoding apparatus as set forth in claim 26, further comprising scaling means for scaling the difference codes and the second difference codes in each of given frames.

29. An encoding apparatus comprising:

an A/D converting circuit converting an analog input signal at a sampling frequency twice higher than a frequency band specified in CD, DAT, or DVD standards into a first data stream of digital codes;

a low-pass filter circuit allowing components of the first data stream of digital codes within a band that is half that of the first data stream of digital codes to pass therethrough;

a decimating circuit decimating the components outputted from said low-pass filter circuit alternately to produce a second data stream of digital codes;

first difference code producing means for producing first difference codes that are differences between digital codes produced by decimating the first data stream of digital codes alternately and the digital codes of the second data stream;

prediction means for predicting digital codes corresponding to portions of the first data stream of digital codes other than the digital codes produced by decimating the first data stream of digital codes alternately;

second difference code producing means for producing second difference codes that are differences between the predicted digital codes and the portions of the first data stream of digital codes other than the digital codes produced by decimating the first data stream of digital codes alternately;

scaling means for scaling the first and second difference codes in each of given frames; and transmitting means for transmitting the second data stream of digital codes and the first and second difference codes scaled by said scaling means.

30. An encoding apparatus comprising:

an A/D converting circuit converting an analog input signal at a sampling frequency four times higher than a frequency band specified in CD, DAT, or DVD standards into a first data stream of digital codes;

a low-pass filter circuit allowing components of the first data stream of digital codes within a band that is a quarter of that of the first data stream of digital codes to pass therethrough;

a decimating circuit decimating the components outputted from said low-pass filter circuit to produce a second data stream of digital codes that is a quarter of the components outputted from said low-pass filter circuit;

first difference code producing means for producing first difference codes that are differences between the digital codes of the second data stream and first portions of the first data stream of digital codes at fourth code intervals;

second difference code producing means for producing second difference codes that are differences between second portions of the first data stream of digital codes at fourth code intervals and the first portions or values as a function of the first portions; and transmitting means for transmitting the second data stream of digital codes and the first and second difference codes.

31. An encoding apparatus comprising:

an A/D converting circuit converting an analog input signal at a sampling frequency four times higher than a frequency band specified in CD, DAT, or DVD standards into a first data stream of digital codes;

a low-pass filter circuit allowing components of the first data stream of digital codes within a band that is a quarter of that of the first data stream of digital codes to pass therethrough;

a decimating circuit decimating the components outputted from said low-pass filter circuit to produce a second data stream of digital codes that is a quarter of the components outputted from said low-pass filter circuit;

difference code producing means for producing difference codes that are differences between the digital codes of the second data stream and first portions of the first data stream of digital codes at fourth code intervals;

encoding means for encoding portions of the first data stream of digital codes other than the first portions in ADPCM to produce ADPCM codes; and transmitting means for transmitting the second data stream of digital codes, the difference codes, and the ADPCM codes.

32. A decoding apparatus for decoding for decoding digital signals provided by an encoding apparatus including a first data stream of digital codes and difference codes, the first data stream of digital codes being produced by A/D-converting an analog signal at a given sampling frequency two times higher than a frequency band specified in CD, DAT, or DVD standards, the difference codes indicating differences between digital codes produced by decimating the first data stream of digital codes alternately and digital codes of a second data stream produced by alternately decimating components of the first data stream of digital codes outputted from a low-pass filter circuit which allows the first data stream of digital codes within a band that is half that of the first data stream of digital codes to pass therethrough, comprising:

a decoding circuit adding the difference codes to the first data stream of digital codes to decode half of the first data stream of digital codes, said decoding circuit decoding all the first data stream of digital codes based on the decoded half of the first data stream of digital codes; and a D/A converting circuit converting the first data stream of digital codes decoded by said decoding circuit at the given sampling frequency.

33. A decoding apparatus comprising:

addition means for adding an input data stream of digital codes and difference codes together, the difference codes indicating differences between digital codes produced by decimating the input data stream of digital codes alternately and digital codes of a second data stream produced by alternately decimating components of the input data stream of digital codes outputted from a low-pass filter circuit which allows the input data stream of digital codes within a band that is half that of the first data stream of digital codes to pass therethrough; and decoding means for decoding the digital codes produced by decimating the input data stream of digital codes alternately based on results of an addition operation of said addition means.

34. A decoding apparatus for decoding for decoding digital signals provided by an encoding apparatus including a first data stream of digital codes and first and second difference codes, the first data stream of digital codes being produced by A/D-converting an analog signal at a given sampling frequency two times higher than a frequency band specified in CD, DAT, or DVD standards, the first difference codes indicating differences between first digital codes produced by decimating the first data stream of digital codes alternately and digital codes of a second data stream produced by alternately decimating components of the first data stream of digital codes outputted from a low-pass filter circuit which allows the first data stream of digital codes within a band that is half that of the first data stream of digital codes to pass therethrough, the second difference codes indicating differences between second digital codes produced by decimating the first data stream of digital codes alternately and the second data stream of the digital codes, comprising:

a first decoding circuit adding the first difference codes to the first data stream of digital codes to decode first half of the first data stream of digital codes;

a second decoding circuit decoding second half of the first data stream of digital codes using the second difference codes; and a D/A converting circuit converting the first data stream of digital codes decoded by said fist and second decoding circuits at the given sampling frequency.

35. A decoding apparatus for decoding for decoding digital signals provided by an encoding apparatus including a first data stream of digital codes and difference codes, the first data stream of digital codes being produced by A/D-converting an analog signal at a given sampling frequency two times higher than a frequency band specified in CD, DAT, or DVD standards, the difference codes indicating differences between digital codes produced by decimating the first data stream of digital codes alternately and digital codes of a second data stream produced by alternately decimating components of the first data stream of digital codes outputted from a low-pass filter circuit which allows the first data stream of digital codes within a band that is half that of the first data stream of digital codes to pass therethrough, the difference codes being scaled, comprising:

controlling means for controlling values of the scaled difference codes using scaling information transmitted along with the digital signals provided by the encoding apparatus;

first decoding means for decoding half of the first data stream of digital codes by adding the controlled difference codes to the first data stream of digital codes;

second decoding means for decoding all the first data stream of digital codes using the half of the first data stream of digital codes decoded by said first decoding means; and a D/A converting circuit converting the first data stream of digital codes decoded by said second decoding means at the given sampling frequency.

36. A decoding apparatus for decoding for decoding digital signals provided by an encoding apparatus including a first data stream of digital codes and first and second difference codes, the first data stream of digital codes being produced by A/D-converting an analog signal at a given sampling frequency two times higher than a frequency band specified in CD, DAT, or DVD standards, the first difference codes indicating differences between first digital codes produced by decimating the first data stream of digital codes alternately and digital codes of a second data stream produced by alternately decimating components of the first data stream of digital codes outputted from a low-pass filter circuit which allows the first data stream of digital codes within a band that is half that of the first data stream of digital codes to pass therethrough, the second difference codes indicating differences between second digital codes produced by decimating the first data stream of digital codes alternately and the second data stream of the digital codes, the first and second difference codes being scaled, comprising:

controlling means for controlling the scaled first and second difference codes using scaling information transmitted along with the digital signals provided by the encoding apparatus;

first decoding means for decoding first half of the first data stream of digital codes by adding the controlled first difference codes to the first data stream of digital codes;

second decoding means for decoding second half of the first data stream of digital codes using the controlled second difference codes; and a D/A converting circuit converting the first data stream of digital codes decoded by said first and second decoding means at the given sampling frequency.

37. A decoding apparatus for decoding for decoding digital signals provided by an encoding apparatus including a first data stream of digital codes and first and second difference codes, the first data stream of digital codes being produced by A/D-converting an analog signal at a given sampling frequency four times higher than a frequency band specified in CD, DAT, or DVD standards, the first difference codes indicating differences between first digital codes produced by picking up first portions of the first data stream of the digital codes at fourth code intervals and digital codes of a second data stream produced by picking up at fourth code intervals components of the first data stream of digital codes outputted from a low-pass filter circuit which allows the first data stream of digital codes within a band that is a quarter of that of the first data stream of digital codes to pass therethrough, the second difference codes indicating differences between the first digital codes and second digital codes produced by picking up second portions of the first data stream of digital codes at fourth code intervals or values as a function of the second digital codes, comprising:

a decoding circuit adding the first difference codes to the first data stream of digital codes to decode a quarter of the first data stream of digital codes, said decoding circuit decoding all the first data stream of digital codes based on the decoded quarter of the first data stream of digital codes and the second difference codes; and a D/A converting circuit converting the first data stream of digital codes decoded by said decoding circuit at the given sampling frequency.

38. A decoding apparatus for decoding for decoding digital signals provided by an encoding apparatus including a first data stream of digital codes, difference codes, and ADPCM codes, the first data stream of digital codes being produced by A/D-converting an analog signal at a given sampling frequency four times higher than a frequency band specified in CD, DAT, or DVD standards, the difference codes indicating differences between first digital codes produced by picking up first portions of the first data stream of the digital codes at fourth code intervals and digital codes of a second data stream produced by picking up at fourth code intervals components of the first data stream of digital codes outputted from a low-pass filter circuit which allows the first data stream of digital codes within a band that is a quarter of that of the first data stream of digital codes to pass therethrough, the ADPCM codes being produced by encoding second digital codes produced by second portions of the first data stream of digital codes other than the first portions, comprising:

a decoding circuit adding the difference codes to the first data stream of digital codes to decode the first digital codes produced by picking up the first portions of the first data stream of the digital codes at fourth code intervals which corresponds to quarter of the first data stream of digital codes;

an ADPCM decoder decoding the second digital codes produced by the second portions of the first data stream of digital codes other than the first portions using the ADPCM codes and the first digital codes decoded by said decoding circuit;

selection means for selecting the first digital codes and the second digital codes decoded by said decoding circuit and said ADPCM decoder in sequence to produce a data stream of digital codes; and a D/A converting circuit converting the data stream of digital codes produced by said selection means at the given sampling frequency.

39. An encoded information record carrier on which a stream of digital signals encoded by the following steps:

A/D-converting an analog input signal at a sampling frequency twice higher than a frequency band specified in CD, DAT, or DVD standards into a first data stream of digital codes;

low-pass filtering components of the first data stream of digital codes within a band that is half that of the first data stream of digital codes;

decimating the components filtered in said low-pass filtering step alternately to produce a second data stream of digital codes;

producing difference codes that are differences between digital codes produced by decimating the first data stream of digital codes alternately and the digital codes of the second data stream; and transmitting the second data stream of digital codes and the difference codes.

40. An encoded information record carrier as set forth in claim 39, wherein said difference code producing steps further produces second difference codes that are differences between codes including portions of the first data stream of codes other than the digital codes produced by decimating the first data stream of digital codes alternately and the digital codes of the second data stream, and wherein said transmitting step further transmits the second difference codes.

41. An encoded information record carrier as set forth in claim 39, wherein the steps encoding the digital signal further includes scaling the difference codes in each of given frames.

42. An encoded information record carrier as set forth in claim 40, wherein the steps encoding the digital signal further includes scaling the difference codes and the second difference codes in each of given frames.

43. An encoded information record carrier on which a stream of digital signals encoded by the following steps:

A/D-converting an analog input signal at a sampling frequency twice higher than a frequency band specified in CD, DAT, or DVD standards into a first data stream of digital codes;

low-pass filtering components of the first data stream of digital codes within a band that is half that of the first data stream of digital codes;

decimating the components outputted from said low-pass filtering step alternately to produce a second data stream of digital codes;

producing first difference codes that are differences between digital codes produced by decimating the first data stream of digital codes alternately and the digital codes of the second data stream;

predicting digital codes corresponding to portions of the first data stream of digital codes other than the digital codes produced by decimating the first data stream of digital codes alternately;

producing second difference codes that are differences between the predicted digital codes and the portions of the first data stream of digital codes other than the digital codes produced by decimating the first data stream of digital codes alternately;

scaling the first and second difference codes in each of given frames; and transmitting the second data stream of digital codes and the first and second difference codes scaled by said scaling step.

44. An encoded information record carrier on which a stream of digital signals encoded by the following steps:

A/D-converting an analog input signal at a sampling frequency four times higher than a frequency band specified in CD, DAT, or DVD standards into a first data stream of digital codes;

low-pass filtering components of the first data stream of digital codes within a band that is a quarter of that of the first data stream of digital codes;

decimating the components outputted from said low-pass filtering step to produce a second data stream of digital codes that is a quarter of the components outputted from said low-pass filter step;

producing first difference codes that are differences between the digital codes of the second data stream and first portions of the first data stream of digital codes at fourth code intervals;

producing second difference codes that are differences between second portions of the first data stream of digital codes at fourth code intervals and the first portions or values as a function of the first portions; and transmitting the second data stream of digital codes and the first and second difference codes.

45. An encoded information record carrier on which a stream of digital signals encoded by the following steps:

A/D-converting an analog input signal at a sampling frequency four times higher than a frequency band specified in CD, DAT, or DVD standards into a first data stream of digital codes;

low-pass filtering components of the first data stream of digital codes within a band that is a quarter of that of the first data stream of digital codes;

decimating the components outputted from said low-pass filtering step to produce a second data stream of digital codes that is a quarter of the components outputted from said low-pass filtering step;

producing difference codes that are differences between the digital codes of the second data stream and first portions of the first data stream of digital codes at fourth code intervals;

encoding portions of the first data stream of digital codes other than the first portions in ADPCM to produce ADPCM codes; and transmitting the second data stream of digital codes, the difference codes, and the ADPCM codes.

* * * * *

UNITED STATES PATENT AND TRADEMARK OFFICE
CERTIFICATE OF CORRECTION

PATENT NO. : 5,859,602
DATED : January 12, 1999
INVENTOR(S) : Yoshiaki Tanaka, et al.

It is certified that error appears in the above-identified patent and that said Letters Patent is hereby corrected as shown below:

The title page insert item [30], Foreign Application Priority Data:
--July, 31, 1996 [JP] Japan ..... 8-217904 Aug. 29, 1996 [JP] ....
8-247026--.

Signed and Sealed this

Fourth Day of January, 2000

Attest:

Attesting Officer

*Acting Commissioner of Patents and Trademarks*